(12) United States Patent
Gronet

(10) Patent No.: US 7,394,016 B2
(45) Date of Patent: *Jul. 1, 2008

(54) BIFACIAL ELONGATED SOLAR CELL DEVICES WITH INTERNAL REFLECTORS

(75) Inventor: Chris M Gronet, Portolla Valley, CA (US)

(73) Assignee: Solyndra, Inc., Fremont, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/248,789

(22) Filed: Oct. 11, 2005

(65) Prior Publication Data

US 2007/0079864 A1   Apr. 12, 2007

(51) Int. Cl.
H01L 31/00 (2006.01)
(52) U.S. Cl. .................................. 136/246; 136/244
(58) Field of Classification Search .......... 136/243–293
See application file for complete search history.

(56) References Cited

U.S. PATENT DOCUMENTS

| 2,984,775 | A | | 5/1961 | Matlow et al. | |
|---|---|---|---|---|---|
| 3,005,862 | A | | 10/1961 | Escoffery | |
| 3,046,324 | A | | 7/1962 | Matlow | |
| 3,976,508 | A | * | 8/1976 | Mlavsky | 136/246 |
| 3,990,914 | A | | 11/1976 | Weinstein et al. | |
| 4,078,944 | A | | 3/1978 | Mlavsky | |
| 4,113,531 | A | | 9/1978 | Zanio et al. | |
| 4,153,476 | A | * | 5/1979 | Frosch et al. | 136/246 |
| 4,217,148 | A | | 8/1980 | Carlson | |
| 4,292,092 | A | | 9/1981 | Hanak | |
| 4,641,315 | A | | 2/1987 | Draggoo | |
| 4,686,323 | A | | 8/1987 | Biter et al. | |
| 4,783,373 | A | | 11/1988 | Baumeister et al. | |
| 4,913,744 | A | | 4/1990 | Hoegl et al. | |

| 5,437,736 | A | * | 8/1995 | Cole | 136/259 |
|---|---|---|---|---|---|

(Continued)

FOREIGN PATENT DOCUMENTS

DE          32 09 548          3/1982

(Continued)

OTHER PUBLICATIONS

Birkmire et al., 2005, "Cu(InGa)Se$_2$ Solar Cells on a Flexible Polymer Web," Prog. Photovolt 13: 141-148.

(Continued)

Primary Examiner—Nam X Nguyen
Assistant Examiner—Jeffrey T Barton
(74) Attorney, Agent, or Firm—Jones Day; Brett Lovejoy

(57) ABSTRACT

A solar cell assembly comprising a plurality of elongated solar cells, each elongated solar cell in the plurality of elongated solar cells comprising (i) an elongated conductive core configured as a first electrode, (ii) a semiconductor junction circumferentially disposed on the elongated conductive core, and (iii) a transparent conductive oxide layer disposed on the semiconductor junction. Each respective solar cell is bound to a first and second corresponding metal counter-electrode that lies in a groove running lengthwise on the respective elongated solar cell. The solar cell assembly further comprises a plurality of internal reflectors. Each respective internal reflector in the plurality of internal reflectors is configured between a first and second elongated solar cell in the plurality of elongated solar cells such that a portion of the solar light reflected from the respective internal reflector is reflected onto the corresponding first and second elongated cell.

80 Claims, 32 Drawing Sheets

U.S. PATENT DOCUMENTS

| | | | | |
|---|---|---|---|---|
| 5,735,966 | A | * | 4/1998 | Luch .................. 136/244 |
| 5,902,416 | A | | 5/1999 | Kern et al. |
| 5,971,571 | A | | 10/1999 | Rose |
| 6,107,564 | A | | 8/2000 | Aguilera et al. |
| 6,258,620 | B1 | | 7/2001 | Morel et al. |
| 6,294,723 | B2 | | 9/2001 | Uematsu et al. |
| 6,355,873 | B1 | | 3/2002 | Ishikawa |
| 6,359,210 | B2 | | 3/2002 | Ho et al. |
| 6,410,843 | B1 | | 6/2002 | Kishi et al. |
| 6,548,751 | B2 | | 4/2003 | Sverdrup, Jr. et al. |
| 6,555,739 | B2 | | 4/2003 | Kawam |
| 6,706,959 | B2 | | 3/2004 | Hamakawa et al. |
| 6,706,963 | B2 | | 3/2004 | Gaudiana et al. |
| 6,762,359 | B2 | | 7/2004 | Asai et al. |
| 6,806,414 | B2 | | 10/2004 | Shiotsuka et al. |
| 6,940,008 | B2 | | 9/2005 | Shiotsuka et al. |
| 2002/0130311 | A1 | | 9/2002 | Lieber et al. |
| 2002/0180909 | A1 | | 12/2002 | Lubart et al. |
| 2003/0121544 | A1 | | 7/2003 | Hirata et al. |
| 2003/0155003 | A1 | * | 8/2003 | Tur et al. .................. 136/246 |
| 2004/0063320 | A1 | | 4/2004 | Hollars |
| 2005/0040374 | A1 | | 2/2005 | Chittibabu et al. |
| 2005/0098202 | A1 | * | 5/2005 | Maltby, Jr. .................. 136/256 |
| 2005/0271796 | A1 | * | 12/2005 | Neudecker et al. ............ 427/58 |
| 2006/0086384 | A1 | | 4/2006 | Nakata |
| 2006/0185714 | A1 | | 8/2006 | Nam et al. |

FOREIGN PATENT DOCUMENTS

| | | |
|---|---|---|
| DE | 43 39 547 | 11/1993 |
| DE | 43 43 514 | 12/1993 |
| DE | 44 06 760 | 3/1994 |
| DE | 197 32 876 | 7/1997 |
| FR | 75 30980 | 10/1975 |
| JP | S59-125670 | 7/1984 |
| JP | S59-143377 | 8/1984 |
| JP | S59-144177 | 8/1984 |
| JP | 60 084886 | 2/1985 |
| JP | 61 029179 A | 2/1986 |
| JP | 2000-294821 | 10/2000 |
| WO | WO 84/04425 | 11/1984 |
| WO | WO 03/065471 | 7/2003 |
| WO | WO 2005/034149 A2 | 4/2004 |
| WO | WO 2004/061417 A2 | 7/2004 |

OTHER PUBLICATIONS

Boer, 1977, Solar Energy 19:525.

Bube, 1998, "Photovoltaic Materials," Properties of Semiconductor Materials 1: 1-277.

Chaisitak et al., 2000, "Improvement in Performances of $ZnO:B/i-ZnO/Cu(InGa)Se_2$ Solar Cells by Surface Treatments for $Cu(InGa)Se_2$," The Japan Society of Applied Physics 39: 1660-1664.

Collares-Pereira et al., 1989, "Amorphous Silicon Photovoltaic Solar Cells—Inexpensive, High-Yield Optical Designs," ASME 111: 112-116.

Cuevas et al., 1982, "50 Percent More Output Power from an Albedo-collecting Flat Panel Using Bifacial Solar Cells," Solar Energy 29: 419-420.

Edmonds, 1990, "The Performance of Bifacial Solar Cells in Static Solar Concentrators," Solar Energy Materials 21: 173-190.

Gee and Virshup, 1988, 20th IEEE Photovoltaic Specialist Conferene, IEEE publishing, New York, 754.

Green, 1995, "Silicon Solar Cells: Advanced Principles & Practice," Centre for Photovoltaic Devices and Systems, University of New South Wales, Sydney; Chapters 12 and 14; pp. 249-272 and 288-325.

Gu et al., 2004, "Design and evaluation of an LED-based light fixture," Third International Conference on Solid State Lighting, Proceedings of SPIE 5187: 318-329.

Jensen et al., 2003, "Back Contact Cracking During Fabrication of CIGS Solar Cells on Polyimide Substrates," NREL/CD, 877-881.

Joliet et al., 1985, "Laser-induced Synthesis of Thin $CuInSe_2$ Films," Appl. Phys. Lett. 46: 266-267.

Kim et al., 1987, $19^{th}$ IEEE Photovoltaic Specialist Conference, IEEE publishing, New York, 306-311.

Khosrofian et al., 1983, "Measurement of a Gaussian Laser Beam Diameter Through the Direct Inversion of Knife-edge Data," Applied Optics 22: 3406-3410.

Lorenzo et al., 1985, Solar Cells 13: 277-292.

Lugue, 1984, "Static Concentrators: A Venture to Meet the Low Cost Target in Photovoltaics," Solar Cells 12: 141-145.

Lugue, 1984-1985, "Diffusing Reflectors for Bifacial Photovoltaic Panels," Solar Cells 13: 277-292.

Lugue et al., 2003, "Handbook of Photovoltaic Science and Engineering," Wiley, 1-662.

Malbranche et al., 2000-2001, "The Three Ways To Exploit Solar Energy," CLEFS CEA No. 44: 25-37.

Otoma et al., 1991, "Growth of $CuGaS_2$ by Alternating-source-feeding MOVPE," Journal of Crystal Growth 115: 807-810.

Pandey et al., 1996, "Handbook of Semiconductor Electrodeposition," Applied Physics: 1-285.

Pereira and Gordon, 1989, Journal of Solar Energy Engineering 111: 111-116.

Romeo, 2002, "Growth and Characterization of High Efficiency CdTe/CDS Solar Cells," Dissertation submitted to the Swiss Federal Institute of Technology Zurich: 1-103.

Sang et al., 2001, "Performance Improvement of CIGS-based Modules By Depositing High-quality Ga-doped ZnO Windows with Magnetron Sputtering," Solar Energy Materials & Solar Cells 67: 237-245.

Simpson et al., 2004, "Manufacturing Process Advancements for Flexible CIGS PV on Stainless Foil," Major FY Publications.

Stanbery et al., 1987, $19^{th}$ EE Photovoltaic Specialist Conference, IEEE publishing, New York, 280.

Stolt et al., 1994, "CIS Solar Cells with ZnO Windows Deposited by ALE," IEEE, 250-253.

Uematsu et al., 2001, "Static Concentrator Photovoltaic Module with Prism Array," Solar Energy Material Solar Cells, 67:415-423.

Uematsu et al., 2001, "Design and Characterization of Flat-Plate Static-Concentrator Photovoltaic Modules," Solar Energy Materials & Solar Cells 67:441-448.

Uematsu et al., 2001, "Fabrication and Characterization of a Flat-Plate Static-Concentrator Photovoltaic Module," Solar Energy Materials & Solar Cells 67:425-434.

Weisstein, "Involute," Mathworld—A Wolfram Web Resource, http://mathworld.wolfram.com/CircleInvolute.html, accessed Feb. 28, 2006.

Weisstein, "Astroid Involute," Mathworld—A Wolfram Web Resource, http://mathworld.wolfram.com/AstroidInvolute.html, accessed Feb. 28, 2006.

Weisstein, 1999-2006, "Deltoid Involute," Mathworld—A Wolfram Web Resource, http://mathworld.wolfram.com/DeltoidInvolute.html, p. 1, accessed Feb. 28, 2006.

Weisstein, 1999-2006, "Astroid," Mathworld—A Wolfram Web Resource, http://mathworld.wolfram.com/Astroid.html, pp. 1-7, accessed Feb. 28, 2006.

http://www.ece.eps.hw.ac.uk/~dml/cgonline/hyper00/polypipe/render/phong.html "Details of the Phong Illumination Model," pp. 1-5, accessed Feb. 10, 2006.

http://hep.uchicago.edu/solar/light.html, "New Reflectors for Illumination," accessed Sep. 29, 2005 pp. 1-8.

http://medialab.di.unipi.it/web/IUM/Waterloo/node76.html, "Reflection and Light Source Models," pp. 1-6, accessed Feb. 28, 2006.

http://beammeasurement.mellesgriot.com/tut_int_spheres.asp, "Laser Beam Measurement," accessed Sep. 30, 2005, pp. 1-5.

http://mathworld.wolfram.com/CircleInvolute.html, "Circle Involute—From MathWorld," accessed Feb. 28, 2006, pp. 1-2.

http://www.du.edu/~jcalvert/optics/lumens.htm, "Illumination," accessed Feb. 28, 2006, pp. 1-5.

"Tangram Technology Ltd.—Polymer Data File—PMMA" website, http:www.tangram.co.uk/TI-Polymer-PMMA.html from Jan. 12, 2002. Available from www.archive.org. 7 pages.

Trupke, T. et al., "Improving solar cell efficiencies by down-conversion of high-energy photons" J. Appl. Phys. 92, 1668-1674.

PCT/US2006/024011, International Search Report, dated Jul. 18, 2007, International Search Report.

PCT/US2006/024011, PCT Written Opinion, dated Jul. 18, 2007.

* cited by examiner

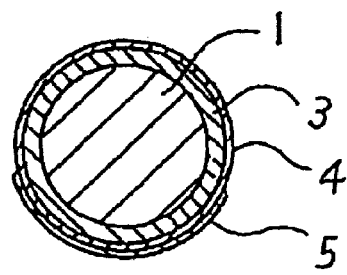
Fig. 3B
(Prior Art)
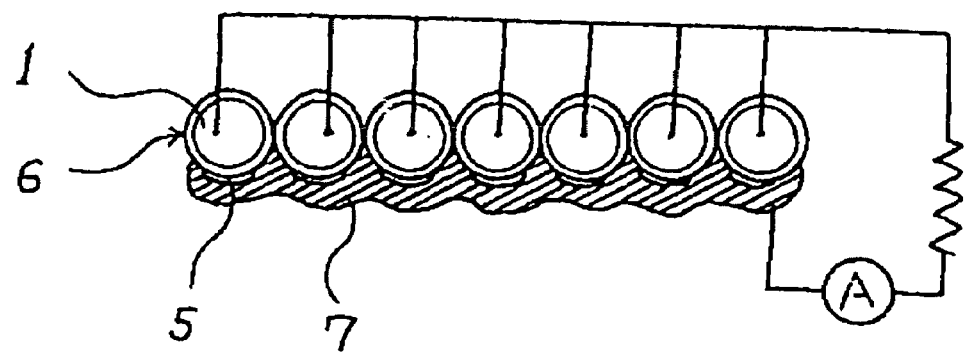
Fig. 3C
(Prior Art)

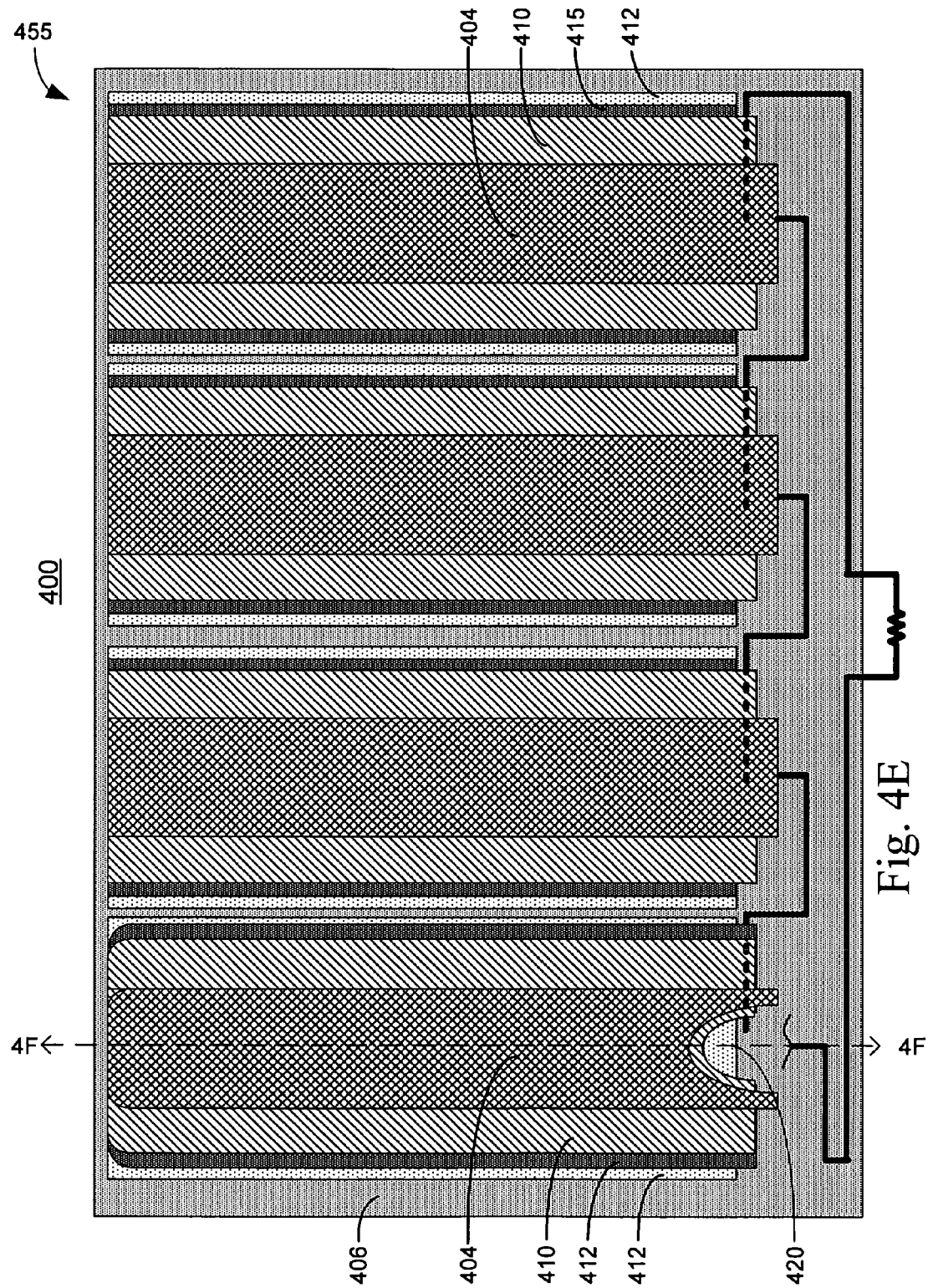

BIFACIAL ELONGATED SOLAR CELL DEVICES WITH INTERNAL REFLECTORS

1. FIELD OF THE INVENTION

This invention relates to solar cell assemblies for converting solar energy into electrical energy and more particularly to improved solar cell assemblies.

2. BACKGROUND OF THE INVENTION

Interest in photovoltaic cells has grown rapidly in the past few decades. Photovoltaic cells comprise semiconductor junctions such as p-n junctions. It is well known that light with photon energy greater than the band gap of an absorbing semiconductor layer in a semiconductor junction is absorbed by the layer. Such absorption causes optical excitation and the release of free electrons and free holes in the semiconductor. Because of the potential difference that exists at a semiconductor junction (e.g., a p-n junction), these released holes and electrons move across the junction in opposite directions and thereby give rise to flow of an electric current that is capable of delivering power to an external circuit. The flow of carriers into the external circuit constitutes an electrical current density, J amp cm$^{-2}$, which, under short-circuit conditions, is known as the short-circuit current density, $J_{sc}$. At the same time, the separation of the charges (holes and electrons) sets up a potential difference between the two ends of the material, $\phi$, which under open circuit conditions is known as the open-circuit voltage, $\phi_{OC}$. It is desirable to maximize both $J_{sc}$ and $\phi_{OC}$. For interaction with the solar spectrum, $J_{sc}$ and $\phi_{OC}$ are optimized when the junction semiconductor absorber has a band gap of about 1.4 electron volts (eV).

It is presently common practice to provide an array of solar cells to generate electrical energy from solar radiation. Many solar cells are made of silicon. However, cells made of other materials, e.g., cadmium sulfide and gallium arsenide, have also been developed and tested. Crystalline silicon has traditionally been a favored material since it has a band gap of approximately 1.1 eV and thus favorably responds to the electromagnetic energy of the solar spectrum. However, because of the expense in making crystalline silicon-based cells, thin film solar cells made of materials other than silicon have been explored and used.

Presently solar cells are fabricated as separate physical entities with light gathering surface areas on the order of 4-6 cm$^2$ or larger. For this reason, it is standard practice for power generating applications to mount the cells in a flat array on a supporting substrate or panel so that their light gathering surfaces provide an approximation of a single large light gathering surface. Also, since each cell itself generates only a small amount of power, the required voltage and/or current is realized by interconnecting the cells of the array in a series and/or parallel matrix.

A conventional prior art solar cell structure is shown in FIG. 1. Because of the large range in the thickness of the different layers, they are depicted schematically. Moreover, FIG. 1 is highly schematic so that it represents the features of both "thick-film" solar cells and "thin-film" solar cells. In general, solar cells that use an indirect band gap material to absorb light are typically configured as "thick-film" solar cells because a thick film of the absorber layer is required to absorb a sufficient amount of light. Solar cells that use a direct band gap material to absorb light are typically configured as "thin-film" solar cells because only a thin layer of the direct band-gap material is needed to absorb a sufficient amount of light.

The arrows at the top of FIG. 1 show the direction of the solar illumination on the cell. Layer (element) 102 is the substrate. Glass or metal is a common substrate. In thin-film solar cells, substrate 102 can be a polymer-based backing, metal, or glass. In some instances, there is an encapsulation layer (not shown) coating substrate 102. Layer 104 is the back electrical contact for the solar cell. It makes ohmic contact with the absorber layer of semiconductor junction 106.

Layer 106 is the semiconductor absorber layer. In many but not all cases it is a p-type semiconductor. Absorber layer 106 is thick enough to absorb light. Layer 108 is the semiconductor junction partner-that completes the formation of a p-n junction, which is a common type of junction found in solar cells. In a solar cell based on a p-n junction, when absorber 106 is a p-type doped material, junction partner 108 is an n-type doped material. Conversely, when layer 106 is an n-type doped material, layer 108 is a p-type doped material. Generally, junction partner 108 is much thinner than absorber 106. For example, in some instances junction partner 108 has a thickness of about 0.05 microns. Junction partner 108 is highly transparent to solar radiation. Junction partner 108 is also known as the window layer, since it lets the light pass down to absorber layer 106.

In a typical thick-film solar cell, layers 106 and 108 can be made from the same semiconductor material but have different carrier types (dopants) and/or carrier concentrations in order to give the two layers their distinct p-type and n-type properties. In thin-film solar cells in which copper-indium-gallium-diselenide (CIGS) is the absorber layer 106, the use of CdS to form layer 108 has resulted in high efficiency cells. Other materials that can be used for layer 108 include, but are not limited to, $SnO_2$, ZnO, $ZrO_2$ and doped ZnO.

Layer 110 is the top transparent electrode, which completes the functioning cell. Layer 110 is used to draw current away from the junction since junction partner 108 is generally too resistive to serve this function. As such, layer 110 should be highly conductive and transparent to light. Layer 110 can in fact be a comb-like structure of metal printed onto layer 108 rather than forming a discrete layer. Layer 110 is typically a transparent conductive oxide (TCO) such as doped zinc oxide (e.g., aluminum doped zinc oxide), indium-tin-oxide (ITO), tin oxide ($SnO_2$), or indium-zinc oxide. However, even when a TCO layer is present, a bus bar network 114 is typically needed to draw off current since the TCO has too much resistance to efficiently perform this function in larger solar cells. Network 114 shortens the distance charger carriers must move in the TCO layer in order to reach the metal contact, thereby reducing resistive losses. The metal bus bars, also termed grid lines, can be made of any reasonably conductive metal such as, for example, silver, steel or aluminum. In the design of network 114, there is design a tradeoff between thicker grid lines that are more electrically conductive but block more light, and thin grid lines that are less electrically conductive but block less light. The metal bars are preferably configured in a comb-like arrangement to permit light rays through TCO layer 110. Bus bar network layer 114 and TCO layer 110, combined, act as a single metallurgical unit, functionally interfacing with a first ohmic contact to form a current collection circuit. In U.S. Pat. No. 6,548,751 to Sverdrup et al., hereby incorporated by reference in its entirety, a combined silver (Ag) bus bar network and indium-tin-oxide layer function as a single, transparent ITO/Ag layer.

Layer 112 is an antireflection (AR) coating that can allow a significant amount of extra light into the cell. Depending on the intended use of the cell, it might be deposited directly on the top conductor (as illustrated), or on a separate cover glass, or both. Ideally, the AR coating reduces the reflection of the cell to very near zero over the spectral region in which photoelectric absorption occurs, and at the same time increases the reflection in the other spectral regions to reduce heating. U.S. Pat. No. 6,107,564 to Aguilera et al., hereby incorporated by reference in its entirety, describes representative antireflective coatings that are known in the art.

Solar cells typically produce only a small voltage. For example, silicon based solar cells produce a voltage of about 0.6 volts (V). Thus, solar cells are interconnected in series or parallel in order to get a reasonable voltage. When connected in series, voltages of individual cells add together while current remains the same. Thus, solar cells arranged in series reduce the amount of current flow through such cells, compared to analogous solar cells arrange in parallel, thereby improving efficiency. As illustrated in FIG. 1, the arrangement of solar cells in series is accomplished using interconnects 116. In general, an interconnect 116 places the first electrode of one solar cell in electrical communication with the counter-electrode of an adjoining solar cell.

As noted above and as illustrated in FIG. 1, conventional solar cells are typically in the form of a plate structure. Although such cells are highly efficient when they are smaller, larger planar solar cells have reduced efficiency because it is harder to make the semiconductor films that form the junction in such solar cells uniform. Furthermore, the occurrence of pinholes and similar flaws increase in larger planar solar cells. These features can cause shunts across the junction.

A number of problems are associated with solar cell designs present in the known art. A number of prior art solar cell designs and some of the disadvantages of each design will now be discussed.

As illustrated in FIG. 2, U.S. Pat. No. 6,762,359 B2 to Asia et al. discloses a solar cell 210 including a p-type layer 12 and an n-type layer 14. A first electrode 32 is provided on one side of the solar cell. Electrode 32 is in electrical contact with n-type layer 14 of solar cell 210. Second electrode 60 is on the opposing side of the solar cell. Electrode 60 is in electrical contact with the p-type layer of the solar cell. Light-transmitting layers 200 and 202 form one side of device 210 while layer 62 forms the other side. Electrodes 32 and 60 are separated by insulators 40 and 50. In some instances, the solar cell has a tubular shape rather than the spherical shape illustrated in FIG. 2. While device 210 is functional, it is unsatisfactory. Electrode 60 has to pierce absorber 12 in order to make an electrical contact. This results in a net loss in absorber area, making the solar cell less efficient. Furthermore, such a junction is difficult to make relative to other solar cell designs.

As illustrated in FIG. 3A, U.S. Pat. No. 3,976,508 to Mlavsky discloses a tubular solar cell comprising a cylindrical silicon tube 2 of n-type conductivity that has been subjected to diffusion of boron into its outer surface to form an outer p-conductivity type region 4 and thus a p-n junction 6. The inner surface of the cylindrical tube is provided with a first electrode in the form of an adherent metal conductive film 8 that forms an ohmic contact with the tube. Film 8 covers the entire inner surface of the tube and consists of a selected metal or metal alloy having relatively high conductivity, e.g., gold, nickel, aluminum, copper or the like, as disclosed in U.S. Pat. Nos. 2,984,775, 3,046,324 and 3,005, 862. The outer surface is provided with a second electrode in the form of a grid consisting of a plurality of circumferentially extending conductors 10 that are connected together by one or more longitudinally-extending conductors 12. The opposite ends of the outer surface of the hollow tube are provided with two circumferentially-extending terminal conductors 14 and 16 that intercept the longitudinally-extending conductors 12. The spacing of the circumferentially-extending conductors 10 and the longitudinally-extending conductors 12 is such as to leave areas 18 of the outer surface of the tube exposed to solar radiation. Conductors 12, 14 and 16 are made wider than the circumferentially-extending conductors 10 since they carry a greater current than any of the latter. These conductors are made of an adherent metal film like the inner electrode 8 and form ohmic contacts with the outer surface of the tube. While the solar cell disclosed in FIG. 3 is functional, it is also unsatisfactory. Conductors 12, 14, and 16 are not transparent to light and therefore the amount of light that the solar cell receives is reduced.

U.S. Pat. No. 3,990,914 to Weinstein and Lee discloses another form of tubular solar cell. Like Mlavsky, the Weinsten and Lee solar cell has a hollow core. However, unlike Mlavsky, Weinstein and Lee dispose the solar cell on a glass tubular support member. The Weinstein and Lee solar cell has the drawback of being bulky and expensive to build.

Referring to FIGS. 3B and 3C, Japanese Patent Application Kokai Publication Number S59-125670, Toppan Printing Company, published Jul. 20, 1984 (hereinafter "S59-125670") discloses a rod-shaped solar cell. The rod shaped solar cell is depicted in cross-section in Figure. A conducting metal is used as the core 1 of the cell. A light-activated amorphous silicon semiconductor layer 3 is provided on core 1. An electrically conductive transparent conductive layer 4 is built up on top of semiconductor layer 3. The transparent conductive layer 4 can be made of materials such as indium oxide, tin oxide or indium tin oxide (ITO) and the like. As illustrated in FIG. 3B, a layer 5, made of a good electrical conductor, is provided on the lower portion of the solar cell. The publication states that this good conductive layer 5 is not particularly necessary but helps to lower the contact resistance between the rod and a conductive substrate 7 that serves as a counter-electrode. As such, conductive layer 5 serves as a current collector that supplements the conductivity of counter-electrode 7 illustrated in FIG. 3C.

As illustrated in FIG. 3C, rod-shaped solar cells 6 are multiply arranged in a row parallel with each other, and counter-electrode layer 7 is provided on the surface of the rods that is not irradiated by light so as to electrically make contact with each transparent conductive layer 4. The rod-shaped solar cells 6 are arranged in parallel and both ends of the solar cells are hardened with resin or a similar material in order to fix the rods in place.

S59-125670 addresses many of the drawbacks associated with planar solar cells. However, S59-125670 has a number of significant drawbacks that limit the efficiency of the disclosed devices. First, the manner in which current is drawn off the exterior surface is inefficient because layer 5 does not wrap all the way around the rod (e.g., see FIG. 3B). Second, substrate 7 is a metal plate that does not permit the passage of light. Thus, a full side of each rod is not exposed to light and can thus serve as a leakage path. Such a leakage path reduces the efficiency of the solar cell. For example, any such dark junction areas will result in a leakage that will detract from the photocurrent of the cell. Another disadvantage with the design disclosed in FIGS. 3B and 3C is that the rods are arranged in parallel rather than in series. Thus, the current levels in such devices will be large, relative to a corresponding serially arranged model, and therefore subject to resistive losses.

Referring to FIG. 3D, German Unexamined Patent Application DE 43 39 547 A1 to Twin Solar-Technik Entwicklungs-GmbH, published May 24, 1995, (hereinafter "Twin Solar") also discloses a plurality of rod-shaped solar cells 2 arranged in a parallel manner inside a transparent sheet 28, which forms the body of the solar cell. Thus, Twin Solar does not have some of the drawbacks found in S59-125670. Transparent sheet 28 allows light in from both faces 47A and 47B. Transparent sheet 28 is installed at a distance from a wall 27 in such a manner as to provide an air gap 26 through which liquid coolant can flow. Thus, Twin Solar devices have the drawback that they are not truly bifacial. In other words, only face 47A of the Twin Solar device is capable of receiving direct light. As defined here, "direct light" is light that has not passed through any media other than air. For example, light that has passed through a transparent substrate, into a solar cell assembly, and exited the assembly is no longer direct light once it exits the solar cell assembly. Light that has merely reflected off of a surface, however, is direct light provided that it has not passed through a solar cell assembly. Under this definition of direct light, face 47B is not configured to receive direct light. This is because all light received by face 47B must first traverse the body of the solar cell apparatus after entering the solar cell apparatus through face 47A. Such light must then traverse cooling chamber 26, reflect off back wall 42, and finally re-enter the solar cell through face 47B. The solar cell assembly is therefore inefficient because direct light cannot enter both sides of the assembly.

Discussion or citation of a reference herein will not be construed as an admission that such reference is prior art to the present invention.

3. SUMMARY OF THE INVENTION

One aspect of the present invention provides a solar cell assembly comprising a plurality of elongated solar cells. Each elongated solar cell in the plurality of elongated solar cells comprises (i) a conductive core configured as a first electrode, (ii) a semiconductor junction circumferentially disposed on the conductive core, and (iii) a transparent conductive oxide layer disposed on the semiconductor junction. Elongated solar cells in said plurality of elongated solar cells are geometrically arranged in a parallel or a near parallel manner thereby forming a planar array having a first face and a second face. The plurality of elongated solar cells is arranged such that one or more elongated solar cells in the plurality of elongated solar cells do not contact adjacent elongated solar cells. The solar cell assembly further comprises a plurality of electrode strips. Each respective electrode strip in the plurality of electrode strips is lengthwise disposed on a first side of a corresponding elongated solar cell in the plurality of elongated solar cells. The first side of the solar cell is part of the first face of the planar array. The solar cell assembly further comprises a transparent electrically insulating substrate that covers all or a portion of the first face of the planar array. A first and second elongated solar cell in the plurality of elongated solar cells are electrically connected in series by an electrical contact that connects the first electrode of the first elongated solar cell to the corresponding electrode strip of the second elongated solar cell. The plurality of elongated solar cells is configured to receive direct light from the first face and the second face of the planar array.

Another aspect of the invention is also directed to a solar cell assembly. The solar cell assembly comprises a plurality of elongated solar cells. Each elongated solar cell in the plurality of elongated solar cells comprises (i) a conductive core configured as a first electrode, (ii) a semiconductor junction circumferentially disposed on the conductive core, (iii) and a transparent conductive oxide layer disposed on the semiconductor junction. The elongated solar cells in the plurality of elongated solar cells are geometrically arranged in a parallel or near parallel manner as a plurality of solar cell pairs so as to form a planar array having a first face and a second face. The solar cells in a pair of solar cells do not touch the solar cells in an adjacent pair of solar cells in the planar array. The solar cell assembly further comprises a plurality of metal counter-electrodes. Each respective metal counter-electrode in the plurality of metal counter-electrodes joins together, lengthwise, elongated solar cells in a corresponding solar cell pair in the plurality of solar cell pairs. The solar cell assembly further comprises a transparent electrically insulating substrate that covers all or a portion of the first face of the planar array. A first solar cell pair and a second solar cell pair in the plurality of elongated solar cells are electrically connected in series by an electrical contact that electrically connects the first electrode of each elongated solar cell in the first solar cell pair to the corresponding counter-electrode of the second solar cell pair.

Still another aspect of the invention is directed to a solar cell assembly comprising a plurality of elongated solar cells. Each elongated solar cell in the plurality of elongated solar cells comprises: (i) a conductive core configured as a first electrode, (ii) a semiconductor junction circumferentially disposed on the conductive core, and (iii) a transparent conductive oxide layer disposed on said semiconductor junction. The plurality of elongated solar cells is geometrically arranged in a parallel or a near parallel manner thereby forming a planar array having a first face and a second face. The plurality of elongated solar cells is arranged such that one or more elongated solar cells in the plurality of elongated solar cells do not make parallel electrical contact with adjacent elongated solar cells. For example, in some embodiments in accordance with the present invention, elongated solar cells can be in physical contact with each other if there is an insulative layer between adjacent elongated solar cells. The solar cell assembly in accordance with this aspect of the invention further comprises a plurality of metal counter-electrodes. Each respective elongated solar cell in the plurality of elongated solar cells is bound to a first corresponding metal counter-electrode in the plurality of metal counter-electrodes such that the first metal counter-electrode lies in a first groove that runs lengthwise on the respective elongated solar cell. The solar cell assembly further comprises a transparent electrically insulating substrate that covers all or a portion of the first face of the planar array. Furthermore, a first and second elongated solar cell in the plurality of elongated solar cells are electrically connected in series by an electrical contact that connects the first electrode of the first elongated solar cell to the first corresponding counter-electrode of the second elongated solar cell. In addition, the plurality of elongated solar cells is configured to receive direct light from the first face and the second face of the planar array.

Yet another aspect of the invention provides a solar cell assembly comprising a plurality of elongated solar cells. Each elongated solar cell in the plurality of elongated solar cells comprises (i) a conductive core configured as a first electrode, (ii) a semiconductor junction circumferentially disposed on the conductive core, and (iii) a transparent conductive oxide layer disposed on the semiconductor junction. The plurality of elongated solar cells is geometrically arranged in a parallel or a near parallel manner thereby forming a planar array having a first face and a second face. The plurality of elongated solar cells is arranged such that one or more elongated solar cells in the plurality of elongated solar cells do not contact adjacent elongated solar cells. The solar cell assembly in accordance with this aspect of the invention further comprises a plurality of metal counter-electrodes. Each respective elongated solar cell in the plurality of elongated solar cells is bound to a first corresponding metal counter-electrode and a second corresponding metal counter-electrode in the plurality of metal counter-electrodes such that the first metal counter-electrode lies in a first groove that runs lengthwise on the respective elongated solar cell and the second metal counter-electrode lies in a second groove that runs lengthwise on the respective elongated solar cell. The first groove and the second groove are on opposite sides of the respective elongated solar cell. The solar cell assembly in accordance with this aspect of the invention further comprises a transparent electrically insulating substrate that covers all or a portion of the first face of the planar array. In this aspect of the invention, a first and second elongated solar cell in the plurality of elongated solar cells is electrically connected in series.

Embodiments that Include Internal Reflectors

Another aspect of the present invention provides a solar cell assembly comprising a plurality of elongated solar cells. Each elongated solar cell in the plurality of elongated solar cells comprises (i) an elongated conductive core configured as a first electrode, (ii) a semiconductor junction circumferentially disposed on the elongated conductive core, and (iii) a transparent conductive oxide layer disposed on the semiconductor junction. In this aspect of the invention, elongated solar cells in the plurality of elongated solar cells are geometrically arranged in a parallel or a near parallel manner thereby forming a planar array having a first face and a second face. The solar cell assembly further comprises a plurality of metal counter-electrodes. Each respective elongated solar cell in the plurality of elongated solar cells is bound to a first corresponding metal counter-electrode in the plurality of metal counter-electrodes such that the first metal counter-electrode lies in a first groove that runs lengthwise on the respective elongated solar cell. The solar cell assembly further comprises a plurality of internal reflectors. Each respective internal reflector in the plurality of internal reflectors is configured between a corresponding first and second elongated solar cell in the plurality of elongated solar cells such that a portion of the solar light reflected from the respective internal reflector is reflected onto the corresponding first and second elongated solar cell.

In some embodiments, the solar cell assembly further comprises a first plurality of counter-electrode collars, wherein each respective counter-electrode collar in the first plurality of counter-electrode collars is wrapped around the transparent conductive oxide layer of a corresponding elongated solar cell in the plurality of elongated solar cells, toward a first end of the elongated solar cell, such that the respective counter-electrode collar is in electrical communication with the metal counter-electrode that lies in the first groove of the elongated solar cell. Such counter-electrode collars can be made of a thin strip of a conductive material (e.g., copper, aluminum, gold, silver, molybdenum, or an alloy thereof). Alternatively, such counter-electrode collars can be made of a conductive ink.

In some embodiments, elongated solar cells in the plurality of elongated solar cells are swaged at a position on the elongated solar cell where the counter-electrode collar is wrapped around the elongated solar cell. In the present invention, there is no absolute requirement that the elongated solar cells wrap all the way around the elongated solar cells. All that is required is that such collars make electrical contact with one or more counter-electrodes associated with each elongated solar cell. Accordingly, in some embodiments, elongated solar cells wrap all the way around a corresponding elongated solar cell and in some embodiments they do not. In some embodiments, each elongated solar cell is bound to a second corresponding metal counter-electrode that lies in a second groove that runs lengthwise on the elongated solar cells. Typically, the first and second grooves are on opposite sides of the elongated solar cell, more or less in the plane defined by the arrangement of the plurality of solar cells.

In some embodiments, an internal reflector in the plurality of internal reflectors is in electrical communication with (i) the first counter-electrode in the first groove of the first elongated solar cell in the plurality of elongated solar cells that corresponds to the internal reflector; and (ii) the second counter-electrode in the second groove of the second elongated solar cell in the said plurality of elongated solar cells that corresponds to the internal reflector. In some such embodiments, the internal reflector is sealed to the first counter-electrode and the second counter-electrode by an electrically conductive glue or ink.

In some embodiments, an internal reflector in the plurality of internal reflectors has a first edge and a second edge that run lengthwise along the internal reflector. The first edge of the internal reflector contacts the first counter-electrode in the first groove of the first elongated solar cell in the plurality of elongated solar cells that corresponds to said internal reflector. The second edge of the internal reflector contacts the second counter-electrode in the second groove of the second elongated solar cell in the plurality of elongated solar cells that corresponds to the internal reflector. In some embodiments, the first edge is sealed to the first counter-electrode and the second edge is sealed to the second counter-electrode by an electrically conductive glue or ink. In some embodiments, the first edge is sealed to the first counter-electrode and the second edge is sealed to the second counter-electrode by a transparent insulator (e.g., ethyl vinyl acetate or spray Teflon).

In some embodiments, the elongated conductive core of each respective elongated solar cell in the plurality of elongated solar cells has a first exposed terminal portion not covered by the semiconductor junction and the transparent conductive oxide layer of the respective elongated solar cell. In such embodiments, the solar cell assembly further comprises a first plurality of counter-electrode collars. Each respective counter-electrode collar in the first plurality of counter-electrode collars is wrapped around the transparent conductive oxide layer of a corresponding elongated solar cell in the plurality of elongated solar cells, toward a first end of the elongated solar cell, such that the respective counter-electrode collar is in electrical communication with the metal counter-electrode that lies in the first groove of the elongated solar cell. In such embodiments, the solar cell assembly further comprises a first plurality of electrical contacts. Each electrical contact in the first plurality of electrical contacts electrically connects the counter-electrode collar of a first elongated solar cell in the plurality of elongated solar cells, toward the first end of the elongated solar cell, with the exposed first terminal portion of the elongated conductive core of a second elongated solar cell in said plurality of elongated solar cells. In some embodiments, an electrical contact in the first plurality of electrical contacts is made of a conductive tape (e.g., a conductive tape that comprises a silver, nickel, tin, gold, copper, graphite, or aluminum deposit). In some embodiments, an electrical contact and the counter-electrode collar of the first elongated solar cell to which the electrical contact is electrically connected are a single piece patterned such that the counter-electrode collar wraps around the first elongated solar cell. In some embodiments, a first elongated solar cell and a second elongated solar cell in the plurality of elongated solar cells are electrically connected in series.

In some embodiments, the elongated conductive core of each respective elongated solar cell in the plurality of elongated solar cells has a second exposed terminal portion not covered by the semiconductor junction and the transparent conductive oxide layer of the respective elongated solar cell. In such embodiments, the solar cell assembly further comprises a second plurality of counter-electrode collars. Each respective counter-electrode collar in the second plurality of counter-electrode collar transparent conductive oxide layer of a corresponding elongated solar cell in the plurality of elongated solar cells, toward a second end of the elongated solar cell, such that the respective counter-electrode collar is in electrical communication with the metal counter-electrode that lies in the first groove of the elongated solar cell assembly further comprises a second plurality of electrical contacts. Each electrical contact in the second plurality of electrical contacts electrically connects the counter-electrode collar of a first elongated solar cell in the plurality of elongated solar cells, toward the second end of the elongated solar cell, with the exposed second terminal portion of the elongated conductive core of a second elongated solar cell in the plurality of elongated solar cells.

In some embodiments, the first face and the second face of the planar array is each coated with a first layer of transparent insulator that is applicable in atomized form. In some embodiments, the first face and the second face of the planar array is each coated with a second layer of transparent insulator, over the first layer of transparent insulator (e.g., ethyl vinyl acetate), that is applicable in liquid or solid form.

In some embodiments, the semiconductor junction of an elongated solar cell in said plurality of elongated solar cells is a homojunction, a heterojunction, a heteroface junction, a buried homojunction, or a p-i-n junction. In some embodiments, there is an intrinsic layer disposed between the semiconductor junction and the transparent conductive oxide in an elongated solar cell in the plurality of elongated solar cells. In some embodiments, the intrinsic layer is formed by an undoped transparent oxide. In some embodiments, the intrinsic layer is made of undoped zinc oxide, metal oxide or any transparent material that is highly insulating.

In some embodiments, the semiconductor junction of an elongated solar cell in the plurality of elongated solar cells comprises an inner coaxial layer and an outer coaxial layer such that the outer coaxial layer comprises a first conductivity type and the inner coaxial layer comprises a second, opposite, conductivity type. In some embodiments, the inner coaxial layer comprises copper-indium-gallium-diselenide (CIGS). In some embodiments, the outer coaxial layer comprises CdS, $SnO_2$, ZnO, $ZrO_2$, or doped ZnO. In some embodiments, the elongated conductive core is made of aluminum, titanium, molybdenum, steel, nickel, silver, gold, an alloy thereof, or any combination thereof. In some embodiments, the transparent conductive oxide layer of an elongated solar cell in the plurality of elongated solar cells is made of tin oxide $SnO_x$, with or without fluorine doping, indium-tin oxide (ITO), indium-zinc oxide, doped zinc oxide (e.g., aluminum doped zinc oxide) or a combination thereof.

In some embodiments, the elongated conductive core of all or a portion of the elongated solar cells in the plurality of elongated solar cells is hollowed. In some such embodiments, air or helium is blown through all or a portion of the elongated solar cells in the plurality of elongated solar cells. In some embodiments, an elongated solar cell in the plurality of elongated solar cells is rod-shaped. In some embodiments, an elongated conductive core of an elongated solar cell in the plurality of elongated solar cells is metal tubing.

Still another aspect of the invention provides a solar cell assembly comprising a plurality of elongated solar cells, each elongated solar cell in the plurality of elongated solar cells including (i) an elongated conductive core configured as a first electrode, (ii) a semiconductor junction circumferentially disposed on the elongated conductive core, and (iii) a transparent conductive oxide layer disposed on the semiconductor junction. In this aspect of the invention, elongated solar cells in the plurality of elongated solar cells are geometrically arranged in a parallel or a near parallel manner thereby forming a planar array having a first face and a second face. The solar cell assembly further comprises a plurality of metal counter-electrodes. Each respective elongated solar cell in the plurality of elongated solar cells is bound to a first and second corresponding metal counter-electrode in the plurality of metal counter-electrodes such that the first corresponding metal counter-electrode lies in a first groove that runs lengthwise on the respective elongated solar cell and the second corresponding metal counter-electrode lies in a second groove that runs lengthwise on the respective elongated solar cell. The solar cell assembly further comprises a plurality of internal reflectors. Each respective internal reflector in the plurality of internal reflectors is configured between a corresponding first and second elongated solar cell in the plurality of elongated solar cells such that a portion of the solar light reflected from the respective internal reflector is reflected onto the corresponding first and second elongated solar cell. The solar cell assembly further comprises a transparent electrically insulating substrate that covers all or a portion of the first face of the planar array and a transparent insulating covering disposed on the second face of the planar array, thereby encasing the plurality of elongated solar cells between the transparent insulating covering and the transparent electrically insulating substrate.

Still another aspect of the invention provides a solar cell assembly comprising a plurality of elongated solar cells. Each elongated solar cell in the plurality of elongated solar cells comprises (i) an elongated conductive core configured as a first electrode, (ii) a semiconductor junction circumferentially disposed on the elongated conductive core; (iii) an intrinsic layer circumferentially disposed on the semiconductor junction; and (iv) a transparent conductive oxide layer disposed on the intrinsic layer. Elongated solar cells in the plurality of elongated solar cells are geometrically arranged in a parallel or a near parallel manner thereby forming a planar array having a first face and a second face. The solar cell assembly further comprises a plurality of metal counter-electrodes. Each respective elongated solar cell in the plurality of elongated solar cells is bound to a first corresponding metal counter-electrode and a second corresponding metal counter-electrode in the plurality of metal counter-electrodes such that (i) the first corresponding metal counter-electrode lies in a first groove that runs lengthwise on the respective elongated solar cell and (ii) the second corresponding metal counter-electrode lies in a second groove that runs lengthwise on the respective elongated solar cell. The solar cell assembly further comprises a plurality of internal reflectors. Each respective internal reflector in the plurality of internal reflectors is configured between a corresponding first and second elongated solar cell in the plurality of elongated solar cells such that a portion of the solar light reflected from the respective internal reflector is reflected onto the corresponding first and second elongated solar cell. The solar cell assembly further comprises a transparent electrically insulating substrate that covers all or a portion of the first face of the planar array and a transparent insulating covering disposed on the second face of the planar array, thereby encasing the plurality of elongated solar cells between the transparent insulating covering and the transparent electrically insulating substrate.

4. BRIEF DESCRIPTION OF THE DRAWINGS

FIG. 3B is a cross-sectional view of an elongated solar cell in accordance with the prior art.

FIG. 3C is a cross-sectional view of a solar cell assembly in which a plurality of elongated solar cells are affixed to an electrically conductive substrate in accordance with the prior art.

FIG. 4E is a cross-sectional view taken about line 4B-4B of FIG. 4A that depicts the serial arrangement of tubular solar cells in a bifacial assembly in accordance with an alternative embodiment of the present invention.

5. DETAILED DESCRIPTION

Disclosed herein are solar cell assemblies for converting solar energy into electrical energy and more particularly to improved solar cells and solar cell arrays. The solar cells of the present invention have a wire shape and are arranged in parallel but are electrically connected in series.

5.1 Basic Structure

Figure 4A:
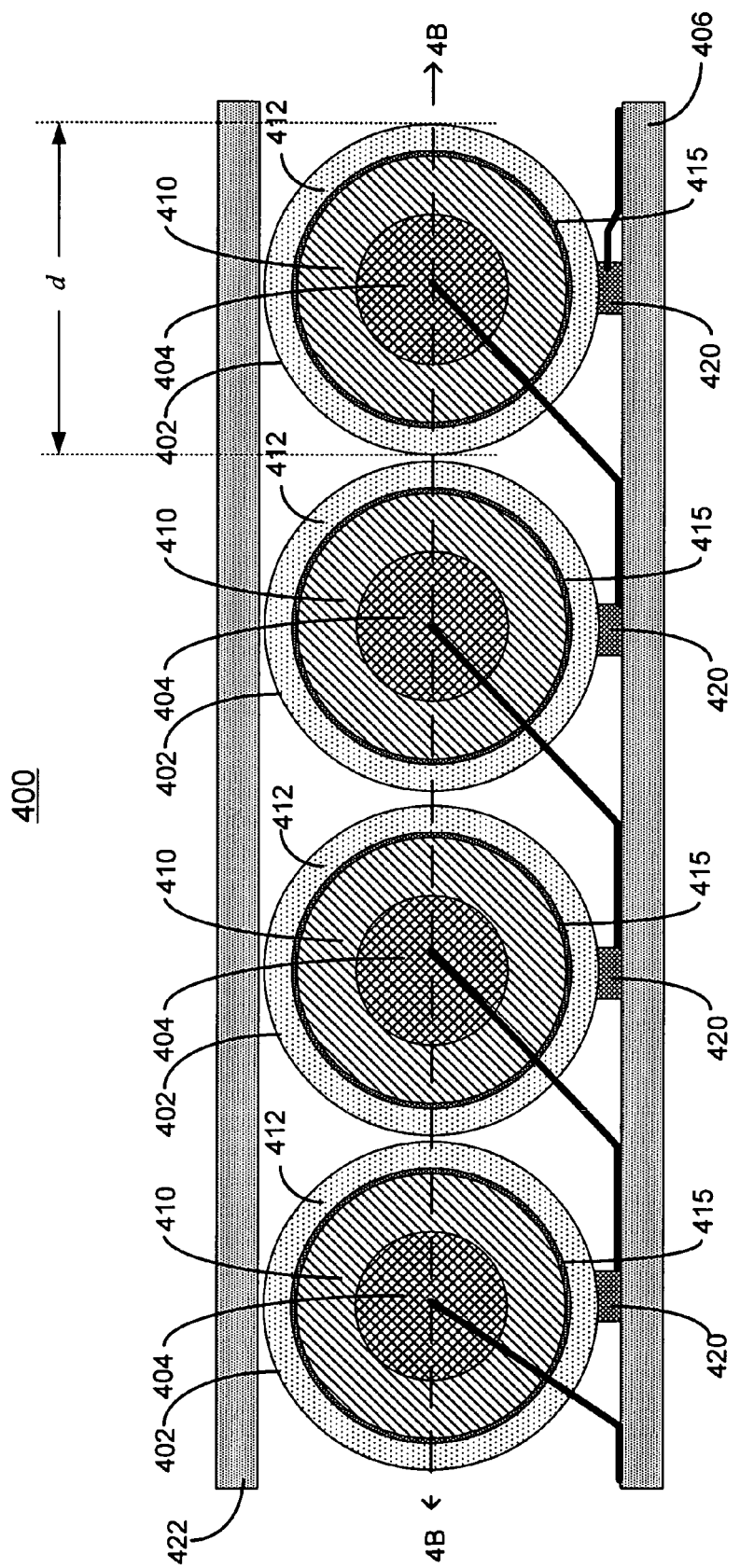
FIG. 4A is a cross-sectional view of elongated solar cells electrically arranged in series and geometrically arranged in a parallel or near parallel manner on counter-electrodes that contact a substrate in order to form a bifacial assembly, in accordance with an embodiment of the present invention.

The present invention provides a solar cell assembly 400 in which elongated solar cells 402, shown in cross-section in FIG. 4A, serve to absorb light. A conductive core (elongated conductive core) 404 serves as the first electrode in the assembly and a transparent conductive oxide (TCO) 412 on the exterior surface of each solar cell serves as the counter-electrode.

In general, conductive core 404 is made out of any material such that it can support the photovoltaic current generated by the solar cell with negligible resistive losses. In some embodiments, conductive core 404 is composed of any conductive material, such as aluminum, molybdenum, titanium, steel, nickel, silver, gold, or an alloy thereof. In some embodiments, conductive core 404 is made out of a metal-, graphite-, carbon black-, or superconductive carbon black-filled oxide, epoxy, glass, or plastic. In some embodiments, conductive core 404 is made of a conductive plastic. As defined herein, a conductive plastic is one that, through compounding techniques, contains conductive fillers which, in turn, impart their conductive properties to the plastics system. The conductive plastics used in the present invention to form conductive core 404 contain fillers that form sufficient conductive current-carrying paths through the plastic matrix to support the photovoltaic current generated by solar cell with negligible resistive losses. The plastic matrix of the conductive plastic is typically insulating, but the composite produced exhibits the conductive properties of the filler.

A semiconductor junction 410 is formed around conductive core 404. Semiconductor junction 410 is any photovoltaic homojunction, heterojunction, heteroface junction, buried homojunction, or p-i-n junction having an absorber layer that is a direct band-gap absorber (e.g., crystalline silicon) or an indirect band-gap absorber (e.g., amorphous silicon). Such junctions are described in Chapter 1 of Bube, *Photovoltaic Materials*, 1998, Imperial College Press, London, which is hereby incorporated by reference in its entirety. Details of exemplary types of semiconductors junctions 410 in accordance with the present invention are disclosed in Section 5.2, below. In addition to the exemplary junctions disclosed in Section 5.2, below, junctions 410 can be multijunctions in which light traverses into the core of junction 410 through multiple junctions that, preferably, have successfully smaller bandgaps.

Optionally, there is a thin intrinsic layer (i-layer) 415 between semiconductor junction 410 and an outer transparent conductive oxide (TCO) layer 412. The i-layer 415 can be formed using any undoped transparent oxide including, but not limited to, zinc oxide, metal oxide, or any transparent material that is highly insulating.

The transparent conductive oxide (TCO) layer 412 is built up on top of the semiconductor junction layers 410 thereby completing the circuit. As noted above, in some embodiments, there is a thin i-layer coating the semiconductor junction 410. In such embodiments, TCO layer 412 is built on top of the i-layer. In some embodiments, TCO layer 412 is made of tin oxide $SnO_x$ (with or without fluorine doping), indium-tin oxide (ITO), doped zinc oxide (e.g., aluminum doped zinc oxide), indium-zinc oxide or any combination thereof. In some embodiments, TCO layer 412 is either p-doped or n-doped. For example, in embodiments where the outer semiconductor layer of junction 410 is p-doped, TCO layer 412 can be p-doped. Likewise, in embodiments where the outer semiconductor layer of junction 410 is n-doped, TCO layer 412 can be n-doped. In general, TCO layer 412 is preferably made of a material that has very low resistance, suitable optical transmission properties (e.g., greater than 90%), and a deposition temperature that will not damage underlying layers of semiconductor junction 410 and/or optional i-layer 415. In some embodiments, TCO 412 is an electrically conductive polymer material such as a conductive polytiophene, a conductive polyaniline, a conductive polypyrrole, a PSS-doped PEDOT (e.g., Bayrton), or a derivative of any of the foregoing. In some embodiments, TCO comprises more than one layer, including a first layer comprising tin oxide $SnO_x$ (with or without fluorine doping), indium-tin oxide (ITO), indium-zinc oxide, doped zinc oxide (e.g., aluminum doped zinc oxide) or a combination thereof and a second layer comprising a conductive polytiophene, a conductive polyaniline, a conductive polypyrrole, a PSS-doped PEDOT (e.g., Bayrton), or a derivative of any of the foregoing. Additional suitable materials that can be used to form TCO layer are disclosed in United States Patent publication 2004/0187917A1 to Pichler, which is hereby incorporated by reference in its entirety.

Rod-shaped (elongated) solar cells 402 are lined up multiply in parallel. The entire assembly is sealed between electrically resistant transparent substrate 406 and a covering 422 using a sealant such as ethyl vinyl acetate or silicone. Covering 422 is generally made from the same materials as substrate 406. Suitable materials for covering 422 and substrate 406 include, but are not limited to glass or polyvinyl fluoride products such as Tedlar and Tefzel (DuPont, Wilmington, Del.).

Figure 1:
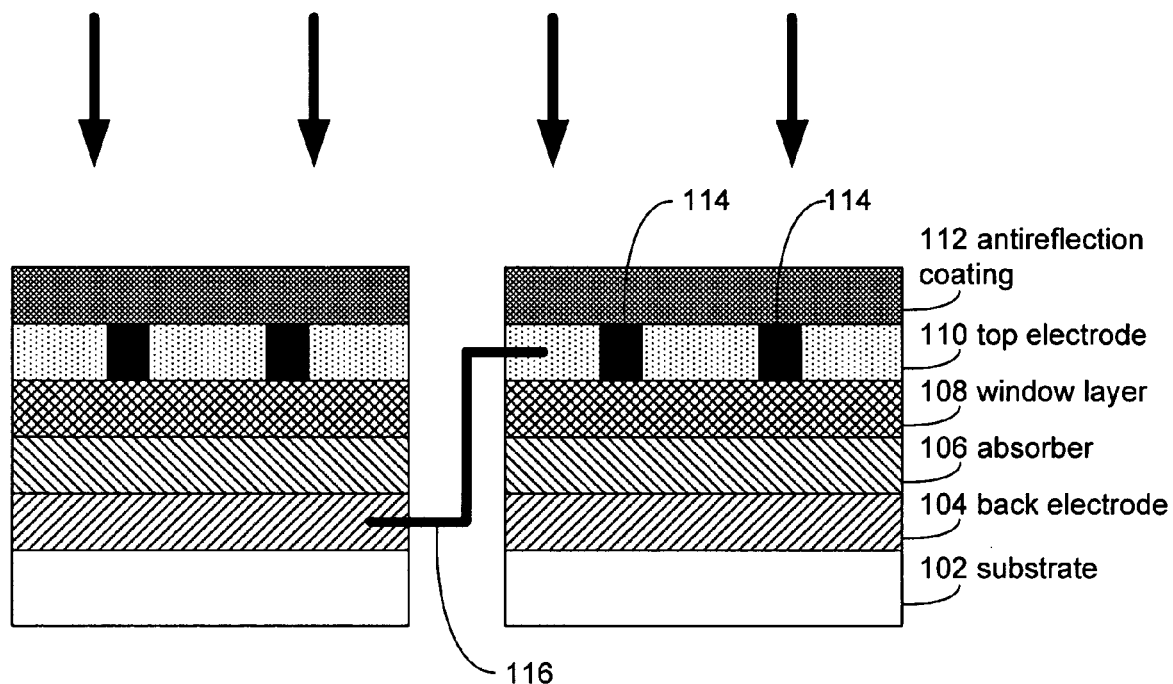
FIG. 1 illustrates interconnected solar cells in accordance with the prior art.
Figure 2:
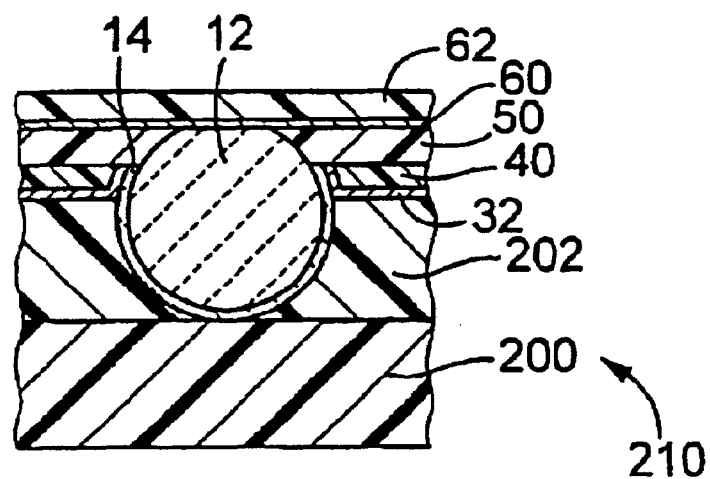
FIG. 2 illustrates a spherical solar cell including a p-type inner layer and an n-type outer layer in accordance with the prior art.
Figure 3A:
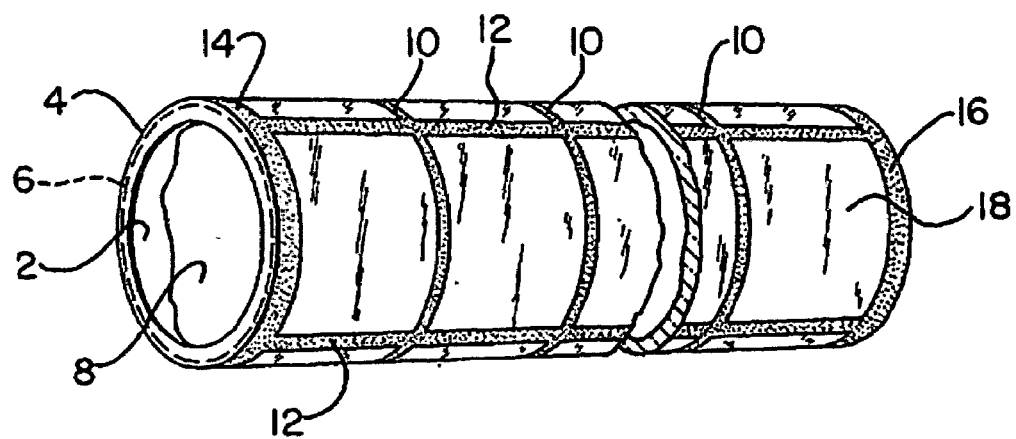
FIG. 3A illustrates a tubular photovoltaic element comprising a cylindrical silicon tube of n-type conductivity that has been subjected to diffusion of boron into its outer surface to form an outer p-conductivity type region and thus a tubular solar cell in accordance with the prior art.
Figure 3D:
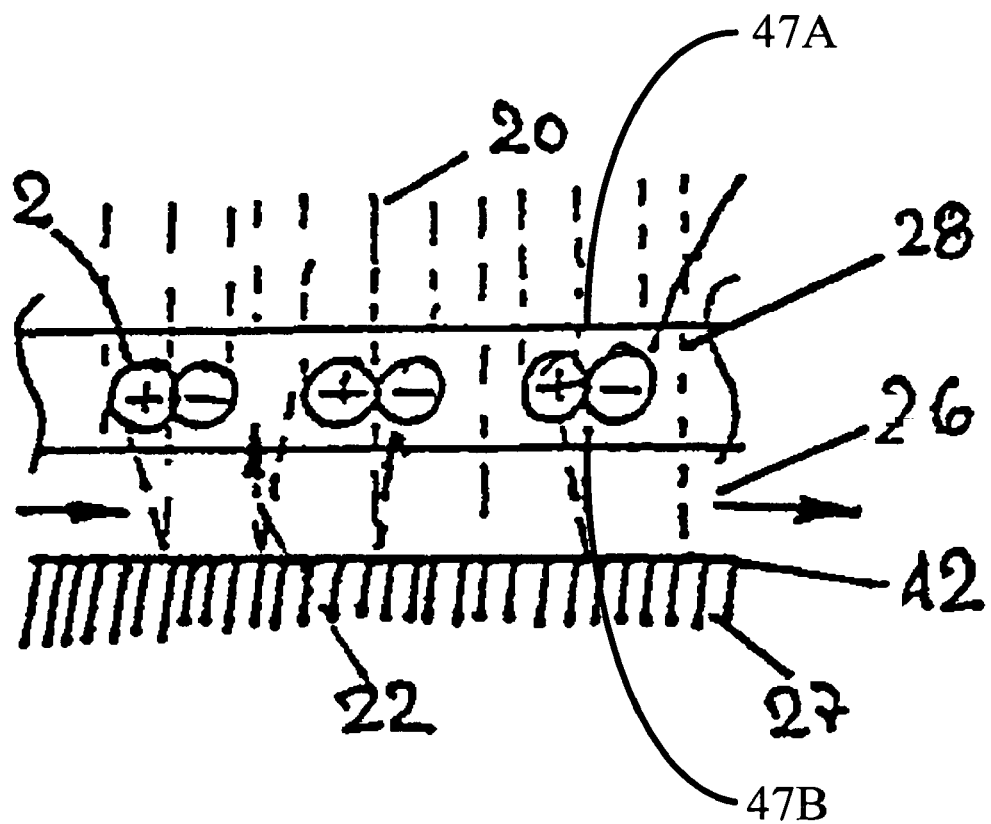
FIG. 3D is a cross-sectional view of a solar cell assembly disposed a distance away from a reflecting wall in accordance with the prior art.
Figure 4B:
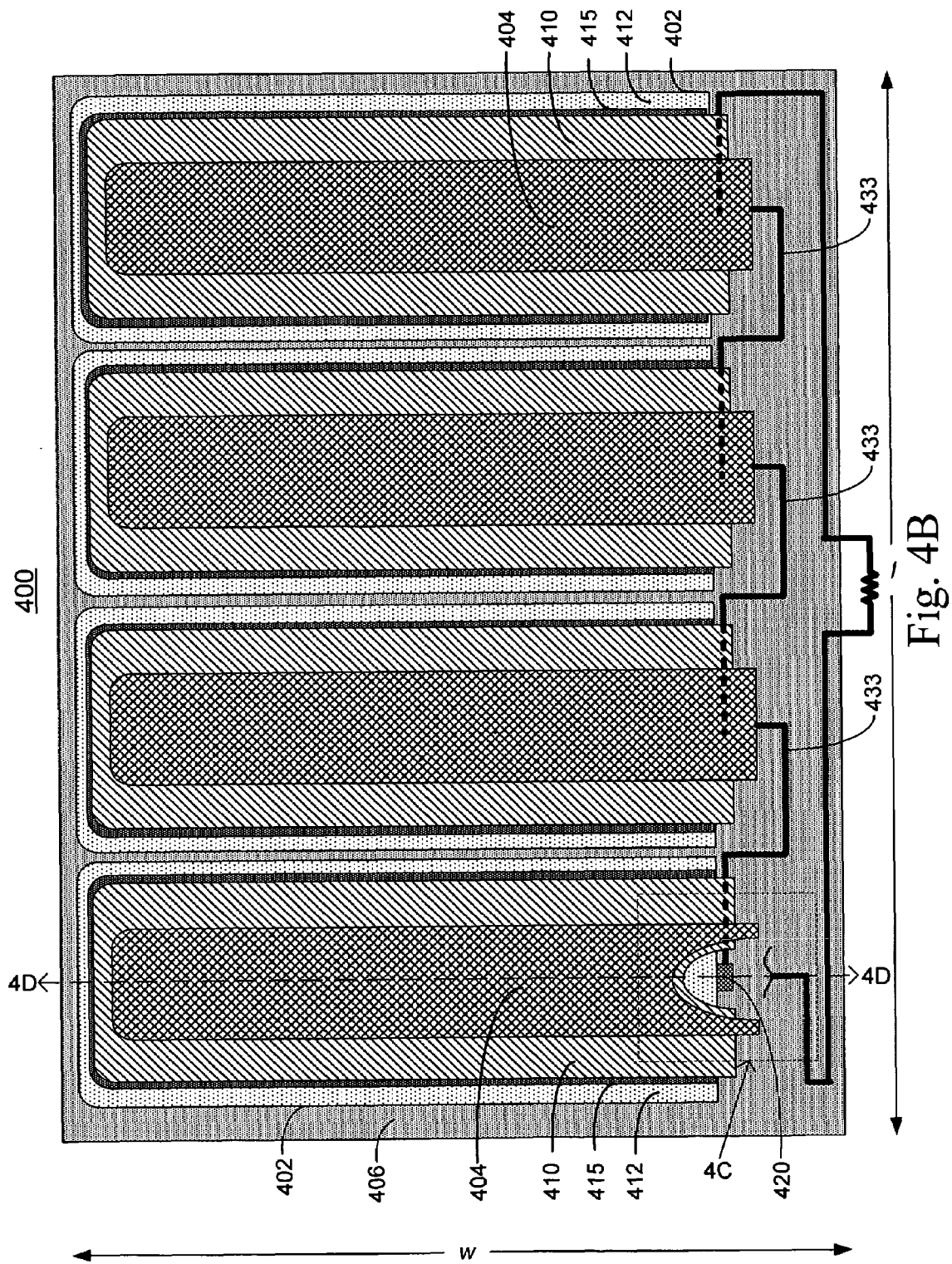
FIG. 4B is a cross-sectional view taken about line 4B-4B of FIG. 4A depicting the serial electrical arrangement of tubular solar cells in a bifacial assembly in accordance with an embodiment of the present invention.

FIG. 4B provides a cross-sectional view with respect to line 4B-4B of FIG. 4A. As can be seen with FIGS. 4A and 4B, each elongated cell 402 has a length that is great compared to the diameter d of its cross-section. An advantage of the architecture shown in FIG. 4A is that there is no front side contact that shades solar cells 402. Such a front side contact is found in known devices (e.g., elements 10 of FIG. 3). Another advantage of the architecture shown in FIG. 4A is that elongated cells 402 are electrically connected in series rather than in parallel. In such a series configuration, the voltage of each elongated cell 402 is summed. This serves to increase the voltage across the system, thereby keeping the current down, relative to comparable parallel architectures, and minimizes resistive losses. A serial electrical arrangement is maintained by arranging all or a portion of the elongated solar cells 402 such that they do not touch each other, as illustrated in FIGS. 4A and 4B. The separation distance between solar cells 402 is any distance that prevents electrical contact between solar cells 402. For instance, in some embodiments, the distance between adjacent solar cells 402 is 0.1 micron or greater, 0.5 microns or greater, or between 1 and 5 microns.

Another advantage of the architecture shown in FIG. 4A is that the resistance loss across the system is low. This is because each electrode component of the circuit is made of highly conductive material. For example, as noted above, conductive core 404 of each solar cell 402 is made of a conductive metal. Furthermore, each conductive core 404 has a diameter that is large enough to carry current without an appreciable current loss due to resistance. While larger conductive cores 404 ensure low resistance, TCO layers encompassing such larger conductive cores 404 must carry current further to contacts (counter-electrode strip) 420. Thus, there is an upper bound on the size of conductive cores 404. In view of these and other considerations, diameter d is between 0.5 millimeters (mm) and 20 mm in some embodiments of the present invention. Thus, conductive cores 404 are sized so that they are large enough to carry a current without appreciable resistive losses, yet small enough to allow TCO 412 to efficiently deliver current to leads 420. With this balanced design, resistive loss is minimized and an efficient solar cell assembly 400 is realized.

The advantageous low resistance nature of the architecture illustrated in FIG. 4A is also facilitated by the highly conductive properties of leads 420. In some embodiments, for example, leads 420 are composed of a conductive epoxy (e.g., silver epoxy) or conductive ink and the like.

There are a number of different ways in which elongated cells 402 can be packaged in order to form solar cell assembly 400. For example, in one embodiment, leads 420 are formed by depositing a thin metallic layer on substrate 406 and then patterning the layer into a series of parallel strips, where each strip runs the length of a solar cell 402. Then, elongated solar cells 402 are affixed to substrate 406 by leads 420 using a conductive epoxy. In some embodiments, leads 420 are formed directly on solar cells 402 and solar cells 402 are not affixed to substrate 406. In such embodiments, there are at least two different ways in which elongated solar cells 402 can be packaged to form solar cell assembly 400. In a first approach, elongated solar cells 402, having leads 420 as illustrated in FIG. 4A, rest on substrate 406 but are not affixed to the substrate. In a second approach, elongated solar cells 402, having leads 420 as illustrated in FIG. 4A, do not contact substrate 406. This second approach is not illustrated. In this second approach, a layer of ethyl vinyl acetate or some other suitable transparent material separates contacts 420 from substrate 406.

Still another advantage of the architecture illustrated in FIG. 4A is that the path length through the absorber layer (e.g., layer 502, 510, 520, or 540 of FIG. 5) of semiconductor junction 410 is, on average, longer than the path length through of the same type of absorber layer having the same width but in a planar configuration. Thus, the elongated architecture illustrated in FIG. 4A allows for the design of thinner absorption layers relative to analogous planar solar cell counterparts. In the elongated architecture, the thinner absorption layer absorbs the light because of the increased path length through the layer. Because the absorption layer is thinner relative to comparable planar solar cells, there is less resistance and, hence, an overall increase in efficiency in the cell relative to analogous planar solar cells. Additional advantages of having a thinner absorption layer that still absorbs sufficient amounts of light is that such absorption layers require less material and are thus cheaper. Furthermore, thinner absorption layers are faster to make, thereby further lowering production costs.

Another advantage of elongated solar cells 402 illustrated in FIG. 4A is that they have a relatively small surface area, relative to comparable planar solar cells, and they possess radial symmetry. Each of these properties allow for the controlled deposition of doped semiconductor layers necessary to form semiconductor junction 410. The smaller surface area, relative to conventional flat panel solar cells, means that it is easier to present a uniform vapor across the surface during deposition of the layers that form semiconductor junction 410. The radial symmetry can be exploited during the manufacture of the cells in order to ensure uniform composition (e.g., uniform material composition, uniform dopant concentration, etc.) and/or uniform thickness of individual layers of semiconductor junction 410. For example, the conductive core 404 upon which layers are deposited to make solar cells 402 can be rotated along its longitudinal axis during such deposition in order to ensure uniform material composition and/or uniform thickness.

The cross-sectional shape of solar cells 402 is generally circular in FIG. 4B. In other embodiments, solar cell 402 bodies with a quadrilateral cross-section or an elliptical shaped cross-section and the like are used. In fact, there is no limit on the cross-sectional shape of solar cells 402 in the present invention, so long as the solar cells 402 maintain a general overall rod-like or wire-like shape in which their length is much larger than their diameter and they possess some form of cross-sectional radial symmetry.

As illustrated in FIG. 4B, assembly 400 comprises many elongated solar cells 402 geometrically arranged in parallel fashion and electrically connected in series. For example, a first and second elongated solar cell (rod-shaped solar cell) 402 are electrically connected in series by an electrical contact 433 that connects the conductive core 404 (first electrode) of the first elongated solar cell 402 to the corresponding counter-electrode strip 420 electrode strip of the second elongated solar cell. Thus, as illustrated in FIG. 4A, elongated solar cells 402 are the basic unit that respectively forms the semiconductor layer 410, the TCO 412, and the metal conductive core 404 of the elongated solar cell 402. The elongated solar cells 402 are multiply arranged in a row parallel or nearly parallel with respect to each other and rest upon independent leads (counter-electrodes) 420 that are electrically isolated from each other. Advantageously, in the configuration illustrated in FIG. 4A, elongated solar cells 402 can receive direct light either through substrate 406, covering 422, or both substrate 406 and covering 422.

In some embodiments, not all elongated solar cells 402 in assembly 400 are electrically arranged in series. For example, in some embodiments, there are pairs of elongated solar cells 402 that are electrically arranged in parallel. A first and second elongated solar cell can be electrically connected in parallel, and are thereby paired, by using a first electrical contact (e.g., an electrically conducting wire, etc., not shown) that joins the conductive core 404 of a first elongated solar cell to the second elongated solar cell. To complete the parallel circuit, the TCO 412 of the first elongated solar cell 402 is electrically connected to the TCO 412 of the second elongated solar cell 402 either by contacting the TCOs of the two elongated solar cells either directly or through a second electrical contact (not shown). The pairs of elongated solar cells are then electrically arranged in series. In some embodiments, three, four, five, six, seven, eight, nine, ten, eleven or more elongated solar cells 402 are electrically arranged in parallel. These parallel groups of elongated solar cells 402 are then electrically arranged in series.

In some embodiments, rather than packaging solar cells 402 between a substrate 406 and cover 422 using a sealant such as ethyl vinyl acetate, solar cells 402 arranged in the same planar parallel configuration illustrated in FIGS. 4A and 4B are encased in a rigid transparent film. Suitable materials for such a rigid transparent film include, but are not limited to, polyvinyl fluoride products such as Tedlar (DuPont, Wilmington, Del.).

Figure 4C:
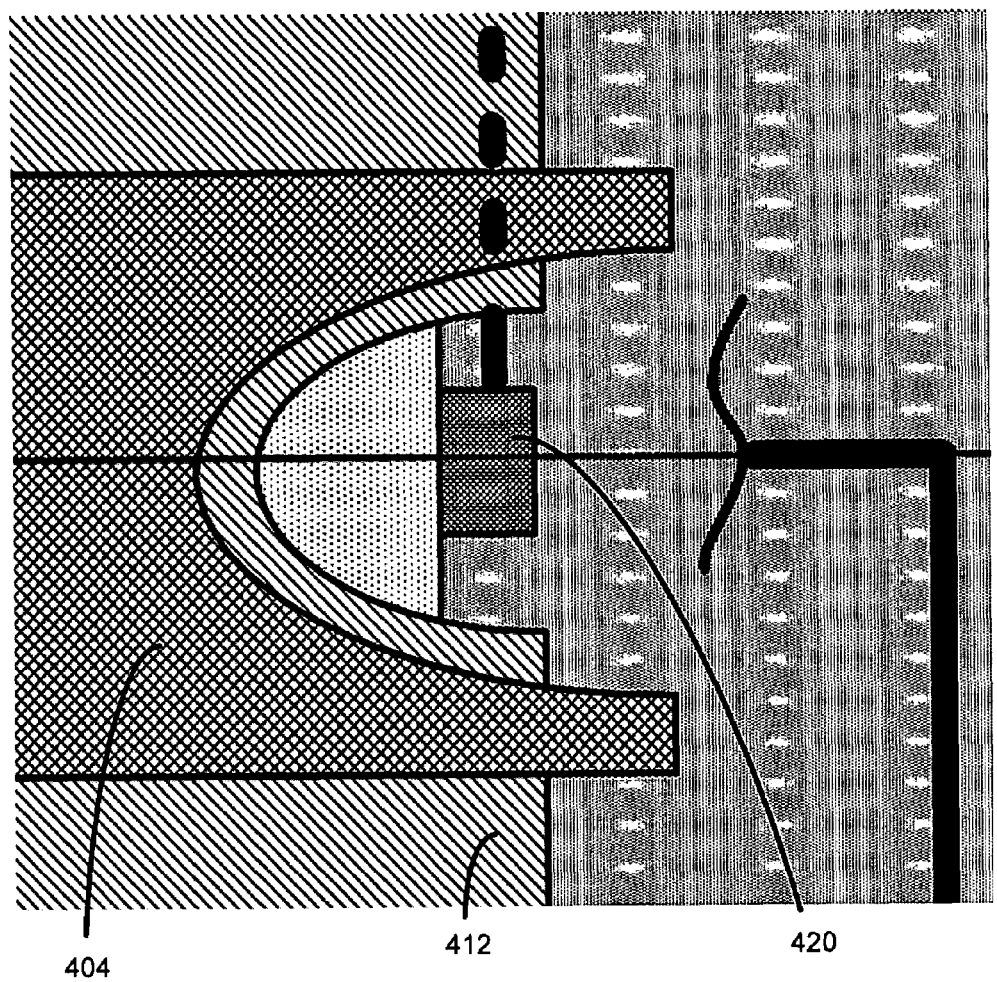
FIG. 4C is a blow-up perspective view of region 4C of FIG. 4B, illustrating various layers in elongated solar cells in accordance with one embodiment of the present invention.

FIG. 4C is an enlargement of region 4C of FIG. 4B in which a portion of conductive core 404 and transparent conductive oxide (TCO) 412 have been cut away to illustrate the positional relationship between counter-electrode strip 420, elongated cell 402, and electrically resistant transparent substrate 406. Furthermore FIG. 4C illustrates how electrical contact 433 joins the conductive core 404 of one elongated solar cell 402 to the counter-electrode 420 of another solar cell 402.

One advantage of the configuration illustrated in FIG. 4 is that electrical contacts 433 that serially connect solar cells 402 together only need to be placed on one end of assembly 400, as illustrated in FIG. 4B. Thus, referring to FIG. 4D, which is a cross-sectional view of a elongated solar 402 cell taken about line 4D-4D of FIG. 4B, it is possible to completely seal far-end 455 of solar cell 402 in the manner illustrated. In some embodiments, the layers in this seal are identical to the layers circumferentially disposed lengthwise on conductive core 404, namely, in order of deposition on conductive core 404, semiconductor junction 410, optional thin intrinsic layer (i-layer) 415, and transparent conductive oxide (TCO) layer 412. In such embodiments, end 455 can receive sun light and therefore contribute to the electrical generating properties of the solar cell 402.

Figure 4D:
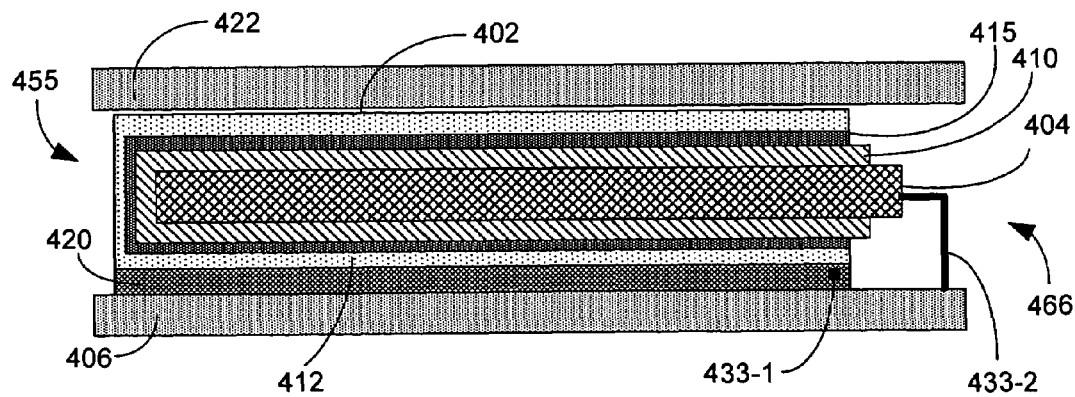
FIG. 4D is a cross-sectional view of an elongated solar cell taken about line 4D-4D of FIG. 4B, in accordance with an embodiment of the present invention.

FIG. 4D also illustrates how the various layers deposited on conductive core 404 are tapered at end 466 where electrical contacts 433 are found. For instance, a terminal portion of conductive core 404 is exposed, as illustrated in FIG. 4D. In other words, semiconductor junction 410, optional i-layer 415, and TCO 412 are stripped away from a terminal portion of conductive core 404. Furthermore, a terminal portion of semiconductor junction 410 is exposed as illustrated in FIG. 4D. That is, optional i-layer 415 and TCO 412 are stripped away from a terminal portion of semiconductor junction 410. Such a configuration is advantageous because it prevents a short from developing between TCO 412 and conductive core 404. In FIG. 4D, elongated solar cell 402 is positioned on counter-electrode strip 420 which, in turn, is positioned onto electrically resistant transparent substrate 406. However, there is no requirement that counter-electrode strip 420 make contact with electrically resistant transparent substrate 406. In fact, in some embodiments, elongated solar cells 402 and their corresponding electrode strips 420 are sealed between electrically resistant transparent substrate 406 and covering 422 in such a manner that they do not contact substrate 406 and covering 422. In such embodiments, elongated solar cells 402 and corresponding electrode strips 420 are fixedly held in place by a sealant such as ethyl vinyl acetate.

FIG. 4D further provides a perspective view of electrical contacts 433 that serially connect elongated solar cells 402. For instance, a first electrical contact 433-1 electrically interfaces with counter-electrode 420 whereas a second electrical contact 433-2 electrically interfaces with conductive core 404 (the first electrode of elongated solar cell 402). First electrical contact 433-1 serially connects the counter-electrode of elongated solar cell 402 to the conductive core 404 of another elongated solar cell 402 in assembly 400. Second electrical contact 433-2 serially connects the conductive core 404 of elongated solar cell 402 to the counter-electrode 420 of another elongated solar cell 402 in assembly 400.

Figure 4F:
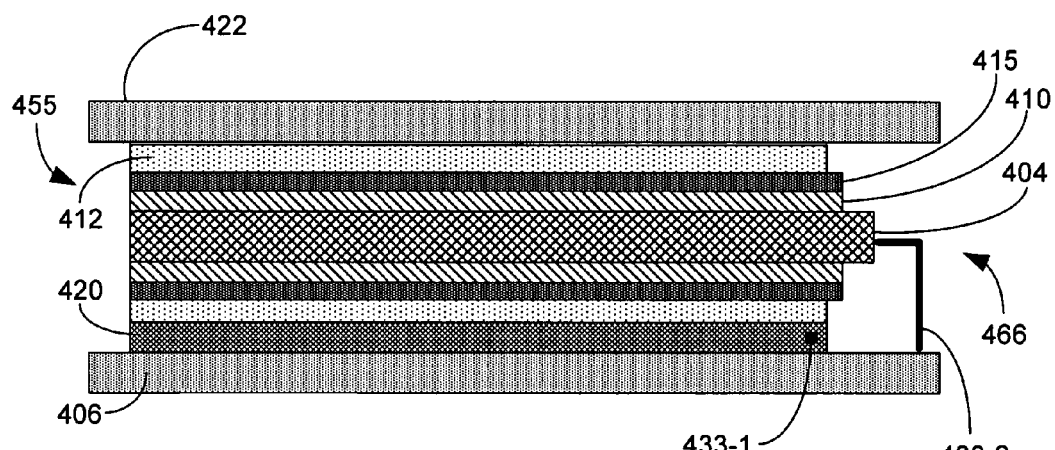
FIG. 4F is a cross-sectional view of an elongated solar cell taken about line 4F-4F of FIG. 4E, in accordance with an embodiment of the present invention.

FIG. 4E provides a cross-sectional view with respect to line 4B-4B of FIG. 4A in accordance with another embodiment of the present invention. FIG. 4E is similar to FIG. 4B. However, in FIG. 4E, elongated solar cells 402 facing end 455 are not sealed as they are in FIG. 4B and FIG. 4D. Thus, the ends of elongated solar cells 402 facing end 455 cannot contribute to the photovoltaic potential of solar cell 402. However, the embodiment illustrated in FIG. 4E has the advantage of being easier to make than the embodiment illustrated in FIGS. 4B and 4D. Furthermore, in many instances, the loss of contribution to the photovoltaic potential from end 455 is negligible because the surface area of such ends is so small. FIG. 4F is a cross-sectional view of a elongated solar 402 cell taken about line 4F-4F of FIG. 4E. FIG. 4E which further illustrates the configuration of end 455 of elongated solar cell 402 in accordance with the embodiment of the invention illustrated in FIG. 4E.

Figure 6A:
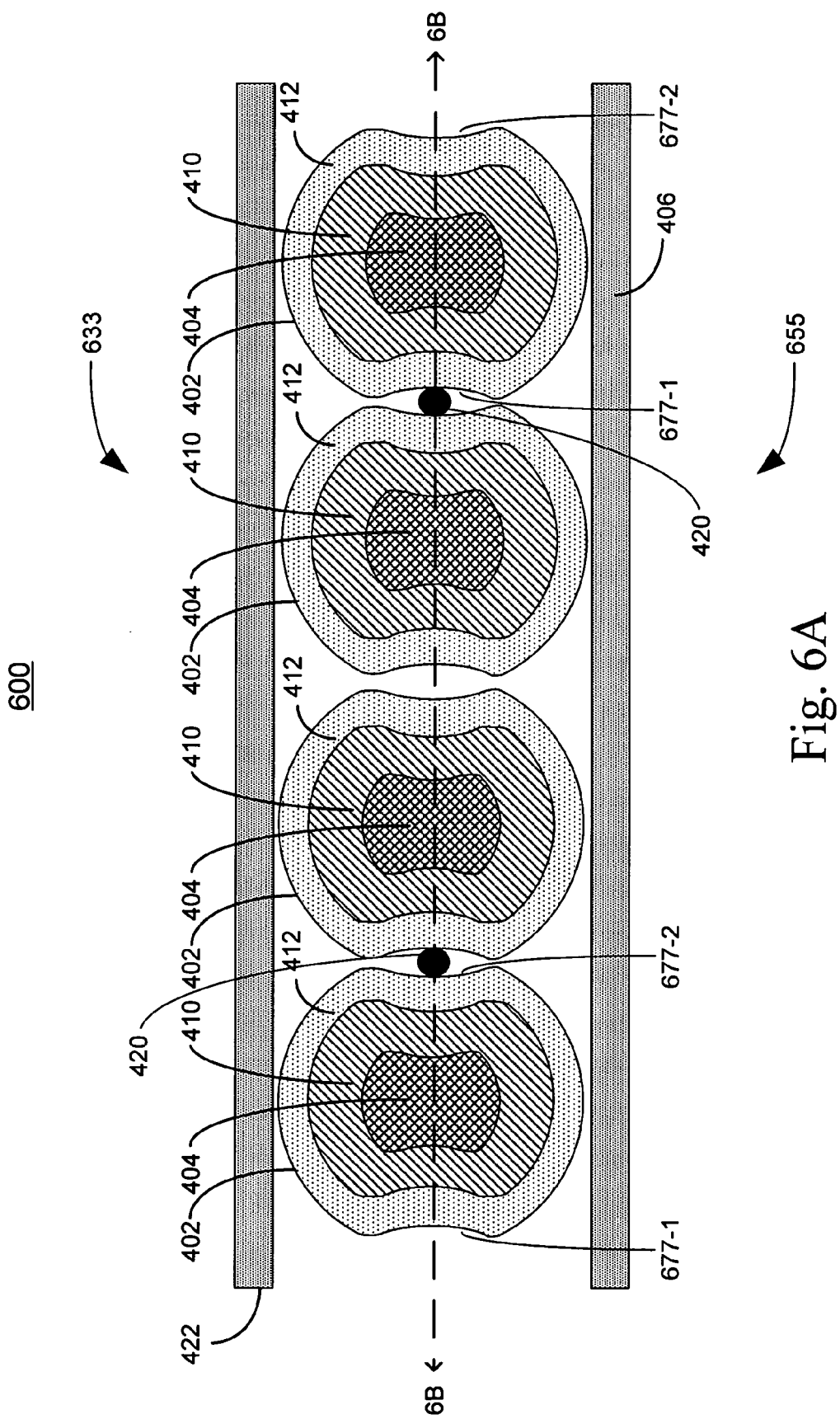
FIG. 6A is a cross-sectional view of elongated solar cells electrically arranged in series in a bifacial assembly where counter-electrodes form interfaces between solar cell pairs, in accordance with another embodiment of the present invention.

FIG. 6 illustrates a solar cell assembly 600 in accordance with the present invention. Specifically, FIG. 6A is a cross-sectional view of rod-shaped (elongated) solar cells 402 electrically arranged in series in a bifacial assembly 600 where counter-electrodes 420 form interfaces between solar cell pairs 402. As illustrated in FIG. 6A, solar cell assembly 600 comprises a plurality of elongated solar cells 402. There is no limit to the number of solar cells 402 in this plurality (e.g., 1000 or more, 10,000 or more, between 5,000 and one million solar cells 402, etc.). As in the embodiment of the invention illustrated in FIG. 4 and described above, each elongated solar cell 402 comprises a conductive core 404 with a semiconductor junction 410 circumferentially disposed on the conductive core. A transparent conductive oxide layer 412 circumferentially disposed on the semiconductor junction 410 completes the circuit.

Figure 6B:
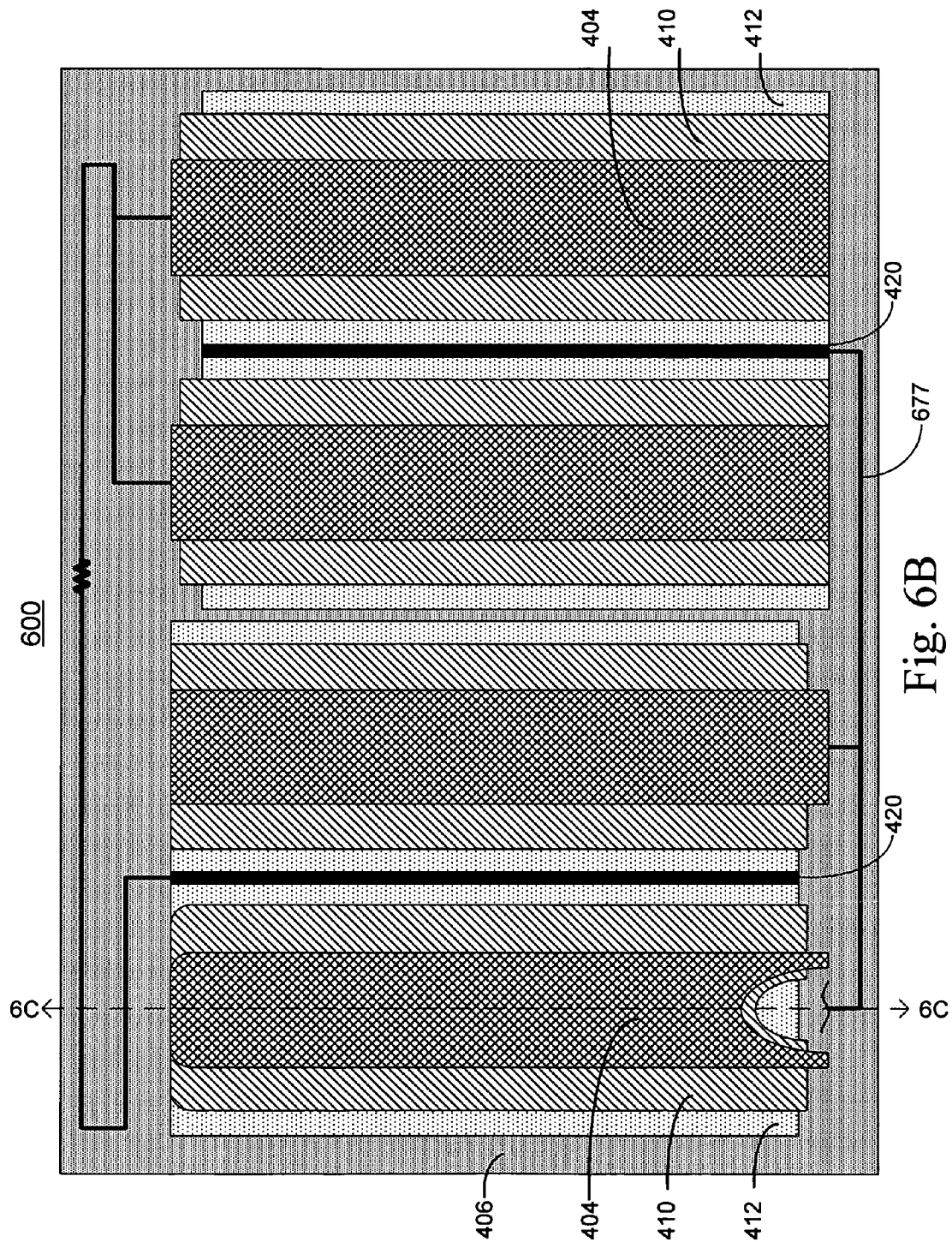
FIG. 6B is a cross-sectional view taken about line 6B-6B of FIG. 6A that depicts the serial arrangement of tubular solar cells in a bifacial assembly in accordance with an embodiment of the present invention.

As illustrated in FIGS. 6A and 6B, the plurality of elongated solar cells 402 are geometrically arranged in a parallel or near parallel manner as a plurality of solar cell pairs so as to form a planar array having a first face (on side 633 of assembly 600 as illustrated in FIG. 6A) and a second face (on side 655 of assembly 600 as illustrated in FIG. 6A). Solar cells 402 in a pair of solar cells do not touch the solar cells 402 in an adjacent pair of solar cells. However, in the embodiment illustrated in FIG. 6, solar cells 402 within a given pair of solar cells are in electrical contact with each other through their common counter-electrode 420. Accordingly, assembly 600 comprises a plurality of metal counter-electrodes 420. Each respective metal counter-electrode in the plurality of metal counter-electrodes joins together, lengthwise, elongated solar cells 402 in a corresponding solar cell pair in the plurality of solar cell pairs. As such, elongated solar cells 402 in a solar cell pair are electrically arranged in parallel, not series.

In some embodiments there is a first groove 677-1 and a second groove 677-2 that each runs lengthwise on opposing sides of solar cell 402. In FIG. 6A, some but not all grooves 677 are labeled. In some embodiments, the counter-electrode 420 of each pair of solar cells 402 is fitted between opposing grooves 677 in the solar cell pair in the manner illustrated in FIG. 6A. The present invention encompasses grooves 677 that have a broad range of depths and shape characteristics and is by no means limited to the shape of the grooves 677 illustrated in FIG. 6A. In general, any type of groove 677 that runs along the long axis of a first solar cell 402 in a solar cell pair and that can accommodate all or part of counter-electrode 420 in a pairwise fashion together with an opposing groove on the second solar cell 402 in the solar cell pair is within the scope of the present invention.

As illustrated in FIG. 6A, a transparent electrically insulating substrate 406 covers all or a portion of face 655 of the planar array of solar cells. In some embodiments, solar cells 402 touch substrate 406. In some embodiments, solar cells 402 do not touch substrate 406. In embodiments in which solar cells 402 do not touch substrate 406, a sealant such as ethyl vinyl acetate is used to seal substrate 406 onto solar cells 402.

FIG. 6B provides a cross-sectional view with respect to line 6B-6B of FIG. 6A. As can be seen in FIGS. 6A and 6B, each elongated solar cell 402 has a length that is great compared to the diameter of its cross-section. Typically each solar cell 402 has a rod-like shape (e.g., has a wire shape). Each solar cell pair is electrically connected to other solar cell pairs in series by arranging the solar cell pairs such that they do not touch each other, as illustrated in FIGS. 4A and 4B. The separation distance between solar cells pairs is any distance that prevents electrical contact between the cells. For instance, in some embodiments, the distance between adjacent solar cell pairs is 0.1 micron or greater, 0.5 microns or greater, or between 1 and 5 microns. Serial electrical contact between solar cell pairs is made by electrical contacts 690 that electrically connect the conductive cores 404 of each elongated solar cell in a one solar cell pair to the corresponding counter-electrode 120 of a different solar cell pair as illustrated in FIG. 6B. FIG. 6B further illustrates a cutaway of conductive core 404 and semiconductor junction 410 in one solar cell 402 to further illustrate the architecture of the solar cells.

Referring back to FIG. 6A, in some embodiments, solar cell assembly 600 further comprises a transparent insulating covering 422 disposed on face 633 of the planar array of solar cells 402, thereby encasing the plurality of elongated solar cells 402 between the transparent insulating covering 422 and the transparent electrically insulating substrate 406. In such embodiments, transparent insulating covering 422 and the transparent insulating substrate 406 are bonded together by a sealant such as ethyl vinyl acetate. Although not illustrated in FIG. 6A and 6B, in preferred embodiments, there is an intrinsic layer circumferentially disposed between the semiconductor junction 410 and TCO 412. In some embodiments, this intrinsic layer is formed by an undoped transparent oxide such as zinc oxide, metal oxide, or any transparent metal that is highly insulating.

Figure 9:
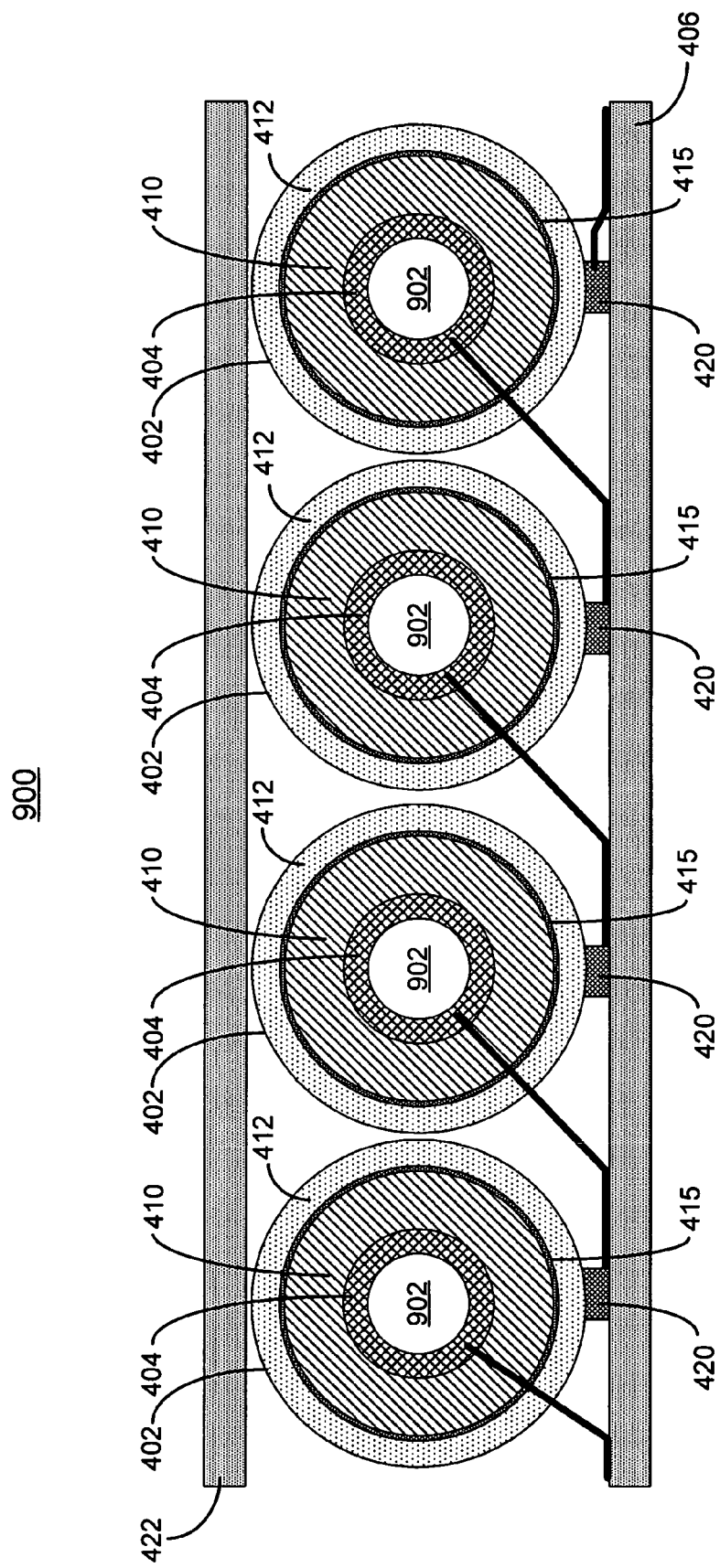
FIG. 9 is a cross-sectional view of elongated solar cells electrically arranged in series in a bifacial assembly in which the inner metal electrode is hollowed, in accordance with an embodiment of the present invention.

In some embodiments, the semiconductor junction 410 of solar cells 402 in assembly 600 comprise an inner coaxial layer and an outer coaxial layer, where the outer coaxial layer comprises a first conductivity type and the inner coaxial layer comprises a second, opposite, conductivity type. In some embodiments, the inner coaxial layer comprises copper-indium-gallium-diselenide (CIGS) and the outer coaxial layer comprises CdS, $SnO_2$, ZnO, $ZrO_2$, or doped ZnO. In some embodiments, conductive core 404 and/or electrical contacts 690 and/or counter-electrodes 420 are made of aluminum, molybdenum, steel, nickel, silver, gold, or an alloy thereof. In some embodiments, transparent conductive oxide layer 412 is made of tin oxide $SnO_x$, with or without fluorine doping, indium-tin oxide (ITO), indium-zinc oxide, doped zinc oxide (e.g., aluminum doped zinc oxide) or a combination thereof. In some embodiments, transparent insulating substrate 406 and transparent insulating covering 422 comprise glass or Tedlar. Although not shown in FIG. 6, in some embodiments, conductive core 404 is hollowed as depicted in FIG. 9.

Figure 6C:
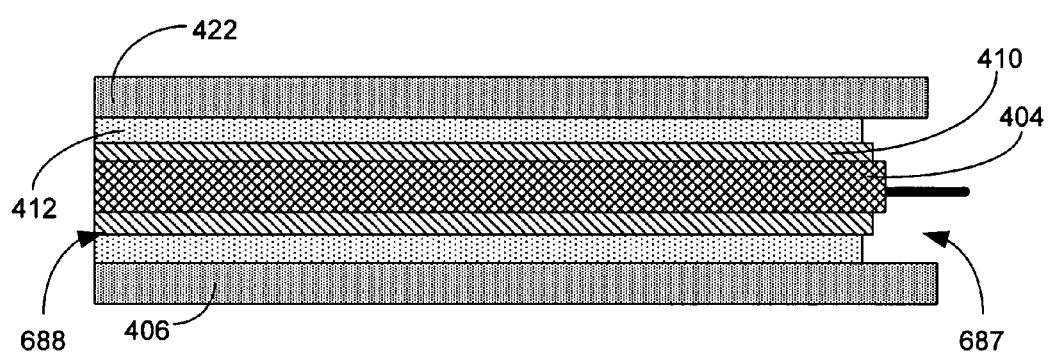
FIG. 6C is a cross-sectional view of an elongated solar cell taken about line 6C-6C of FIG. 6B, in accordance with an embodiment of the present invention.

FIG. 6C illustrates a cross-sectional view of an elongated solar 402 cell taken about line 6C-6C of FIG. 46. FIG. 6C illustrates how the various layers deposited on conductive core 404 are tapered at either end 687 or 688 (end 687 as illustrated in FIG. 6C). For instance, a terminal portion of conductive core 404 is exposed, as illustrated in FIG. 6C. In other words, semiconductor junction 410, an optional i-layer (not shown), and TCO 412 are stripped away from a terminal portion of conductive core 404 at an end of the solar cell. Furthermore, a terminal portion of semiconductor junction 410 is exposed as illustrated in FIG. 6C. That is, optional i-layer (not shown) and TCO 412 are stripped away from the terminal portion of semiconductor junction 410 at an end of the solar cell (end 687 in FIG. 6C). Such a configuration is advantageous because it prevents an electrical short from developing between TCO 412 and conductive core 404. In FIG. 6C, elongated solar cell 402 is positioned on electrically resistant transparent substrate 406. However, there is no requirement that elongated solar cell 402 make direct contact with electrically resistant transparent substrate 406. In fact, in some embodiments, elongated solar cells 402 are sealed between electrically resistant transparent substrate 406 and covering 422 in such a manner that they do not contact substrate 406 and covering 422. In such embodiments, elongated solar cells 402 are fixedly held in place by a sealant such as ethyl vinyl acetate.

In some embodiments, not all elongated solar cell pairs in assembly 600 are electrically arranged in series. For example, in some embodiments, two or more pairs of elongated solar cells are themselves paired such that all the elongated solar cells in the paired pairs are electrically arranged in parallel. This can be accomplished by joining the conductive core 404 of each of the solar cells by a common electrical contact (e.g., an electrically conducting wire, etc., not shown). To complete the parallel circuit, the TCO 412 of each of the elongated solar cell 402 are electrically joined together either by direct contact or by the use of a second electrical contact (not shown). The paired pairs of elongated solar cells are then electrically arranged in series. In some embodiments, three, four, five, six, seven, eight, nine, ten, eleven or more pairs of elongated solar cells are electrically arranged in parallel. These parallel groups of elongated solar cells 402 are then electrically arranged in series.

FIG. 7 illustrates solar cell assembly 700 in accordance with another embodiment of the present invention. Solar cell assembly 700 comprises a plurality of elongated solar cells 402. Each elongated solar cell 402 in the plurality of elongated solar cells has a conductive core 404 configured as a first electrode, a semiconductor junction 410 circumferentially disposed on the conductive core 402 and a transparent conductive oxide layer 412 disposed on the semiconductor junction 410. The plurality of elongated solar cells 402 are geometrically arranged in a parallel or a near parallel manner thereby forming a planar array having a first face (facing side 733 of assembly 700) and a second face (facing side 766 of assembly 700). The plurality of elongated solar cells is arranged such that one or more elongated solar cells in the plurality of elongated solar cells do not contact adjacent elongated solar cells. In preferred embodiments, the plurality of elongated solar cells is arranged such that each of the elongated solar cells in the plurality of elongated solar cells does not directly contact (through outer the TCO layer 412) adjacent elongated solar cells 402.

Figure 7A:
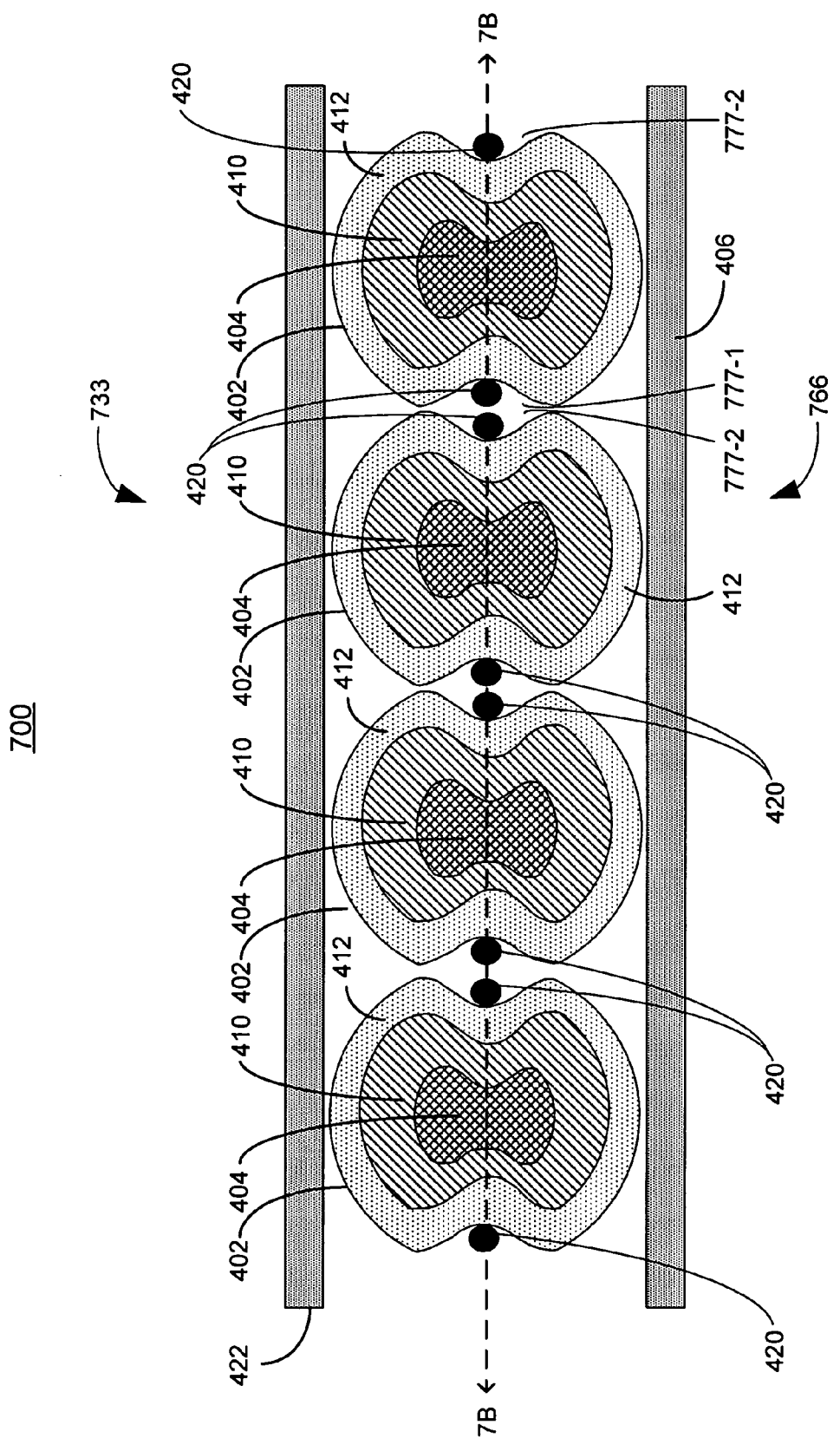
FIG. 7A is a cross-sectional view of elongated solar cells electrically arranged in series in a bifacial assembly where counter-electrodes abut individual solar cells, in accordance with another embodiment of the present invention.

In some embodiments there is a first groove 777-1 and a second groove 777-2 that each runs lengthwise on opposing sides of solar cell 402. In FIG. 7A, some but not all grooves 777 are labeled. In some embodiments, there is a counter-electrode 420 in one or both grooves of the solar cells. In the embodiment illustrated in FIG. 6A, there is a counter-electrode fitted lengthwise in both the first and second grooves of each solar cell in the plurality of solar cells. Such a configuration is advantageous because it reduces the pathlength of current drawn off of TCO 412. In other words, the maximum length that current must travel in TCO 412 before it reaches a counter-electrode 420 is a quarter of the circumference of the TCO. By contrast, in configurations where there is only a single counter-electrode 420 associated with a given solar cell 402, the maximum length that current must travel in TCO 412 before it reaches a counter-electrode 420 is a full half of the circumference of the TCO. The present invention encompasses grooves 777 that have a broad range of depths and shape characteristics and is by no means limited to the shape of the grooves 777 illustrated in FIG. 7A. In general, any groove shape 777 that runs along the long axis of a solar cell 402 and that can accommodate all or part of counter-electrode 420 is within the scope of the present invention. For example, in some embodiments not illustrated by FIG. 7A, each groove 777 is patterned so that there is a tight fit between the contours of the groove 777 and the counter-electrode 420.

As illustrated in FIG. 7A, there are a plurality of metal counter-electrodes 420, and each respective elongated solar cell 402 in the plurality of elongated solar cells is bound to at least a first corresponding metal counter-electrode 420 in the plurality of metal counter-electrodes such that the first metal counter-electrode lies in a groove 777 that runs lengthwise along the respective elongated solar cell. Furthermore, in the solar cell assembly illustrated in FIG. 7A, each respective elongated solar cell 402 is bound to a second corresponding metal counter-electrode 420 such that the second metal counter-electrode lies in a second groove 777 that runs lengthwise along the respective elongated solar cell 402. As further illustrated in FIG. 7A, the first groove 777 and the second groove 777 are on opposite or substantially opposite sides of the respective elongated solar cell 402 and run along the long axis of the cell.

Further illustrated in FIG. 7A, is a transparent electrically insulating substrate 406 that covers all or a portion of face 766 of the planar array. The plurality of elongated solar cells 402 are configured to receive direct light from both face 733 and face 766 of the planar array. Solar cell assembly 700 further comprises a transparent insulating covering 422 disposed on face 733 of the planar array, thereby encasing the plurality of elongated solar cells 402 between the transparent insulating covering 422 and the transparent electrically insulating substrate 406.

Figure 7B:
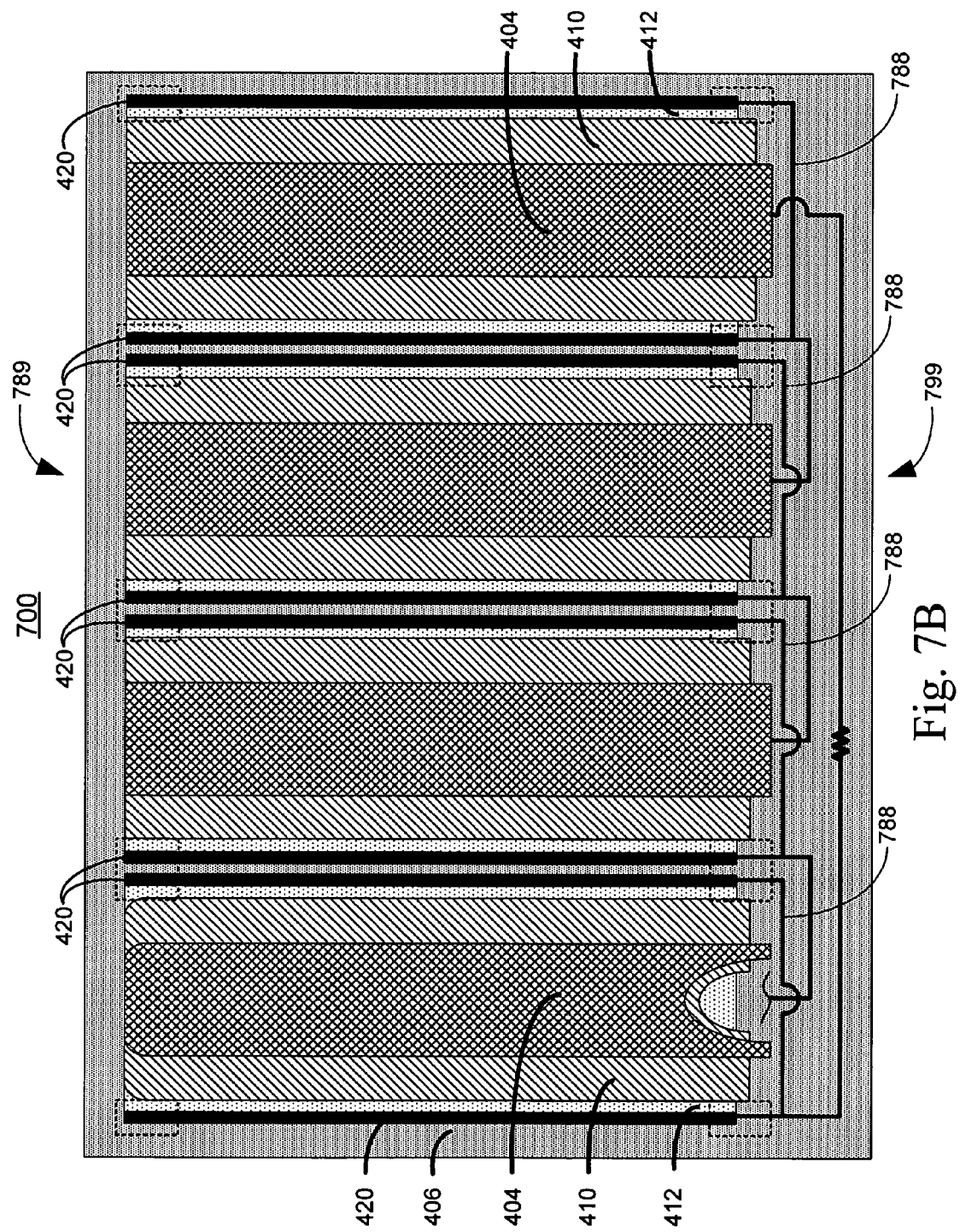
FIG. 7B is a cross-sectional view taken about line 7B-7B of FIG. 7A that depicts the serial arrangement of tubular solar cells in a bifacial assembly in accordance with an embodiment of the present invention.

FIG. 7B provides a cross-sectional view with respect to line 7B-7B of FIG. 7A. Solar cell 402 are electrically connected to other in series by arranging the solar cells such that they do not touch each other, as illustrated in FIGS. 7A and 7B and by the use of electrical contacts as described below in conjunction with FIG. 7B. The separation distance between solar cells 402 is any distance that prevents electrical contact between the TCO layers 412 of individual cells 402. For instance, in some embodiments, the distance between adjacent solar cells is 0.1 micron or greater, 0.5 microns or greater, or between 1 and 5 microns.

Referring to FIG. 7B, serial electrical contact between solar cells 402 is made by electrical contacts 788 that electrically connect the metal conductive core 404 of one elongated solar cell 402 to the corresponding counter-electrodes 120 of a different solar cell 402 as illustrated in FIG. 7B. FIG. 7B further illustrates a cutaway of metal conductive core 404 and semiconductor junction 410 in one solar cell 402 to further illustrate the architecture of the solar cells 402.

The solar cell assembly illustrated in FIG. 7 has several advantages. First, because of the positioning of counter-electrodes 420 and the transparency of both substrate 406 and covering 422, there is almost zero percent shading in the assembly. For instance, the assembly can receive direct sunlight from both face 733 and face 766. Second, in embodiments where a sealant such as ethyl vinyl acetate (EVA) is used to laminate substrate 406 and covering 422 onto the plurality of solar cells, the structure is completely self-supporting. Still another advantage of the assembly is that is easy to manufacture. Unlike solar cells such as that depicted in FIG. 3A, no complicated grid or transparent conductive oxide on glass is needed. For example, to assemble a solar cell 402 and its corresponding counter-electrodes 420 together to complete the circuit illustrated in FIG. 7A, counter-electrode 420, when it is in the form of a wire, can be covered with conductive epoxy and dropped in the groove 777 of solar cell 402 and allowed to cure.

As illustrated in FIG. 7B, conductive core 404, junction 410, and TCO 412 are flush with each other at end 789 of elongated solar cells 402. In contrast, at end 799 conductive core protrudes a bit with respect to junction 410 and TCO 412 as illustrated. Junction 410 also protrudes a bit at end 799 with respect to TCO 412. The protrusion of conductive core 404 at end 799 means that the sides of a terminal portion of the conductive core 404 are exposed (e.g., not covered by junction 410 and TCO 412). The purpose of this configuration is to reduce the chances of shorting counter-electrode 420 (or the epoxy used to mount the counter-electrode in groove 777) with TCO 412. In some embodiments, all or a portion of the exposed surface area of counter-electrodes 420 are shielded with an electrically insulating material in order to reduce the chances of electrical shortening. For example, in some embodiments, the exposed surface area of counter-electrodes 420 in the boxed regions of FIG. 7B is shielded with an electrically insulating material.

Still another advantage of the assembly illustrated in FIG. 7 is that the counter-electrode 420 can have much higher conductivity without shadowing. In other words, counter-electrode 420 can have a substantial cross-sectional size (e.g., 1 mm in diameter when solar cell 402 has a 6 mm diameter). Thus, counter-electrode 420 can carry a significant amount of current so that the wires can be as long as possible, thus enabling the fabrication of larger panels.

The series connections between solar cells 402 can be between pairs of solar cells 402 in the manner depicted in FIG. 7B. However, the invention is not so limited. In some embodiments, two or more solar cells 402 are grouped together (e.g., electrically connected in a parallel fashion) to form a group of solar cells and then such groups of solar cells are serially connected to each other. Therefore, the serial connections between solar cells can be between groups of solar cells where such groups have any number of solar cells 402 (e.g., 2, 3, 4, 5, 6, etc.). However, FIG. 7B illustrates a preferred embodiment in which each contact 788 serially connects only a pair of solar cells 402.

In some embodiments, there is a series insulator that runs lengthwise between each solar cell 402. In one example, this series insulator is a 0.001" thick sheet of transparent insulating plastic. In other examples this series insulator is a sheet of transparent insulating plastic having a thickness between 0.001" and 0.005". Alternatively, a round insulating clear plastic separator that runs lengthwise between solar cells 402 can be used to electrically isolate the solar cells 402. Advantageously, any light that does enter the small gap between solar cells 402 will be trapped and collected in the "double-divot" area formed by facing grooves 777 of adjacent solar cells 402.

Yet another embodiment of solar cell assembly 700 is that there is no extra absorption loss from a TCO or a metal grid on one side of the assembly. Further, assembly 700 has the same performance or absorber area exposed on both sides 733 and 766. This makes assembly 700 symmetrical.

Still another advantage of assembly 700 is that all electrical contacts 788 end at the same level (e.g., in the plane of line 7B-7B of FIG. 7A). As such, they are easier to connect and weld with very little substrate area wasted at the end. This simplifies construction of the solar cells 402 while at the same time serves to increase the overall efficiency of solar cell assembly 700. This increase in efficiency arises because the welds can be smaller. Smaller welds take up less of the electrically resistant transparent substrate 406 surface area that is otherwise occupied by solar cells 402.

Although not illustrated in FIG. 7, in some embodiments in accordance with FIG. 7, there is an intrinsic layer circumferentially disposed between the semiconductor junction 410 and the transparent conductive oxide 412 in an elongated solar cell 402 in the plurality of elongated solar cells 402. This intrinsic layer can be made of an undoped transparent oxide such as zinc oxide, metal oxide, or any transparent metal that is highly insulating. In some embodiments, the semiconductor junction 410 of solar cells 402 in assembly 700 comprise an inner coaxial layer and an outer coaxial layer where the outer coaxial layer comprises a first conductivity type and the inner coaxial layer comprises a second, opposite, conductivity type. In an exemplary embodiment the inner coaxial layer comprises copper-indium-gallium-diselenide (CIGS) whereas the outer coaxial layer comprises CdS, $SnO_2$, ZnO, $ZrO_2$, or doped ZnO. In some embodiments not illustrated by FIG. 7, the conductive cores 404 in solar cells 402 are hollowed.

Figure 8:
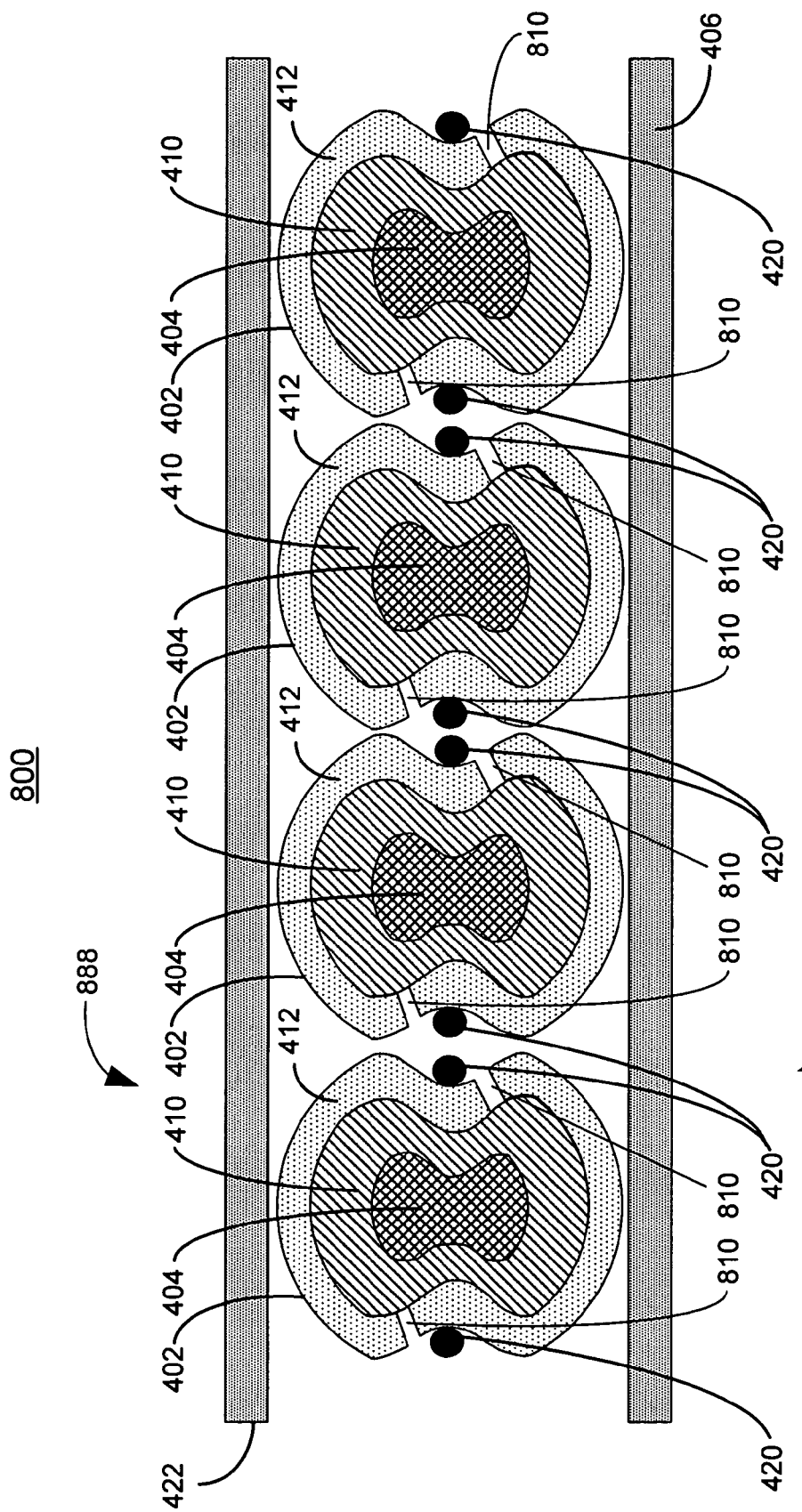
FIG. 8 is a cross-sectional view of elongated solar cells electrically arranged in series in a bifacial assembly where counter-electrodes abut individual solar cells and the outer TCO is cut, in accordance with another embodiment of the present invention.

FIG. 8 illustrates a solar cell assembly 800 of the present invention that is identical to solar cell assembly 700 of the present invention with the exception that TCO 412 is interrupted by breaks 810 that run along the long axis of solar cells 402 and cut completely through TCO 412. In the embodiment illustrated in FIG. 8, there are two breaks 810 that run the length of solar cell 402. The effect of such breaks 810 is that they electrically isolate the two counter-electrodes 420 associated with each solar cell 402 in solar cell assembly 800. There are many ways in which breaks 800 can be made. For example, a laser or an HCl etch can be used.

In some embodiments, not all elongated solar cells 402 in assembly 800 are electrically arranged in series. For example, in some embodiments, there are pairs of elongated solar cells 402 that are electrically arranged in parallel. A first and second elongated solar cell can be electrically connected in parallel, and are thereby paired, by using a first electrical contact (e.g., an electrically conducting wire, etc., not shown) that joins the conductive core 404 of a first elongated solar cell to the second elongated solar cell. To complete the parallel circuit, the TCO 412 of the first elongated solar cell 402 is electrically connected to the TCO 412 of the second elongated solar cell 402 either by contacting the TCOs of the two elongated solar cells either directly or through a second electrical contact (not shown). The pairs of elongated solar cells are then electrically arranged in series. In some embodiments, three, four, five, six, seven, eight, nine, ten, eleven or more elongated solar cells 402 are electrically arranged in parallel. These parallel groups of elongated solar cells 402 are then electrically arranged in series.

FIG. 9 illustrates a solar cell assembly 900 of the present invention in which conductive cores 402 are hollowed. In fact, conductive cores 402 can be hollowed in any of the embodiments of the present invention. One advantage of such a hollowed core 402 design is that it reduces the overall weight of the solar cell assembly. Core 402 is hollowed when there is a channel that extends lengthwise through all or a portion of core 402. In some embodiments, conductive core 402 is metal tubing.

In some embodiments, not all elongated solar cells 402 in assembly 900 are electrically arranged in series. For example, in some embodiments, there are pairs of elongated solar cells 402 that are electrically arranged in parallel. A first and second elongated solar cell can be electrically connected in parallel, and are thereby paired, by using a first electrical contact (e.g., an electrically conducting wire, etc., not shown) that joins the conductive core 404 of a first elongated solar cell to the second elongated solar cell. To complete the parallel circuit, the TCO 412 of the first elongated solar cell 402 is electrically connected to the TCO 412 of the second elongated solar cell 402 either by contacting the TCOs of the two elongated solar cells either directly or through a second electrical contact (not shown). The pairs of elongated solar cells are then electrically arranged in series. In some embodiments, three, four, five, six, seven, eight, nine, ten, eleven or more elongated solar cells 402 are electrically arranged in parallel. These parallel groups of elongated solar cells 402 are then electrically arranged in series.

Figure 10:
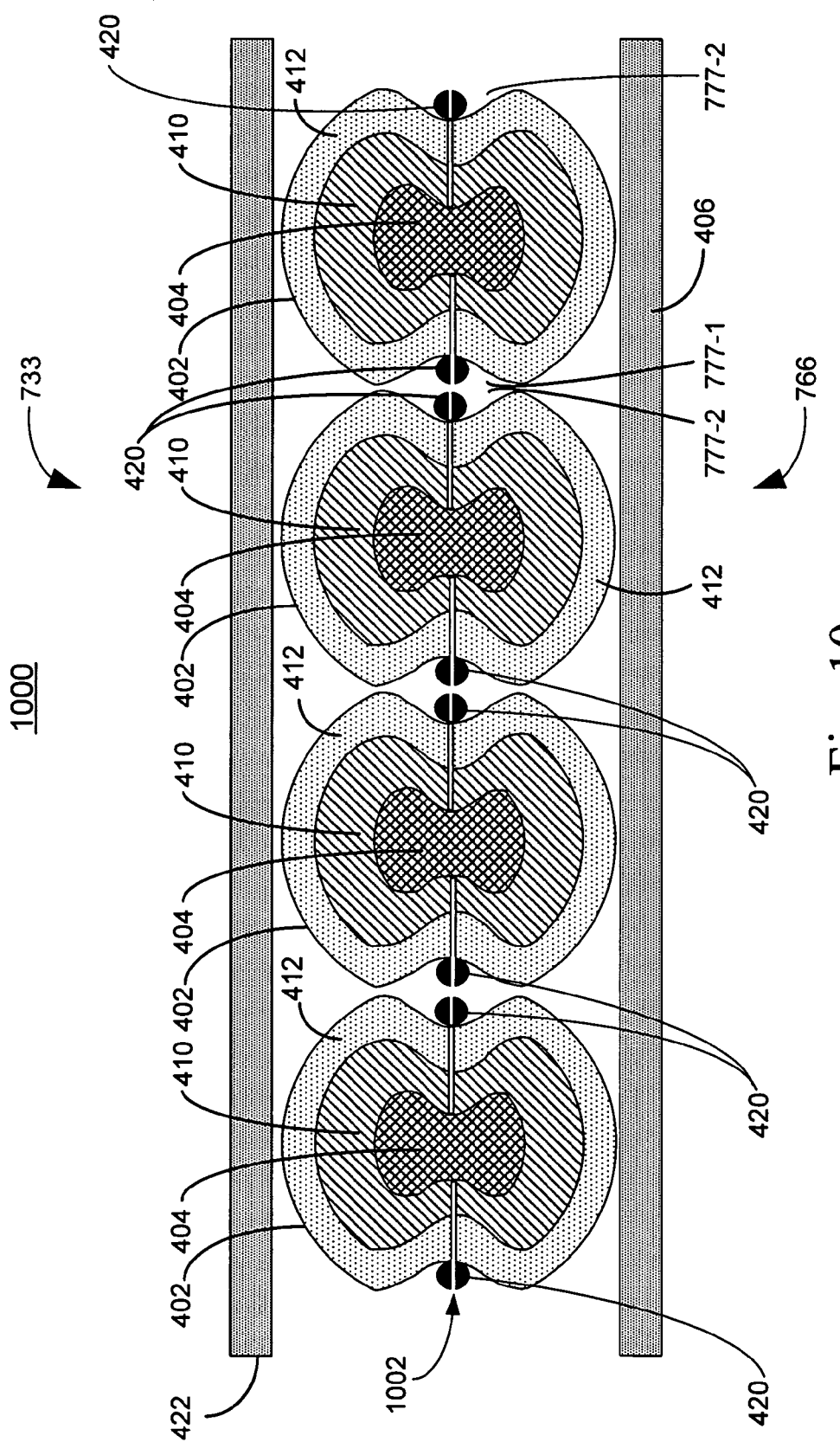
FIG. 10 is a cross-sectional view of elongated solar cells electrically arranged in series in a bifacial assembly in which a groove pierces the counter-electrodes, transparent conducting oxide layer, and junction layers of the solar cells, in accordance with an embodiment of the present invention.

FIG. 10 illustrates a solar cell assembly 1000 of the present invention in which counter-electrodes 420, TCOs 412, and junctions 410 are pierced, in the manner illustrated, in order to form two discrete junctions in parallel.

5.2 Exemplary Semiconductor Junctions

Figure 5A:
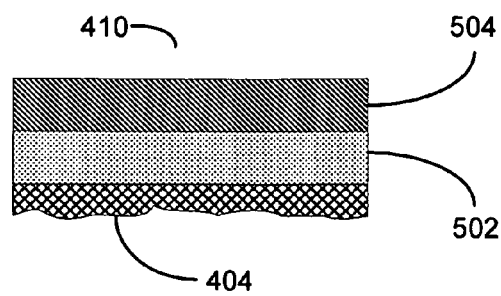
FIGS. 5A-5D depict semiconductor junctions that are used in various elongated solar cells in various embodiments of the present invention.

Referring to FIG. 5A, in one embodiment, semiconductor junction 410 is a heterojunction between an absorber layer 502, disposed on conductive core 404, and a junction partner layer 504, disposed on absorber layer 502. Layers 502 and 504 are composed of different semiconductors with different band gaps and electron affinities such that junction partner layer 504 has a larger band gap than absorber layer 502. In some embodiments, absorber layer 502 is p-doped and junction partner layer 504 is n-doped. In such embodiments, TCO layer 412 is $n^+$-doped. In alternative embodiments, absorber layer 502 is n-doped and junction partner layer 504 is p-doped. In such embodiments, TCO layer 412 is $p^+$-doped. In some embodiments, the semiconductors listed in Pandey, *Handbook of Semiconductor Electrodeposition*, Marcel Dekker Inc., 1996, Appendix 5, hereby incorporated by reference in its entirety, are used to form semiconductor junction 410.

5.2.1 Thin-film Semiconductor Junctions Based on Copper Indium Diselenide and Other Type I-III-VI Materials Continuing to refer to FIG. 5A, in some embodiments, absorber layer 502 is a group I-III-$VI_2$ compound such as copper indium di-selenide ($CuInSe_2$; also known as CIS). In some embodiments, absorber layer 502 is a group I-III-$VI_2$ ternary compound selected from the group consisting of $CdGeAs_2$, $ZnSnAs_2$, $CuInTe_2$, $AgInTe_2$, $CuInSe_2$, $CuGaTe_2$, $ZnGeAs_2$, $CdSnP_2$, $AgInSe_2$, $AgGaTe_2$, $CuInS_2$, $CdSiAs_2$, $ZnSnP_2$, $CdGeP_2$, $ZnSnAs_2$, $CuGaSe_2$, $AgGaSe_2$, $AgInS_2$, $ZnGeP_2$, $ZnSiAs_2$, $ZnSiP_2$, $CdSiP_2$, or $CuGaS_2$ of either the p-type or the n-type when such compound is known to exist.

In some embodiments, junction partner layer 504 is CdS, ZnS, ZnSe, or CdZnS. In one embodiment, absorber layer 502 is p-type CIS and junction partner layer 504 is n-type CdS, ZnS, ZnSe, or CdZnS. Such semiconductor junctions 410 are described in Chapter 6 of Bube, *Photovoltaic Materials*, 1998, Imperial College Press, London, which is hereby incorporated by reference in its entirety. Such semiconductor junctions 410 are described in Chapter 6 of Bube, *Photovoltaic Materials*, 1998, Imperial College Press, London, which is hereby incorporated by reference in its entirety.

In some embodiments, absorber layer 502 is copper-indium-gallium-diselenide (CIGS). Such a layer is also known as $Cu(InGa)Se_2$. In some embodiments, absorber layer 502 is copper-indium-gallium-diselenide (CIGS) and junction partner layer 504 is CdS, ZnS, ZnSe, or CdZnS. In some embodiments, absorber layer 502 is p-type CIGS and junction partner layer 504 is n-type CdS, ZnS, ZnSe, or CdZnS. Such semiconductor junctions 410 are described in Chapter 13 of *Handbook of Photovoltaic Science and Engineering*, 2003, Luque and Hegedus (eds.), Wiley & Sons, West Sussex, England, Chapter 12, which is hereby incorporated by reference in its entirety.

Figure 5B:
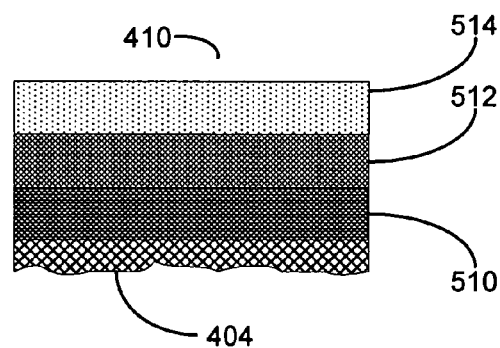
Figure 5C:
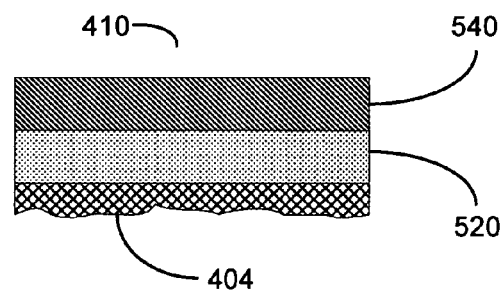
Figure 5D:
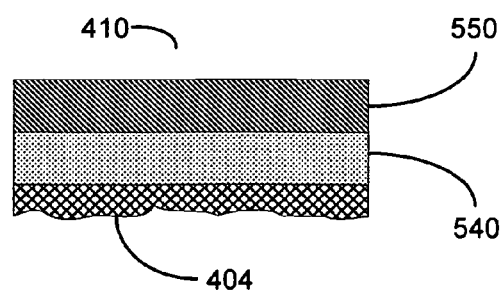

5.2.2 Semiconductor Junctions Based on Amorphous Silicon or Polycrystalline Silicon In some embodiments, referring to FIG. 5B, semiconductor junction 410 comprises amorphous silicon. In some embodiments this is an n/n type heterojunction. For example, in some embodiments, layer 514 comprises $SnO_2(Sb)$, layer 512 comprises undoped amorphous silicon, and layer 510 comprises n+ doped amorphous silicon.

In some embodiments, semiconductor junction 410 is a p-i-n type junction. For example, in some embodiments, layer 514 is $p^+$ doped amorphous silicon, layer 512 is undoped amorphous silicon, and layer 510 is $n^+$ amorphous silicon. Such semiconductor junctions 410 are described in Chapter 3 of Bube, *Photovoltaic Materials*, 1998, Imperial College Press, London, which is hereby incorporated by reference in its entirety.

In some embodiments of the present invention, semiconductor junction 410 is based upon thin-film polycrystalline. Referring to FIG. 5B, in one example in accordance with such embodiments, layer 510 is a p-doped polycrystalline silicon, layer 512 is depleted polycrystalline silicon and layer 514 is n-doped polycrystalline silicon. Such semiconductor junctions are described in Green, *Silicon Solar Cells: Advanced Principles & Practice*, Centre for Photovoltaic Devices and Systems, University of New South Wales, Sydney, 1995; and Bube, *Photovoltaic Materials*, 1998, Imperial College Press, London, pp. 57-66, which is hereby incorporated by reference in its entirety.

In some embodiments of the present invention, semiconductor junctions 410 based upon p-type microcrystalline Si:H and microcrystalline Si:C:H in an amorphous Si:H solar cell are used. Such semiconductor junctions are described in Bube, *Photovoltaic Materials*, 1998, Imperial College Press, London, pp. 66-67, and the references cited therein, which is hereby incorporated by reference in its entirety.

5.2.3 Semiconductor Junctions Based on Gallium Arsenide and Other Type III-V Materials In some embodiments, semiconductor junctions 410 are based upon gallium arsenide (GaAs) or other III-V materials such as InP, AlSb, and CdTe. GaAs is a direct-band gap material having a band gap of 1.43 eV and can absorb 97% of AM1 radiation in a thickness of about two microns. Suitable type III-V junctions that can serve as semiconductor junctions 410 of the present invention are described in Chapter 4 of Bube, *Photovoltaic Materials*, 1998, Imperial College Press, London, which is hereby incorporated by reference in its entirety.

Furthermore, in some embodiments semiconductor junction 410 is a hybrid multijunction solars cells such as a GaAs/Si mechanically stacked multijunction as described by Gee and Virshup, 1988, 20$^{th}$ *IEEE Photovoltaic Specialist Conference*, IEEE Publishing, New York, p. 754, which is hereby incorporated by reference in its entirety, a GaAs/CuInSe$_2$ MSMJ four-terminal device, consisting of a GaAs thin film top cell and a ZnCdS/CuInSe$_2$ thin bottom cell described by Stanbery et al., 19$^{th}$ *IEEE Photovoltaic Specialist Conference*, IEEE Publishing, New York, p. 280, and Kim et al., 20$^{th}$ *IEEE Photovoltaic Specialist Conference*, IEEE Publishing, New York, p. 1487, each of which is hereby incorporated by reference in its entirety. Other hybrid multijunction solar cells are described in Bube, *Photovoltaic Materials*, 1998, Imperial College Press, London, pp. 131-132, which is hereby incorporated by reference in its entirety.

5.2.4 Semiconductor Junctions Based on Cadmium Telluride and Other Type II-VI Materials In some embodiments, semiconductor junctions 410 are based upon II-VI compounds that can be prepared in either the n-type or the p-type form. Accordingly, in some embodiments, referring to FIG. 5C, semiconductor junction 410 is a p-n heterojunction in which layers 520 and 540 are any combination set forth in the following table or alloys thereof.

| Layer 520 | Layer 540 |
|---|---|
| n-CdSe | p-CdTe |
| n-ZnCdS | p-CdTe |
| n-ZnSSe | p-CdTe |
| p-ZnTe | n-CdSe |
| n-CdS | p-CdTe |
| n-CdS | p-ZnTe |
| p-ZnTe | n-CdTe |
| n-ZnSe | p-CdTe |
| n-ZnSe | p-ZnTe |
| n-ZnS | p-CdTe |
| n-ZnS | p-ZnTe |

Methods for manufacturing semiconductor junctions 410 are based upon II-VI compounds are described in Chapter 4 of Bube, *Photovoltaic Materials*, 1998, Imperial College Press, London, which is hereby incorporated by reference in its entirety.

5.2.5 Semiconductor Junctions Based on Crystalline Silicon

While semiconductor junctions 410 that are made from thin semiconductor films are preferred, the invention is not so limited. In some embodiments semiconductor junctions 410 is based upon crystalline silicon. For example, referring to FIG. 5D, in some embodiments, semiconductor junction 410 comprises a layer of p-type crystalline silicon 540 and a layer of n-type crystalline silicon 550. Methods for manufacturing crystalline silicon semiconductor junctions 410 are described in Chapter 2 of Bube, *Photovoltaic Materials*, 1998, Imperial College Press, London, which is hereby incorporated by reference in its entirety.

5.3 Albedo Embodiments

The solar cell assemblies of the present invention are advantageous because they can collect light through either of their two faces. Accordingly, in some embodiments of the present invention, theses bifacial solar cell assemblies (e.g., solar cell assembly 400, 600, 700, 800, 900, etc.) are arranged in a reflective environment in which surfaces around the solar cell assembly have some amount of albedo. Albedo is a measure of reflectivity of a surface or body. It is the ratio of electromagnetic radiation (EM radiation) reflected to the amount incident upon it. This fraction is usually expressed as a percentage from 0% to 100%. In some embodiments, surfaces in the vicinity of the solar cell assemblies of the present invention are prepared so that they have a high albedo by painting such surfaces a reflective white color. In some embodiments, other materials that have a high albedo can be used. For example, the albedo of some materials around such solar cells approach or exceed ninety percent. See, for example, Boer, 1977, Solar Energy 19, 525, which is hereby incorporated by reference in its entirety. However, surfaces having any amount of albedo (e.g., five percent or more, ten percent or more, twenty percent or more) are within the scope of the present invention. In one embodiment, the solar cells assemblies of the present invention are arranged in rows above a gravel surface, where the gravel has been painted white in order to improve the reflective properties of the gravel. In general, any Lambertian or diffuse reflector surface can be used to provide a high albedo surface.

In some embodiments, the bifacial solar cell assemblies of the present invention are placed in a manner such that one surface (e.g., face 633 of solar cell assembly 600) is illuminated in a way similar to a conventional flat-panel solar cell panel. For example, it is installed facing South (in the northern hemisphere) with an angle of inclination that is latitude dependent (e.g., in general is not very different from the latitude). The opposing surface of the bifacial solar cell assembly (e.g., face 655 of solar cell assembly 600) of the present invention receives a substantial amount of diffuse light reflected from the ground and neighboring walls in the vicinity of the solar cell assembly.

By way of example, in some embodiments of the present invention, the bifacial solar cell assemblies (panels) of the present invention have a first and second face and are placed in rows facing South in the Northern hemisphere (or facing North in the Southern hemisphere). Each of the panels is placed some distance above the ground (e.g., 100 cm above the ground). The East-West separation between the panels is somewhat dependent upon the overall dimensions of the panels. By way of illustration only, panels having overall dimensions of about 106 cm×44 cm are placed in the rows such that the East-West separation between the panels is between 10 cm and 50 cm. In one specific example the East-West separation between the panels is 25 cm.

In some embodiments, the central point of the panels in the rows of panels is between 0.5 meters and 2.5 meters from the ground. In one specific example, the central point of the panels is 1.55 meters from the ground. The North-South separation between the rows of panels is dependent on the dimensions of the panels. By way of illustration, in one specific example, in which the panels have overall dimensions of about 106 cm×44 cm, the North-South separation is 2.8 meters. In some embodiments, the North-South separation is between 0.5 meters and 5 meters. In some embodiments, the North-South separation is between 1 meter and 3 meters.

In some embodiments of the present invention, the panels in the rows are each tilted with respect to the ground in order to maximize the total amount of light received by the panels. There is some tradeoff between increasing the amount of light received by one face versus the amount of light received on the opposing face as a function of tilt angle. However, at certain tilt angles, the total amount of light received by the panels, where total amount of light is defined as the sum of direct light received on the first and second face of the bifacial panel, is maximized. In some embodiments, the panels in the rows of panels are each tilted between five degrees and forty-five degrees from the horizontal. In some embodiments, the panels of the present invention are tilted between fifteen degrees and forty degrees from the horizontal. In some embodiments, the panels of the present invention are tilted between twenty-five degrees and thirty-five degrees from the horizontal. In one specific embodiment, the panels of the present invention are tilted thirty degrees from the horizontal.

In some embodiments, models for computing the amount of sunlight received by solar panels as put forth in Lorenzo et al., 1985, Solar Cells 13, pp. 277-292, which is hereby incorporated by reference in its entirety, are used to compute the optimum horizontal tilt and East-West separation of the solar panels in the rows of solar panels that are placed in a reflective environment.

5.4 Dual Layer Core Embodiments

Embodiments of the present invention in which conductive core 404 of the solar cells 402 of the present invention is made of a uniform conductive material have been disclosed. The invention is not limited to these embodiments. In some embodiments, conductive core 404 in fact has an inner core and an outer conductive core. The outer conductive core is circumferentially disposed on the inner core. In such embodiments, the inner core is typically nonconductive whereas the outer core is conductive. The inner core has an elongated shape consistent with other embodiments of the present invention. For instance, in one embodiment, the inner core is made of glass fibers in the form of a wire. In some embodiments, the inner core is an electrically conductive nonmetallic material. However, the present invention is not limited to embodiments in which the inner core is electrically conductive because the outer core can function as the electrode. In some embodiments, the inner core is tubing (e.g., plastic tubing).

In some embodiments, the inner is mad of a material such as polybnezamidazole (e.g., Celazole®, available from Boedeker Plastics, Inc., Shiner, Tex.). In some embodiments, the inner core is made of polymied (e.g., DuPont™ Vespel®, or DuPont™ Kapton®, Wilmington, Del.). In some embodiments, the inner core is made of polytetrafluoroetheylene (PTFE) or polyehteretherketone (PEEK), each of which is available from Boedeker Plastics, Inc. In some embodiments, the inner core is made polyamide-imide (e,g,. Torlon® PAI, Solvay Advanced Polymers, Alpharetta, Ga.).

In some embodiments, the inner core is made of a glass-based phenolic. Phenolic laminates are made by applying heat and pressure to layers of paper, canvas, linen or glass cloth impregnated with synthetic thermosetting resins. When heat and pressure are applied to the layers, a chemical reaction (polymerization) transforms the separate layers into a single laminated material with a "set" shape that cannot be softened again. Therefore, these materials are called "thermosets." A variety of resin types and cloth materials can be used to manufacture thermoset laminates with a range of mechanical, thermal, and electrical properties. In some embodiments, the inner core is a phenoloic laminate having a NEMA grade of G-3, G-5, G-7, G-9, G-10 or G-11. Exemplary phenolic laminates are available from Boedeker Plastics, Inc.

In some embodiments, the inner core is made of polystyrene. Examples of polystyrene include general purpose polystyrene and high impact polystyrene as detailed in Marks' *Standard Handbook for Mechanical Engineers*, ninth edition, 1987, McGraw-Hill, Inc., p. 6-174, which is hereby incorporated by reference in its entirety. In still other embodiments, inner core is made of cross-linked polystyrene. One example of cross-linked polystyrene is Rexolite® (available from San Diego Plastics Inc., National City, Calif.). Rexolite is a thermoset, in particular a rigid and translucent plastic produced by cross linking polystyrene with divinylbenzene.

In some embodiments, the inner core is a polyester wire (e.g., a Mylar® wire). Mylar® is available from DuPont Teijin Films (Wilmington, Del.). In still other embodiments, the inner core is made of Durastone®, which is made by using polyester, vinylester, epoxid and modified epoxy resins combined with glass fibers (Roechling Engineering Plastic Pte Ltd. (Singapore).

In still other embodiments, the inner core is made of polycarbonate. Such polycarbonates can have varying amounts of glass fibers (e.g., 10%, 20%, 30%, or 40%) in order to adjust tensile strength, stiffness, compressive strength, as well as the thermal expansion coefficient of the material. Exemplary polycarbonates are Zelux® M and Zelux® W, which are available from Boedeker Plastics, Inc.

In some embodiments, the inner core is made of polyethylene. In some embodiments, inner core made of low density polyethylene (LDPE), high density polyethylene (HDPE), or ultra high molecular weight polytheylene (UHMW PE). Chemical properties of HDPE are described in Marks' *Standard Handbook for Mechanical Engineers*, ninth edition, 1987, McGraw-Hill, Inc., p. 6-173, which is hereby incorporated by reference in its entirety. In some embodiments, the inner core is made of acrylonitrile-butadiene-styrene, polytetrfluoro-ethylene (Teflon), polymethacrylate (lucite or plexiglass), nylon 6,6, cellulose acetate butyrate, cellulose acetate, rigid vinyl, plasticized vinyl, or polypropylene. Chemical properties of these materials are descibed in Marks' *Standard Handbook for Mechanical Engineers*, ninth edition, 1987, McGraw-Hill, Inc., pp. 6-172 through 6-175, which is hereby incorporated by reference in its entirety.

Additional exemplary materials that can be used to form the inner core are found in *Modern Plastics Encyclopedia*, McGraw-Hill; Reinhold Plastics Applications Series, Reinhold Roff, *Fibres, Plastics and Rubbers*, Butterworth; Lee and Neville, *Epoxy Resins*, McGraw-Hill; Bilmetyer, *Textbook of Polymer Science*, Interscience; Schmidt and Marlies, *Principles of high polymer theory and practice*, McGraw-Hill; Beadle (ed.), *Plastics*, Morgan-Grampiand, Ltd., 2 vols. 1970; Tobolsky and Mark (eds.), *Polymer Science and Materials*, Wiley, 1971; Glanville, *The Plastics's Engineer's Data Book*, Industrial Press, 1971; Mohr (editor and senior author), Oleesky, Shook, and Meyers, *SPI Handbook of Technology and Engineering of Reinforced Plastics Composites*, Van Nostrand Reinhold, 1973, each of which is hereby incorporated by reference in its entirety.

In general, outer core is made out of any material that can support the photovoltaic current generated by solar cell with negligible resistive losses. In some embodiments, outer core is made of any conductive metal, such as aluminum, molybdenum, steel, nickel, silver, gold, or an alloy thereof. In some embodiments, outer core is made out of a metal-, graphite-, carbon black-, or superconductive carbon black-filled oxide, epoxy, glass, or plastic. In some embodiments, outer core is made of a conductive plastic. In some embodiments, this conductive plastic is inherently conductive without any requirement for a filler. In some embodiments inner core is made out of a conductive material and outer core is made out of molybdenum.

In embodiments where an inner core and an outer core is present, semiconductor junction 410 and TCO 412 are stripped from the inner core at a terminal end of the solar cell where an electrical contact serially joins the solar cell to another solar cell. For example, in some embodiments, the semiconductor junction 410 and TCO are stripped in the manner illustrated in FIGS. 4D, 4F, 6B, 6C, and 7B.

5.5 Exemplary Dimensions

The present invention encompasses solar cell assemblies having any dimensions that fall within a broad range of dimensions. For example, referring to FIG. 4B, the present invention encompasses solar cell assemblies having a length l between 1 cm and 50,000 cm and a width w between 1 cm and 50,000 cm. In some embodiments, the solar cell assemblies have a length l between 10 cm and 1,000 cm and a width w between 10 cm and 1,000 cm. In some embodiments, the solar cell assemblies have a length l between 40 cm and 500 cm and a width w between 40 cm and 500 cm.

5.6 Solar Cells Manufactured Using a Roll Method or Having an Inner TCO

In some embodiments, copper-indium-gallium-diselenide ($Cu(InGa)Se_2$), referred to herein as CIGS, is used to make the absorber layer of junction 110. In such embodiments, conductive core 404 can be made of molybdenum. In some embodiments, core 404 comprises an inner core of polyimide and an outer core that is a thin film of molybdenum sputtered onto the polyimide core prior to CIGS deposition. On top of the molybdenum, the CIGS film, which absorbs the light, is evaporated. Cadmium sulfide (CdS) is then deposited on the CIGS in order to complete semiconductor junction 410. Optionally, a thin intrinsic layer (i-layer) is then deposited on the semiconductor junction 410. The i-layer can be formed using a material including but not limited to, zinc oxide, metal oxide or any transparent material that is highly insulating. Next, the TCO 412 is disposed on either the i-layer (when present) or the semiconductor junction 410 (when the i-layer is not present). The TCO can be made of a material such as aluminum doped zinc oxide (ZnO:Al), indium-zinc oxide, or indium-tin oxide.

ITN Energy Systems, Inc., Global Solar Energy, Inc., and the Institute of Energy Conversion (IEC), have collaboratively developed technology for manufacturing CIGS photovoltaics on polyimide substrates using a roll-to-roll co-evaporation process for deposition of the CIGS layer. In this process, a roll of molybdenum-coated polyimide film (referred to as the web) is unrolled and moved continuously into and through one or more deposition zones. In the deposition zones, the web is heated to temperatures of up to ~450° C. and copper, indium, and gallium are evaporated onto it in the presence of selenium vapor. After passing out of the deposition zone(s), the web cools and is wound onto a take-up spool. See, for example, 2003, Jensen et al., "Back Contact Cracking During Fabrication of CIGS Solar Cells on Polyimide Substrates," NCPV and Solar Program Review Meeting 2003, NREL/CD-520-33586, pages 877-881, which is hereby incorporated by reference in its entirety. Likewise, Birkmire et al., 2005, Progress in Photovoltaics: Research and Applications 13, 141-148, hereby incorporated by reference, disclose a polyimide/Mo web structure, specifically, PI/Mo/Cu($InGa)Se_2$/CdS/ZnO/ITO/Ni—Al. Deposition of similar structures on stainless foil has also been explored. See, for example, Simpson et al., 2004, "Manufacturing Process Advancements for Flexible CIGS PV on Stainless Foil," DOE Solar Energy Technologies Program Review Meeting, PV Manufacturing Research and Development, P032, which is hereby incorporated by reference in its entirety.

In some embodiments of the present invention, an absorber material is deposited onto a polyimide/molybdenum web, such as those developed by Global Solar Energy (Tucson, Ariz.), or a metal foil (e.g., the foil disclosed in Simpson et al.). In some embodiments, the absorber material is any of the absorbers disclosed herein. In a particular embodiment, the absorber is $Cu(InGa)Se_2$. In some embodiments, the elongated core is made of a nonconductive material such as undoped plastic. In some embodiments, the elongated core is made of a conductive material such as a conductive metal, a metal-filled epoxy, glass, or resin, or a conductive plastic (e.g., a plastic containing a conducting filler). Next, the semiconductor junction 410 is completed by depositing a window layer onto the absorber layer. In the case where the absorber layer is Cu(InGa)Se$_2$, CdS can be used. Finally, an optional i-layer 415 and TCO 412 are added to complete the solar cell. Next, the foil is wrapped around and/or glued to a wire-shaped or tube-shaped elongated core. The advantage of such a fabrication method is that material that cannot withstand the deposition temperature of the absorber layer, window layer, i-layer or TCO layer can be used as an inner core for the solar cell. This manufacturing process can be used to manufacture any of the solar cells 402 disclosed in the present invention, where the conductive core 402 comprises an inner core and an outer conductive core. The inner core is any conductive or nonconductive material disclosed herein whereas the outer conductive core is the web or foil onto which the absorber layer, window layer, and TCO were deposited prior to rolling the foil onto the inner core. In some embodiments, the web or foil is glued onto the inner core using appropriate glue.

An aspect of the present invention provides a method of manufacturing a solar cell comprising depositing an absorber layer on a first face of a metallic web or a conducting foil. Next a window layer is deposited on to the absorber layer. Next a transparent conductive oxide layer is deposited on to the window layer. The metallic web or conducting foil is then rolled around an elongated core, thereby forming an elongated solar cell 402. In some embodiments, the absorber layer is copper-indium-gallium-diselenide (Cu(InGa)Se$_2$) and the window layer is cadmium sulfide. In some embodiments, the metallic web is a polyimide/molybdenum web. In some embodiments, the conducting foil is steel foil or aluminum foil. In some embodiments, the elongated core is made of a conductive metal, a metal-filled epoxy, a metal-filled glass, a metal-filled resin, or a conductive plastic.

In some embodiments, a transparent conducting oxide conductive film is deposited on a wire-shaped or tube-shaped elongated core rather than wrapping a metal web or foil around the elongated core. In such embodiments, the wire-shaped or tube-shaped elongated core can be, for example, a plastic rod, a glass rod, a glass tube, or a plastic tube. Such embodiments require some form of conductor in electrical communication with the interior face or back contact of the semiconductor junction. In some embodiments, divots in the wire-shaped or tube-shaped elongated core are filled with a conductive metal in order to provide such a conductor. The conductor can be inserted in the divots prior to depositing the transparent conductive oxide or conductive back contact film onto the wire-shaped or tube-shaped elongated core. In some embodiments such a conductor is formed from a metal source that runs lengthwise along the side of the elongated solar cell 402. This metal can be deposited by evaporation, sputtering, screen printing, inkjet printing, metal pressing, conductive ink or glue used to attach a metal wire, or other means of metal deposition.

More specific embodiments will now be disclosed. In some embodiments the elongated core is a glass tubing having a divot that runs lengthwise on the outer surface of the glass tubing, and the manufacturing method comprises depositing a conductor in the divot prior to the rolling step. In some embodiments the glass tubing has a second divot that runs lengthwise on the surface of the glass tubing. In such embodiments, the first divot and the second divot are on approximate or exact opposite circumferential sides of the glass tubing. In such embodiments, accordingly, the method further comprises depositing a conductor in the second divot prior to the rolling or, in embodiments in which rolling is not used, prior to the deposition of an inner TCO or conductive film, junction, and outer TCO onto the elongated core.

In some embodiments the elongated core is a glass rod having a first divot that runs lengthwise on the surface of the glass rod and the method comprises depositing a conductor in the first divot prior to the rolling. In some embodiments the glass rod has a second divot that runs lengthwise on the surface of the glass rod and the first divot and the second divot are on approximate or exact opposite circumferential sides of the glass rod. In such embodiments, accordingly, the method further comprises depositing a conductor in the second divot prior to the rolling or, in embodiments in which rolling is not used, prior to the deposition of an inner TCO or conductive film, junction, and outer TCO onto the elongated core. Suitable materials for the conductor are any of the materials described as a conductor herein including, but not limited to, aluminum, molybdenum, titanium, steel, nickel, silver, gold, or an alloy thereof.

Figure 13:
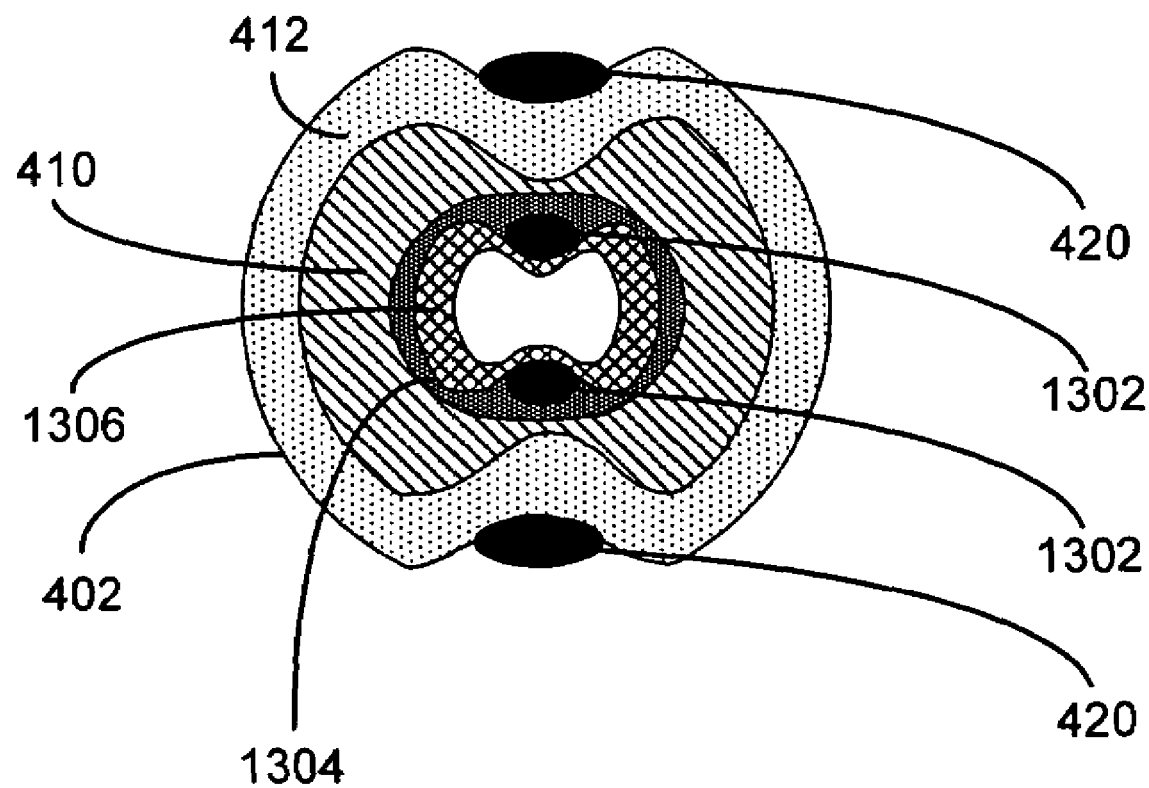
FIG. 13 illustrates a solar cell made by a roll method in accordance with an embodiment of the present invention.

FIG. 13 details a cross-section of a solar cell 402 in accordance with the present invention. The solar cell 402 can be manufactured using either the rolling method or deposition techniques. Components that have refrence numerals corresponding to other embodiments of the present invention (e.g., 410, 412, and 420) are made of the same materials disclosed in such embodiments. In FIG. 13, there is an elongated tubing 1306 having a first and second divot running lenghtwise along the tubing (perpendicular to the plane of the page) that are on circumferentially apposing sides of tubing 1306 is made of plastic or glass in some emodiments. Conductive wiring 1302 is placed in the first and second divot as illustrated in FIG. 13. In some embodiments the conductive wiring is made of any of the conductive materials of the present infention. In some embodiments, conductive wiring 1302 is made out of aluminum, molybdnum, steel, nickel, titanium, silver, gold, or an alloy thereof. In embodiments where 1304 is a conducting foil or metallic web, the conductive wiring 1302 is inserted into the divots prior to wrapping the metallic web or conducting foil 1304 around the elongated core 1306. In embodiments where 1304 ia a transparent conductive oxide or conductive film, the conductive wiring 1302 is inserted into the divots prior to depositing the transparent conductive oxide or conductive film 1304 onto elongated core 1306. As noted, in some embodiments the metallic web or conducting foil 1304 is wrapped aroung tubing 1306. In some embodiments, metallic web or conducting foil 1304 is glued to tubing 1306. In some embodiments layer 1304 is not a metallic web or conduting foil. For instance, in some embodiments, layer 1304 is a transparent conductive oxide (TCO). Such a layer is advantageous because it allows for thinner absorption layers in the semiconductor junction. In embodiments where layer 1304 is a TCO, the TCO, semiconductor junction 410 and outer TCO 412 are deposited using deposition techniques.

One aspect of the invention provides a solar cell assembly comprising a plurality of elongated solar cells 402 each having the structure disclosed in FIG. 13. That is, each elongated solar cell 402 in the plurality of elongated solar cells comprises an elongated tubing 1306, a metallic web or a conducting foil (or, alternatively, a layer of TCO) 1304 circumferentially disposed on the elongated tubing 1306, a semiconductor junction 410 circumferentially disposed on the metallic web or the conducting foil (or, alternatively, a layer of TCO) 1304 and a transparent conductive oxide layer 412 disposed on the semiconductor junction 410. The elongated solar cells 402 in the plurality of elongated solar cells are geometrically arranged in a parallel or a near parallel manner thereby forming a planar array having a first face and a second face. The plurality of elongated solar cells is arranged such that one or more elongated solar cells in the plurality of elongated solar cells are not in electrically conductive contact with adjacent elongated solar cells. In some embodiments, the elongated solar cells can be in physical contact with each other if there is an insulative layer between adjacent elongated solar cells. The solar cell assembly further comprises a plurality of metal counter-electrodes. Each respective elongated solar cell 402 in the plurality of elongated solar cells is bound to a first corresponding metal counter-electrode 420 in the plurality of metal counter-electrodes such that the first metal counter-electrode lies in a first groove that runs lengthwise on the respective elongated solar cell 402. The apparatus further comprises a transparent electrically insulating substrate that covers all or a portion of said the face of the planar array. A first and second elongated solar cell in the plurality of elongated solar cells are electrically connected in series by an electrical contact that connects the first electrode of the first elongated solar cell to the first corresponding counter-electrode of the second elongated solar cell. In some embodiments, the elongated tubing 1306 is glass tubing or plastic tubing having a one or more grooves filled with a conductor 1302. In some embodiments, each respective elongated solar cell 402 in the plurality of elongated solar cells is bound to a second corresponding metal counter-electrode 420 in the plurality of metal counter-electrodes such that the second metal counter-electrode lies in a second groove that runs lengthwise on the respective elongated solar cell 402 and such that the first groove and the second groove are on opposite or substantially opposite circumferential sides of the respective elongated solar cell 402. In some embodiments, the plurality of elongated solar cells 402 is configured to receive direct light from the first face and said second face of the planar array.

5.7 Static Concentrators

Figure 11:
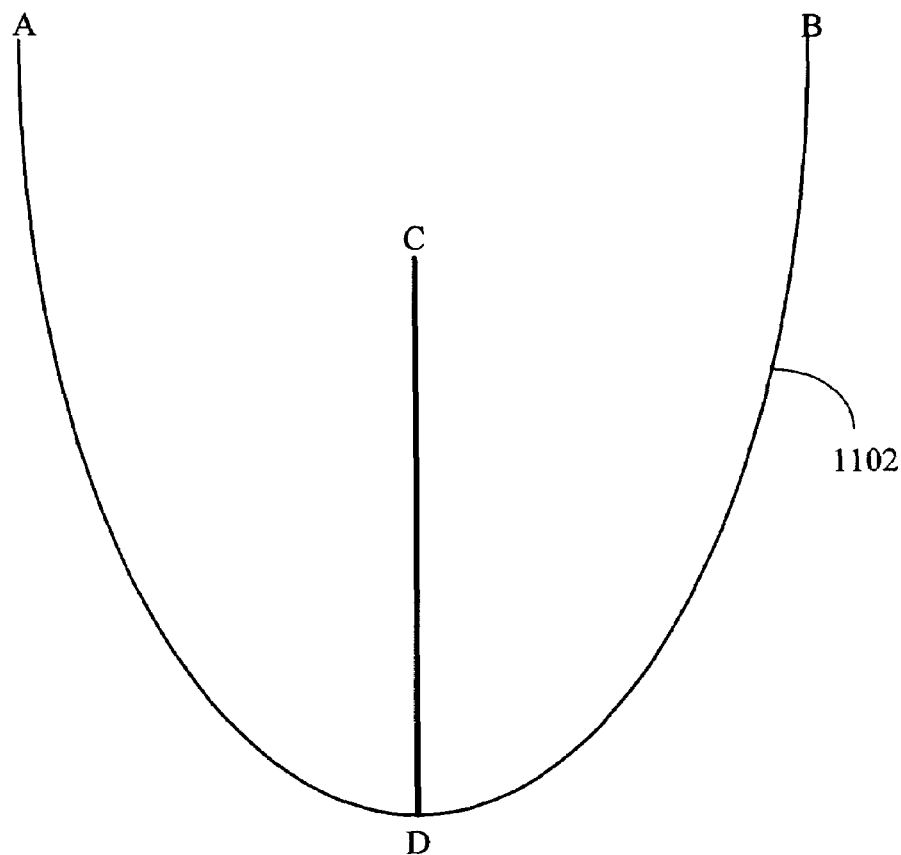
FIG. 11 illustrates how the solar cell assemblies of the present invention can be used in conjunction with one type of static concentrator.

In some embodiments, static concentrators are used to improve the performance of the solar cell assemblies of the present invention. The use of a static concentrator in one exemplary embodiment is illustrated in FIG. 11, where static concentrator 1102, with aperture AB, is used to increase the efficiency of bifacial solar cell assembly CD, where solar cell assembly CD is any of 400 (FIG. 4), 600 (FIG. 6), 700 (FIG. 7), 800 (FIG. 8), 900 (FIG. 9), or 1000 (FIG. 10). Static concentrator 1102 can be formed from any static concentrator materials known in the art such as, for example, a simple, properly bent or molded aluminum sheet, or reflector film on polyurethane. Concentrator 1102 is an example of a low concentration ratio, nonimaging, compound parabolic concentrator (CPC)-type collector. Any (CPC)-type collector can be used with the solar cell assemblies of the present invention. For more information on (CPC)-type collectors, see Pereira and Gordon, 1989, Journal of Solar Energy Engineering, 111, pp. 111-116, which is hereby incorporated by reference in its entirety.

Additional static concentrators that can be used with the present invention are disclosed in Uematsu et al., 1999, Proceedings of the 11th International Photovoltaic Science and Engineering Conference, Sapporo, Japan, pp. 957-958; Uematsu et al., 1998, Proceedings of the Second World Conference on Photovoltaic Solar Energy Conversion, Vienna, Austria, pp. 1570-1573; Warabisako et al., 1998, Proceedings of the Second World Conference on Photovoltaic Solar Energy Conversion, Vienna, Austria, pp. 1226-1231; Eames et al., 1998, Proceedings of the Second World Conference on Photovoltaic Solar Energy Conversion, Vienna Austria, pp. 2206-2209; Bowden et al., 1993, Proceedings of the 23rd IEEE Photovoltaic Specialists Conference, pp. 1068-1072; and Parada et al., 1991, Proceedings of the 10th EC Photovoltaic Solar Energy Conference, pp. 975-978, each of which is hereby incorporated by reference in its entirety.

Figure 12:
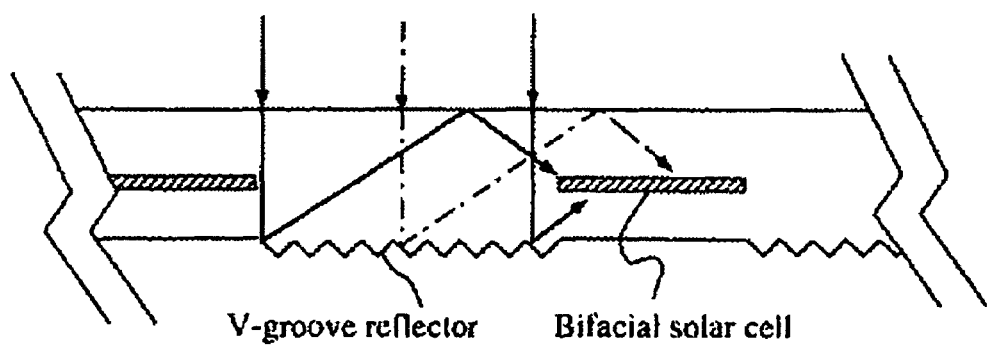
FIG. 12 illustrates how the solar cell assemblies of the present invention can be used in conjunction with another type of static concentrator.

In some embodiments, a static concentrator as illustrated in FIG. 12 is used. The bifacial solar cells illustrated in FIG. 12 can be any of the bifacial solar cell assemblies of the present invention, including but not limited to assembly 400 (FIG. 4), 600 (FIG. 6), 700 (FIG. 7), 800 (FIG. 8), 900 (FIG. 9), or 1000 (FIG. 10). The static concentrator uses two sheets of cover glass on the front and rear of the module with submillimeter V-grooves that are designed to capture and reflect incident light as illustrated in the Figure. More details of such concentrators is found in Uematsu et al., 2001, Solar Energy Materials & Solar Cell 67, 425-434 and Uematsu et al., 2001, Solar Energy Materials & Solar Cell 67, 441-448, each of which is hereby incorporated by reference in its entirety. Additional static concentrators that can be used with the present invention are discussed in *Handbook of Photovoltaic Science and Engineering*, 2003, Luque and Hegedus (eds.), Wiley & Sons, West Sussex, England, Chapter 12, which is hereby incorporated by reference in its entirety.

5.8 Internal Reflector Embodiments

Figure 14:
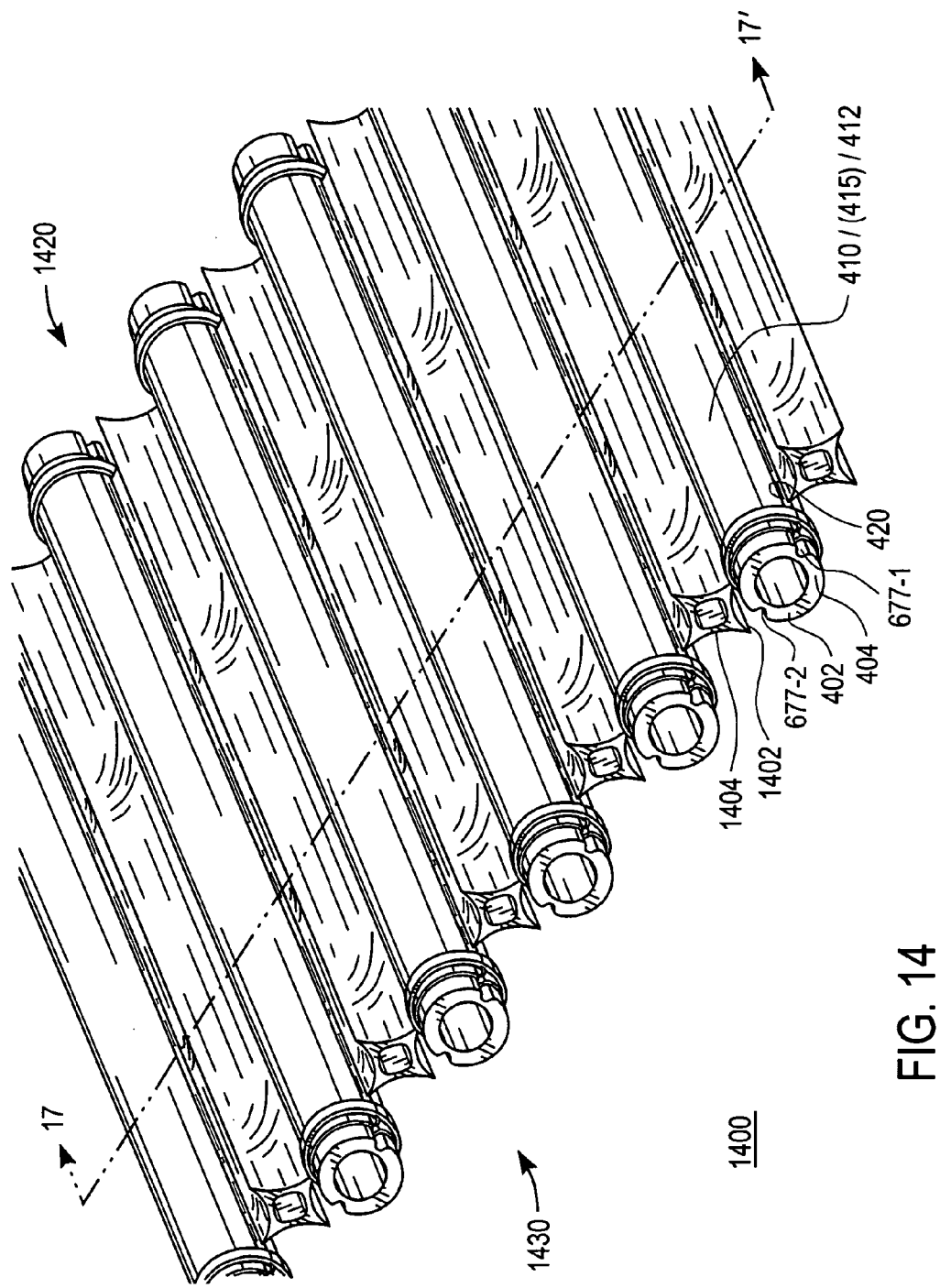
FIG. 14 illustrates a perspective view of a solar cell architecture in accordance with an embodiment of the present invention in which reflectors are used to increase efficiency.

FIG. 14 illustrates a solar cell assembly 1400 in accordance with the present invention. Specifically, FIG. 14 is a perspective view of rod-shaped (elongated) solar cells 402 electrically arranged in series in solar cell assembly 1400 where counter-electrodes 420 are in electrical communication with internal reflectors 1404. As illustrated in FIG. 14, solar cell assembly 1400 comprises a plurality of elongated solar cells 402. There is no limit to the number of solar cells 402 in this plurality (e.g., 10 or more, 100 or more, 1000 or more, 10,000 or more, between 5,000 and one million solar cells 402, etc.). As in the embodiment of the invention illustrated in FIG. 4 and described above, each elongated solar cell 402 comprises a conductive core 404 with a semiconductor junction 410 circumferentially disposed on the conductive core. A transparent conductive oxide layer (TCO) 412 circumferentially disposed on the semiconductor junction 410 completes the circuit. In preferred embodiments, there is an intrinsic layer 415 circumferentially disposed between semiconductor junction 410 and TCO 412. In some embodiments, this intrinsic layer is formed by an undoped transparent oxide such as zinc oxide, or any transparent metal oxide that is highly insulating. In FIG. 14, semiconductor junction 410, optional intrinsic layer 415, and TCO 412 are schematically drawn as a single layer so that other aspects of the architecture of solar cell assembly 1400 can be emphasized. As can be seen in FIG. 14, each elongated solar cell 402 has a length that is great compared to the diameter of its cross-section. Typically, each solar cell 402 has a rod-like shape (e.g., has a wire shape). In some embodiments, counter-electrodes 420 are made out of aluminum or copper.

In typical embodiments there is a first groove 677-1 and a second groove 677-2 that each runs lengthwise on opposing sides of solar cell 402. In some embodiments, the counter-electrodes 420 are fitted into grooves 677 in the manner illustrated in FIG. 14. Typically, such counter-electrodes 420 are glued into grooves 677 using a conductive ink or conductive glue. For example, CuPro-Cote (available from Lessemf.com, Albany, N.Y.), which is a sprayable metallic coating system using a non-oxidizing copper as a conductor, can be used. In preferred embodiments, the counter-electrodes 420 are fitted in to grooves 677 and then a bead of conductive ink or conductive glue is applied. As in previous embodiments, the present invention encompasses grooves 677 that have a broad range of depths and shape characteristics and is by no means limited to the shape of the grooves 677 illustrated in FIG. 14. In general, any type of groove 677 that runs along the long axis of a first solar cell 402 and that can accommodate all or part of counter-electrode 420 is within the scope of the present invention.

Internal reflectors 1404 run lengthwise along corresponding solar cells 402 as shown, for example, in FIG. 14. In some embodiments, internal reflectors 1404 have a hollow core. As in the case of elongated conductive core 404, a hollow core is advantageous in many instances because it reduces the amount of material needed to make such devices, thereby lowering costs. In some embodiments, internal reflector 1404 is a plastic casing with a layer of highly reflective material (e.g., polished aluminum, aluminum alloy, silver, nickel, steel, etc.) deposited on the plastic casing. In some embodiments internal reflector 1404 is a single piece made out of polished aluminum, aluminum alloy, silver, nickel, steel, etc. In some embodiments, internal reflector is a metal or plastic casing onto which is layered a metal foil tape. Exemplary metal foil tapes include, but are not limited to, 3M aluminum foil tape 425, 3M aluminum foil tape 427, 3M aluminum foil tape 431, and 3M aluminum foil tape 439 (3M, St. Paul, Minn.). Internal reflector 1404 can adopt a broad range of designs, only one of which is illustrated in FIG. 14. Central to the design of reflectors 1404 found in a preferred embodiment of the present invention is the desire to reflect direct light that enters into both sides of solar cell assembly 1400 (i.e., side 1420 and side 1430). In general, reflector 1404 is designed to optimize reflection of light into adjacent elongated solar cells 402. Direct light that enters one side of solar cell assembly 1400 (e.g., side 1420, above the plane of the solar cell assembly drawn in FIG. 14) is directly from the sun whereas light that enters the other side of the solar cell (e.g., side 1430, below the plane of the solar cell assembly drawn in FIG. 14) will have been reflected off of a Lambertian or diffuse reflector surface. Thus, because each side of the solar cell assembly faces a different light environment, the shape of reflector 1404 on side 1420 may be different than on side 1430.

A counter-electrode collar 1402 is found toward the end of each elongated solar cell 402. Each counter-electrode collar 1402 is made of a thin strip of conductive material that is wrapped around transparent conductive oxide 412 toward the ends of elongated solar cell 402. In some embodiments, each counter-electrode collar 1402 is made of a conductive ribbon of metal (e.g., copper, aluminum, gold, silver, molybdenum, or an alloy thereof) or a conductive ink. As will be explained in conjunction with subsequent drawings, counter-electrode collar 1402 is used to electrically connect elongated solar cells 402.

In embodiments not illustrated in FIGS. 14-17, elongated solar cells 402 are swaged at their ends such that the diameter at the ends is less than the diameter towards the center of such cells. Conductive collar 1402 is then placed on the swaged ends. The purpose of the swaged ends is to facilitate placement of conductive collars 1402 on the ends of elongated solar cells 402 and to allow for the placement of elongated solar cells 402 closer together.

As illustrated in FIG. 14, solar cells in the plurality of elongated solar cells 402 are geometrically arranged in a parallel or near parallel manner. However, unlike the embodiments illustrated in FIG. 6, elongated solar cells 402 are not arranged as a plurality of solar cell pairs. In some embodiments, each internal reflector 1404 connects to two elongated solar cells 402, for example, in the manner illustrated in FIGS. 14 through 17. Because of this, the elongated solar cells 402 are effectively joined into a single composite device.

Figure 17:
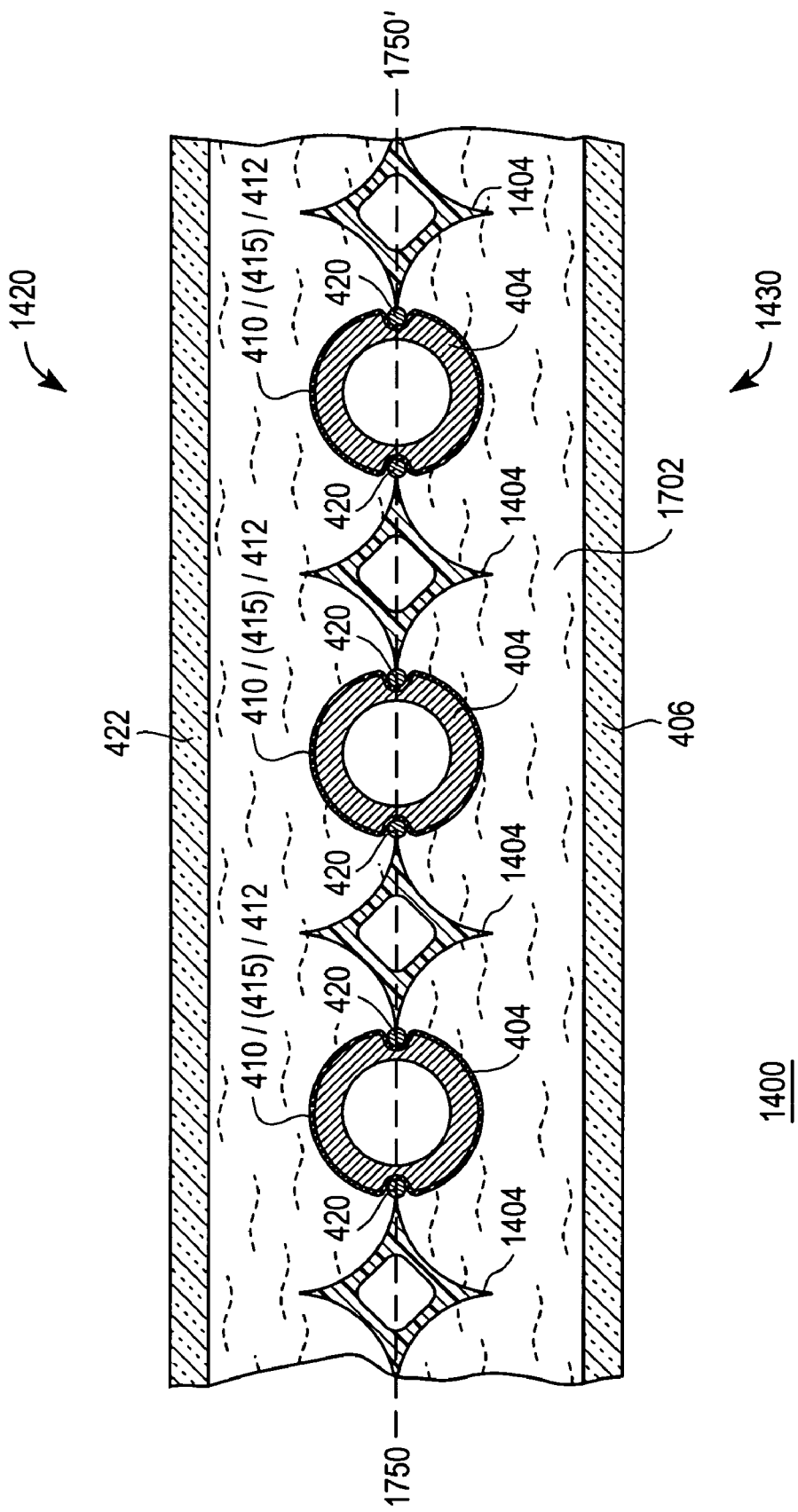
FIG. 17 illustrates a cross-sectional view of a solar cell architecture in accordance with an embodiment of the present invention.

The way in which internal reflectors 1404 interface with elongated solar cells 402, in accordance with some embodiments of the present invention, is seen more clearly in FIG. 17, which illustrates a cross-sectional view of a solar cell assembly drawn with respect to line 17-17' of FIG. 14. In FIG. 17, each internal reflector 1404 is connected to the two adjacent elongated solar cells 402 such that the internal reflector 1404 contacts the elongated counter-electrode 420 strips of the two elongated solar cells 402 in the manner shown. For example, a first edge of internal reflector 1404 connects the reflector to a first counter-electrode 420 of a first elongated solar cell 402 and a second edge of internal reflector 1404 connects the reflector to a second counter-electrode 420 of a second elongated solar cell 402. In practice, the internal reflector 1404 can be sealed to such counter-electrode 420 strips using any suitable electrically conductive glue or ink, such as any of the electrically conductive glues disclosed in preceding sections. There is no limitation on the cross-sectional shape of reflector 1404. In general, the cross-sectional shape of reflector 1404 is optimized to reflect as much light as possible onto the elongated solar cells 402. Although elongated solar cells 402 are drawn as circular in FIG. 17, they can have any cross-sectional shape that does not have an edge. For example, in some embodiments, the cross-sectional shape of cells 402 is oval in nature such that the long axis of such ovals is parallel or nearly parallel to line 1750-1750' of FIG. 17. Such an arrangement is advantageous in some solar cell assemblies because it requires fewer elongated solar cells 402 per arbitrary unit of solar panel real estate in the assembly. Since elongated solar cells 402 have an associated cost, fewer numbers of such elongated solar cells 402 covering the same amount of area is more cost effective.

In some embodiments, not shown, internal reflectors 1404 are electrically isolated from counter-electrodes 420. Thus, in such embodiments, internal reflectors 1404 do not electrically connect the counter-electrodes 420 of adjacent elongated solar cells 402. In such embodiments, internal reflectors 1404 are isolated from elongated solar cells 402 using a transparent insulator such as Sylgard (Dupont, USA) and/or ethyl vinyl acetate, and/or spray Teflon.

An arrangement of internal reflectors 1404 and elongated solar cells 402, such as that illustrated in FIGS. 14 and 17, is advantageous for several reasons. First, elongated solar cells 402 have appreciable costs. Thus, an architecture, such as that illustrated in FIGS. 14 and 17, that reduces the number of elongated solar cells 402 will reduce costs. In typical embodiments, internal reflectors 1404 cost less to make than elongated solar cells 402. Furthermore, internal reflectors 1404 reflect light onto existing elongated solar cells. This additional reflective light makes such elongated solar cells 402 more efficient than comparable elongated solar cells 402 that lack internal reflectors 1404. Thus, the reduced number of elongated solar cells 402 per arbitrary unit of solar cell apparatus real estate that is realized by a solar cell architecture, such as that disclosed in FIG. 14, is compensated for by the increased electrical output of the elongated solar cells 402 owing to the additional reflected light provided by internal reflectors 1404. This means that, although the density of solar cells 402 in solar cell assembly 1400 relative to comparable architectures described in conjunction with previous figures above is reduced, such reduced elongated solar cell 402 density is compensated for by the fact that the electrical output of the elongated solar cells 402 is greater in solar cell assembly 1400 because of the light reflected by internal reflectors 1404.

In some embodiments, another reason that the arrangement of internal reflectors 1404 and elongated solar cells 402, such as that illustrated in FIGS. 14 and 17, is advantageous is that the reflective surface on internal reflectors 1404 (or the internal reflectors 1404 themselves in the case where such reflectors are made from a single piece of conductive metal) can conduct electricity. Thus, they can be used to lower the conductive burden on counter-electrodes 1402. With their reduced conductive burden, counter-electrodes 1402 can be made smaller than counter-electrodes 1420 found in comparable solar cell architectures such as those illustrated in preceding sections. This is advantageous because the materials used to make counter-electrodes 1402 (e.g., copper, etc.) are costly. Any reduction in the size of such counter-electrodes significantly lowers the cost of manufacturing solar cell assembly 1400. In some embodiments, reflectors 1404 are used to lower the conductive burden on counter-electrodes 420 by electrically connecting to adjacent counter-electrodes 420 in the manner illustrated in FIG. 17. In preferred embodiments, elongated solar cells 402 are connected in series, not in parallel. Therefore, in embodiments where reflectors 1404 are electrically connected to adjacent counter-electrodes 420, it is preferable to preserve the serial electrical arrangement of elongated solar cells 402. This can be accomplished by electrically isolating the portion of an internal reflector 1404 that contacts a first counter-electrode 420 from the portion of the internal reflector 1404 that contacts a second counter-electrode 420. There are many ways in which this electrical isolation can be accomplished. For example, the center of internal reflector 1404 can comprise an insulative material that insulates the portion of internal reflector 1404 that contacts one counter-electrode 420 from the portion of internal reflector 1404 that contacts the other counter-electrode 420. In another example, the internal reflector 1404 comprises an insulative core with a layer of reflective material deposited on the insulative core. The layer of reflective material contacts adjacent counter-electrodes 420. However, to preserve the in-series electrical connection of the elongated solar cells 402, there are breaks in the reflective, conductive layer. In one example, referring to FIG. 17, there is a first break in the reflective material at or near the apex of internal reflector 1404 that faces side 1420 and there is a second break in the reflective material at or near the apex of internal reflector 1404 that faces side 1430.

In some embodiments elongated solar cells 402 are on the order of a meter long and there is less than a two percent resistive loss along the length of counter-electrode strips 420. In exemplary embodiments where internal reflectors 1404 are not used or are electrically isolated from counter-electrodes 420, to ensure that the resistive loss is less than two percent, and assuming that there are two counter-electrode strips 420 per elongated solar cell 402, that such counter-electrode strips 420 adopt a wire shape, and that such counter-electrode strips 420 are made of pure copper that have a conductivity of 1.7 µOhm-cm, the diameter of electrode strips 420 is on the order of 1 millimeter. In embodiments where internal reflector 1404 is used and is electrically connected to counter-electrodes 420, counter-electrode strips 420 can be of smaller diameter and still have less than a two percent resistive loss along the length of the electrodes. In some embodiments, solar cells 402 have a length that is between 0.5 meters and 2 meters. In some embodiments, counter-electrodes 420 have a diameter that falls within the range between 0.5 millimeters and 1.5 millimeters.

Figure 15:
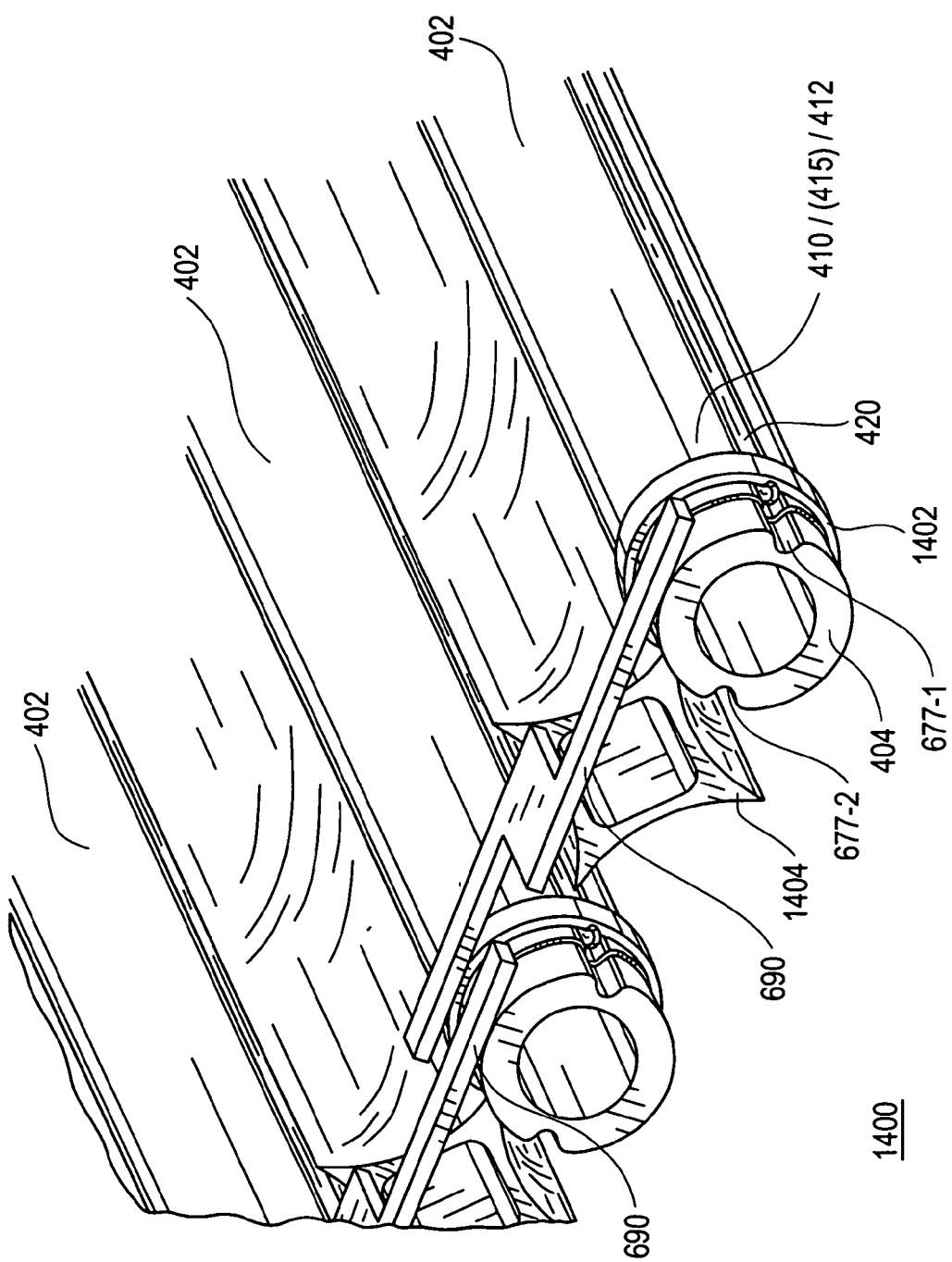
FIG. 15 illustrates a perspective view of a solar cell architecture in accordance with an embodiment of the present invention in which an electrode connects adjacent solar cells in series.

Even though solar cells 402 form a single composite device in solar cell assembly 1400, in preferred embodiments individual elongated solar cells 402 are electrically arranged in series rather than in parallel. In some embodiments, an in-series rather than in-parallel architecture is accomplished by implementing specific design features. Such features can be seen with greater clarity in FIG. 15, which is an enlarged portion of the solar cell assembly 1400 of FIG. 14. In FIG. 15, each electrical contact 690 electrically connects the conductive core 404 of one elongated solar cell 402 to a counter-electrode collar 1402 of an adjacent elongated solar cell 402.

In some embodiments the material used to make electrical contact 690 for solar cell assembly 1400 is a conductive tape. In other preferred embodiments, electrical contact 690 is made out of an electrically conducting material such as copper or aluminum. Consider the case in which electrical contact 690 is made out of a conductive tape. Such tape typically has an adhesive conductive surface. In FIG. 15, the adhesive conductive surface is face down into the page such that it contacts the elongated conductive core 404 of the elongated solar cell 402 on the right and such that it contacts the counter-electrode collar 1402 of the elongated solar cell 402 on the left. Exemplary conductive tapes include, but are not limited to, ZTAPE available from iEC (Commerce City, Colo.). However, in general, any conductive tape comprising an adhesive with a backing onto which is deposited a conductive material (e.g., silver, tin, nickel, copper, graphite, or aluminum) will suffice.

Care is taken so that electrical contact 690 does not contact internal mirror 1404 thereby causing a short. In some embodiments, elongated conductive core 404 is any of the dual layer cores described in Section 5.4. In such embodiments, the terminal ends of elongated solar cells 402 can be stripped down to either the inner core or the outer core. For example, consider the case in which elongated solar cell 402 is made out of an inner core made of aluminum and an outer core made of molybdenum. In such a case, the end of elongated solar cell 402 can be stripped down to the molybdenum outer core and the contact 690 electrically connected with this outer core. Alternatively, the end of elongated solar cell 402 can be stripped down to the aluminum inner core and the contact 690 electrically connected with this inner core. As illustrated in FIG. 15, contacts 690 that are in electrical contact with the conductive core 404 of a given elongated solar cell 402 do not contact the counter-electrode collar 1402 of the given elongated solar cell 402 because such a contact would cause an electrical short.

In some embodiments, contact 690 and the counter-electrode collar 1402 that contact 690 is in electrical contact with are formed out a single piece that is patterned such that collar 1402 wraps around the appropriate elongated solar cell 402. It should be emphasized that although illustrated as such in FIGS. 14-17, there is no requirement that counter-electrode collar 1402 wrap all the way around elongated conductive core 404. All that is required is that collar 1402 form an electrical contact with counter-electrodes 420. In some embodiments, however, there is a contact 690 on both the top surface, as illustrated in FIG. 15, and the bottom surface (such contacts 690 are not illustrated in FIG. 15). In such embodiments, it is necessary for collar 1402 to wrap around the entire circumference of elongated conductive core 404. In some embodiments where there is a contact 690 on both the top surface and the bottom surface, elongated solar cells 402 are staggered.

Figure 16:
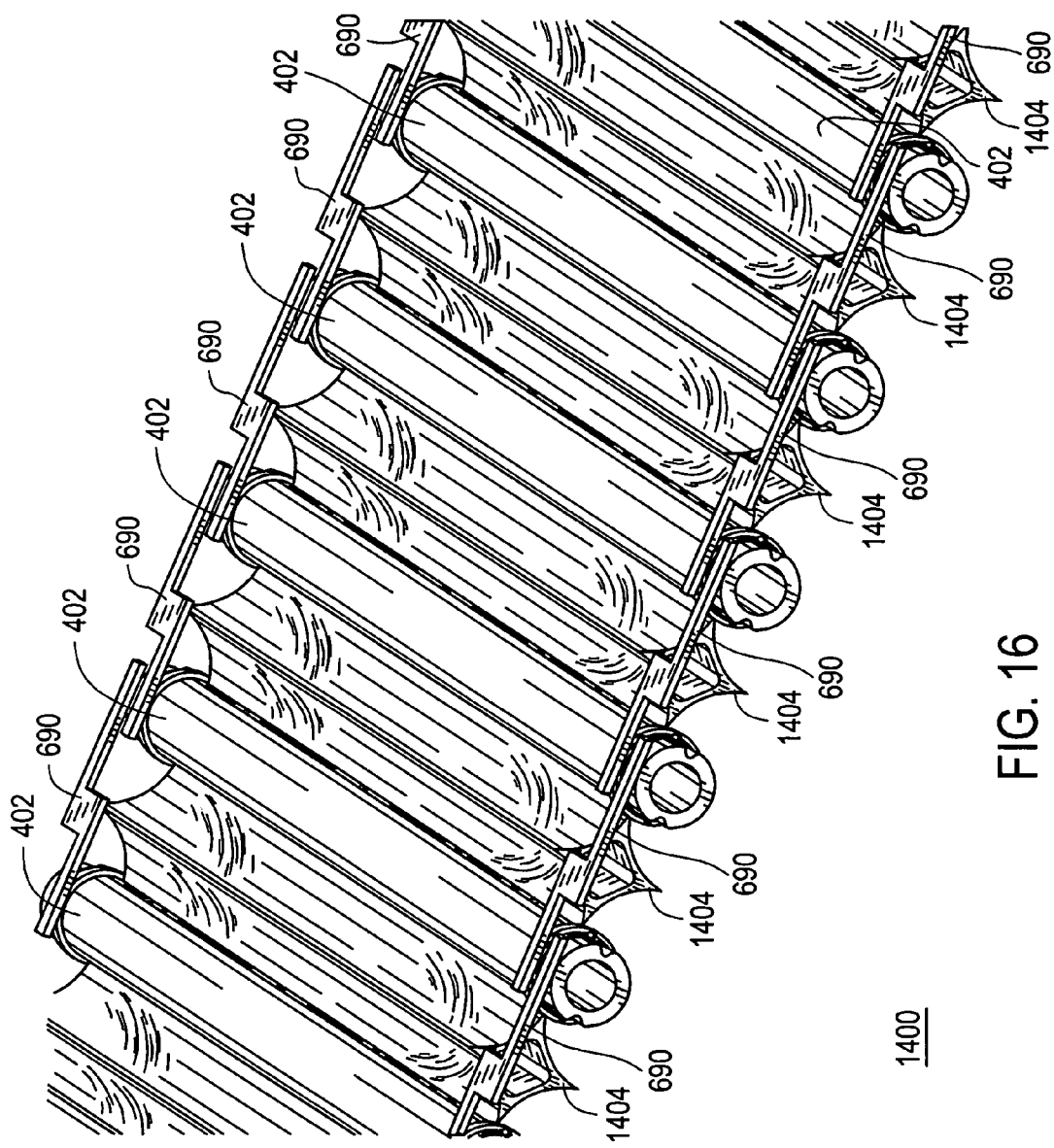
FIG. 16 illustrates a perspective view of a solar cell architecture in accordance with an embodiment of the present invention in which electrodes connect adjacent solar cells in series.

Referring to FIG. 16, the serial architecture of solar cell assembly 1400 is made more apparent. FIG. 16 depicts the same solar cell assembly 1400 shown in FIG. 14, the exception being that electrical contacts 690 are shown in FIG. 16 whereas they are not shown in FIG. 14. As can be seen in FIG. 16, solar cells 402 are electrically connected to each other in a series manner by electrical contacts 690. Another feature of solar cell assembly 1400 that is made apparent in FIG. 16 is that there are electrical contacts 690 on each end of elongated solar cells 402. Such an electrical arrangement is advantageous because it reduces burden on counter-electrodes 420. Current only has to travel half the distance in any given elongated solar cell 402 in such an architecture. Thus, the diameter of the wire needed for counter-electrodes 420 in order to ensure a less than two percent resistive loss across the length of the elongated solar cells is substantially less than embodiments where electrical contacts 690 are found only at a single given end of elongated solar cells 402.

Referring once again to FIG. 17, a transparent electrically insulating substrate 406 covers all or a portion of face 1430 of the planar array of solar cells. In some embodiments, solar cells 402 contact substrate 406. In some embodiments, solar cells 402 do not contact substrate 406. In embodiments in which elongated solar cells 402 do not contact substrate 406, a sealant such as ethyl vinyl acetate (EVA) is used to seal substrate 406 onto solar cells 402. In fact, a sealant such as EVA can also be used to seal assembly 400 even in embodiments in which elongated solar cells 402 do contact substrate 406. As illustrated in FIG. 17, there is a layer 1702 of sealant that seals the assembly to substrate 406. In some embodiments, layer 1702 is EVA that has been applied in liquid form in order to reach into crevices thereby forming layer 1702. Then, electrically resistant transparent substrate 406 and covering 422 are positioned on the EVA filler such that they touch or nearly touch the tops of the elongated solar cells 402 and reflectors 1404. Thus, in typical embodiments, layer 1702 of EVA does not significantly clear the features of the elongated solar cells 402 and reflectors 1404 and resistive transparent substrate 406 and covering 422 nearly touch each other. In such embodiments, the thickness of layer 1402 is simply the thickness of elongated solar cells and/or reflectors 1404.

In some embodiments, solar cell assembly 1400 further comprises a transparent insulating covering 422 disposed on face 1420 of the planar array of solar cells 402, thereby encasing the plurality of elongated solar cells 402 between the transparent insulating covering 422 and the transparent electrically insulating substrate 406. In such embodiments, transparent insulating covering 422 and the transparent insulating substrate 406 are bonded together by a sealant such as ethyl vinyl acetate.

In some embodiments, the semiconductor junction 410 of solar cells 402 in assembly 1400 comprise an inner coaxial layer and an outer coaxial layer, where the outer coaxial layer comprises a first conductivity type and the inner coaxial layer comprises a second, opposite, conductivity type. In some embodiments, the inner coaxial layer comprises copper-indium-gallium-diselenide (CIGS) and the outer coaxial layer comprises CdS, $SnO_2$, ZnO, $ZrO_2$, or doped ZnO. In some embodiments, conductive core 404 and/or electrical contacts 677 and/or counter-electrodes 420 are made of aluminum, molybdenum, steel, nickel, silver, gold, or an alloy thereof. In some embodiments, transparent conductive oxide layer 412 is made of tin oxide $SnO_x$, with or without fluorine doping, indium-tin oxide (ITO), zinc oxide (ZnO), indium-zinc-oxide or a combination thereof. In some embodiments, transparent insulating substrate 406 and transparent insulating covering 422 comprise glass or Tedlar.

In some embodiments elongated solar cells 402 are cooled by pumping air or helium through the hollow channels at the center of such solar cells 402. In still other embodiments, solar cells 402 and/or counter-electrode collar 1402 do not have a hollow core as depicted in FIGS. 14 through 17.

5.9 Additional Internal Reflector Embodiments

Figure 18:
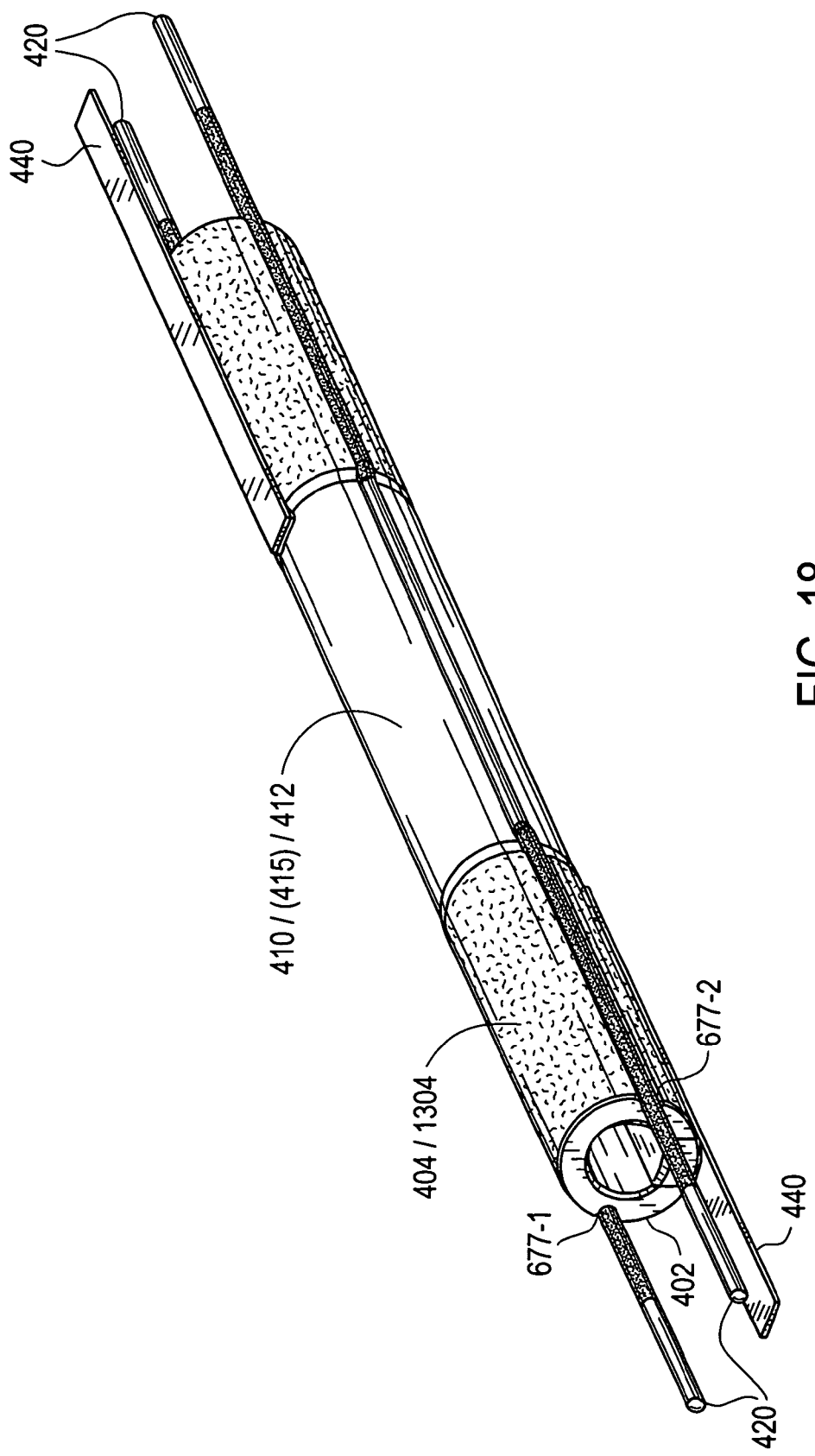
FIG. 18 illustrates a perspective view of an elongated solar cell architecture with protruding electrode attachments, in accordance with an embodiment of the present invention.

FIG. 18 illustrates an elongated solar cell 402 in accordance with the present invention. As depicted in FIG. 18, the coating on elongated solar cell 402 is not uniform. The ends of the elongated solar cell 402 are stripped and conductive layer 404/1304 is exposed. As in previous embodiments, the conductive layer (elongated conductive core) 404/1304 serves as the first electrode in the assembly and transparent conductive oxide (TCO) 412 on the exterior surface of each elongated solar cell 402 serves as the counter-electrode. In some embodiments in accordance with the present invention as illustrated in FIG. 18, however, protruding counter-electrodes 420 and electrodes 440, which are attached to the elongated solar cell 402, provide convenient electrical connection.

In typical embodiments as shown in FIG. 18, there is a first groove 677-1 and a second groove 677-2 that each runs lengthwise on opposing sides of elongated solar cell 402. In some embodiments, counter-electrodes 420 are fitted into grooves 677 in the manner illustrated in FIG. 18. Typically, such counter-electrodes 420 are glued into grooves 677 using a conductive ink or conductive glue. For example, CuPro-Cote (available from Lessemf.com, Albany, N.Y.), which is a sprayable metallic coating system using a non-oxidizing copper as a conductor, can be used. In preferred embodiments, counter-electrodes 420 are fitted in to grooves 677 and then a bead of conductive ink or conductive glue is applied. As in previous embodiments, the present invention encompasses grooves 677 that have a broad range of depths and shape characteristics and is by no means limited to the shape of the grooves 677 illustrated in FIG. 18. In general, any type of groove 677 that runs along the long axis of a first solar cell 402 and that can accommodate all or part of counter-electrode 420 is within the scope of the present invention. Counter-electrodes 420 conduct current from the combined layer 410/(415)/412. At the regions at both ends of elongated solar cell 402, counter-electrodes 420 are sheathed as shown in FIG. 18 so that they are electrically isolated from conductive layer 404/1304. The ends of protruding counter-electrodes 420, however, are unsheathed so they can form electric contact with additional devices.

In the embodiments as depicted in FIG. 18, a second set of electrodes 440 are attached to the exposed conductive layer 404/1304. The second set of electrodes 440 conduct current from the exposed conductive layer 404/1304. As illustrated in FIG. 18, an embodiment in accordance with the present invention has two electrodes 440 attached at two opposing ends of each elongated solar cell 402. Typically, electrodes 440 are glued onto layer 404/1304 using a conductive ink or conductive glue. For example, CuPro-Cote (available from Lessemf.com, Albany, N.Y.), which is a sprayable metallic coating system using a non-oxidizing copper as a conductor, can be used. In preferred embodiments, electrodes 440 are glued to layer 404/1304 and then a bead of conductive ink or conductive glue is applied. Care is taken so that electrodes 440 are not in electrical contact with layer 410/(415)/412. Additionally, electrodes 440 in the present invention have a broad range of lengths and widths and shape characteristics and are by no means limited to the shape of 440 illustrated in FIG. 18. In the embodiments as shown in FIG. 18, the two electrodes 440 on opposite ends of the elongated solar cell 402 are not on the same side of the solar cell tube. The first electrode 440 is on the bottom side of the elongated solar cell 402 while the second electrode 440 is on the top side of the elongated solar cell 402. Such an arrangement facilitates the connection of the solar cells in a serial manner. In some embodiments in accordance with the present invention, the two electrodes 440 can be on the same side of the elongated solar cell 402.

In some embodiments, each electrode 440 is made of a thin strip of conductive material that is attached to conductive layer 404/1304 (FIG. 18). In some embodiments, each electrode 440 is made of a conductive ribbon of metal (e.g., copper, aluminum, gold, silver, molybdenum, or an alloy thereof) or a conductive ink. As will be explained in conjunction with subsequent drawings, counter-electrode 420 and electrodes 440 are used to electrically connect elongated solar cells 402, preferably in series.

Figure 19:
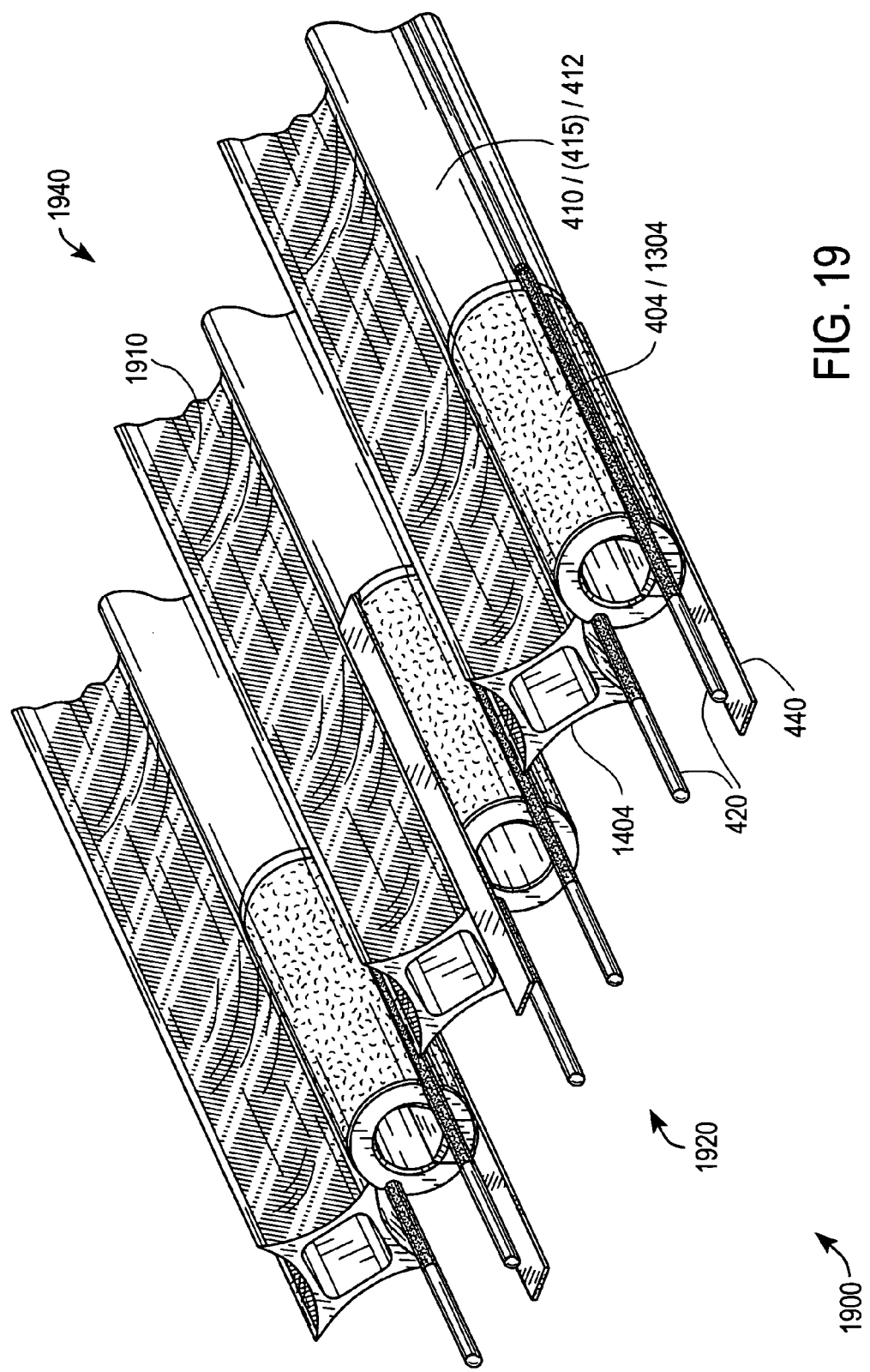
FIG. 19 illustrates a perspective view of a solar cell architecture in accordance with an embodiment of the present invention.

FIG. 19 illustrates a solar cell assembly 1900 in accordance with the present invention. The elongated solar cells 402 and reflector 1404 are assembled into an alternating array as shown. Elongated solar cells 402 in solar cell assembly 1900 have been equipped with counter-electrodes 420 and electrodes 440. As illustrated in FIG. 19, solar cell assembly 1900 comprises a plurality of elongated solar cells 402. There is no limit to the number of solar cells 402 in this plurality (e.g., 10 or more, 100 or more, 1000 or more, 10,000 or more, between 5,000 and one million solar cells 402, etc.). Accordingly, solar cell assembly 1900 also comprises a plurality of reflectors 1404. There is no limit to the number of reflectors 1404 in this plurality (e.g., 10 or more, 100 or more, 1000 or more, 10,000 or more, between 5,000 and one million reflector 1404, etc.).

Within solar cell assembly 1900, internal reflectors 1404 run lengthwise along corresponding elongated solar cells 402 as shown, for example, in FIG. 19. In some embodiments, internal reflectors 1404 have a hollow core. As in the case of elongated conductive core 404, a hollow core is advantageous in many instances because it reduces the amount of material needed to make such devices, thereby lowering costs. In some embodiments, internal reflector 1404 is a plastic casing with a layer of highly reflective material (e.g., polished aluminum, aluminum alloy, silver, nickel, steel, etc.) deposited on the plastic casing. In some embodiments, internal reflector 1404 is a single piece made out of polished aluminum, aluminum alloy, silver, nickel, steel, etc. In some embodiments, internal reflector 1404 is a metal or plastic casing onto which is layered a metal foil tape. Exemplary metal foil tapes include, but are not limited to, 3M aluminum foil tape 425, 3M aluminum foil tape 427, 3M aluminum foil tape 431, and 3M aluminum foil tape 439 (3M, St. Paul, Minn.). Internal reflector 1404 can adopt a broad range of designs, only one of which is illustrated in FIG. 19. Central to the design of reflectors 1404 found in a preferred embodiment of the present invention is the desire to reflect direct light that enters into both sides of solar cell assembly 1900 (i.e., side 1920 and side 1940).

In general, the reflectors 1404 of the present invention are designed to optimize reflection of light into adjacent elongated solar cells 402. Direct light that enters one side of solar cell assembly 1900 (e.g., side 1940, above the plane of the solar cell assembly drawn in FIG. 19) is directly from the sun whereas light that enters the other side of the solar cell (e.g., side 1920, below the plane of the solar cell assembly drawn in FIG. 19) will have been reflected off of a surface. In some embodiments, this surface is Lambertian, a diffuse or an involute reflector. Thus, because each side of the solar cell assembly faces a different light environment, the shape of internal reflector 1404 on side 1920 may be different than on side 1940.

Although the internal reflector 1404 is illustrated in FIG. 19 as having a symmetrical four-sided cross-sectional shape, the cross-sectional shape of the internal reflectors 1404 of the present invention are not limited to such a configuration. In some embodiments, a cross-sectional shape of an internal reflector 1404 is astroid. In some embodiments, a cross-sectional shape of an internal reflector 1404 is four-sided and at least one side of the four-sided cross-sectional shape is linear. In some embodiments, a cross-sectional shape of an internal reflector 1404 is four-sided and at least one side of the four-sided cross-sectional shape is parabolic. In some embodiments, a cross-sectional shape of an internal reflector 1404 is four-sided and at least one side of the four-sided cross-sectional shape is concave. In some embodiments, a cross-sectional shape of an internal reflector 1404 is four-sided; and at least one side of the four-sided cross-sectional shape is circular or elliptical. In some embodiments, a cross-sectional shape of an internal reflector in the plurality of internal reflectors is four-sided and at least one side of the four-sided cross-sectional shape defines a diffuse surface on the internal reflector. In some embodiments, a cross-sectional shape of an internal reflector 1404 is four-sided and at least one side of the four-sided cross-sectional shape is the involute of a cross-sectional shape of an elongated solar cell 402. In some embodiments a cross-sectional shape of an internal reflector 1404 is a two-sided, three-sided, four-sided, five-sided, or six-sided. In some embodiments, a cross-sectional shape of an internal reflector in the plurality of internal reflectors is four-sided and at least one side of the four-sided cross-sectional shape is faceted.

Additional features are added to reflectors 1404 to enhance the reflection onto adjacent elongated solar cells 402. The modified reflectors 1404 are equipped with a strong reflective property such that incident light is effectively reflected off the side surfaces 1910 of the reflectors 1404. In some embodiments, the reflected light off surfaces 1910 does not have directional preference. In other embodiments, the reflector surfaces 1910 are designed such that the reflected light is directed towards the elongated solar cell 402 for optimal absorbance.

Referring to FIG. 17 as a guide, in some embodiments in accordance with the present invention, connections between elongated solar cells 402 and internal reflectors 1404 may be provided by indentation on internal reflectors 1404. Such indentations are not shown in FIG. 17. However, FIG. 17 does illustrate how each internal reflector interfaces with two adjacent elongated solar cells. In some embodiments, the edges on internal reflectors 1404 that contact the sides of the elongated solar cells 402 are shaped or molded so that the resulting indentations on internal reflectors 1404 accommodate the circular cross-sectional shape of adjacent elongated solar cells 402. In some embodiments, elongated solar cells 402 do not have a circular cross-section. Nonetheless, indentations on internal reflectors 1404 may be formed so that the internal reflectors 1404 accommodate the cross-sectional shape of elongated solar cells 402.

In some embodiments the above-described molded internal reflector design 1404 enhances the electrical connectivity between an internal reflector and its adjacent elongated solar cells 402. Accordingly, in some embodiments, the internal reflector is coated with an electrically conducing reflective material, such as aluminum or silver, that facilitates the action of counter-electrode 420. In such instances, the lobe of internal reflector 1404 facing or electrically connected to the first of the two elongated solar cells 402 must be electrically isolated from the lobe of internal reflector 1404 facing or electrically connected to the second of the two elongated solar cells to which the reflector is adjoined. Such electrical isolation can be achieved by interrupting the layer of conductive material at the top and bottom apex of internal reflector 1404.

Such electrical isolation can also be achieved by inserting a central electrically insulating portion within internal reflector 1404 that electrically isolates the two halves of the reflector from each other. In this way, the advantageous serial connectivity of the elongated solar cells is maintained. In some embodiments, the molded internal reflector design can be used to remove a need for discrete counter-electrode wires 420 on elongated solar cells 402. Thus, in some embodiments of the present invention, grooves 677 such as found in FIG. 18 are not necessary and counter-electrode strips (or wires) 420 are not present. Rather, each electrically isolated half of internal reflector 1404 serves as a counter-electrode.

In some embodiments, the connection between an internal reflector 1404 and an adjacent elongated solar cell is provided by an additional adaptor piece. Such an adapter piece has surface features that are complementary to both the shapes of internal reflectors 1404 as well as elongated solar cells 402 in order to provide a tight fit between such components. In some embodiments, such adaptor pieces are fixed on internal reflectors 1404. In other embodiments, the adaptor pieces are fixed on elongated solar cells 402. In additional embodiments, the connection between elongated solar cells 402 and reflectors 1404 may be strengthened by electrically conducting glue or tapes.

Diffuse Reflection.

Figure 24A:
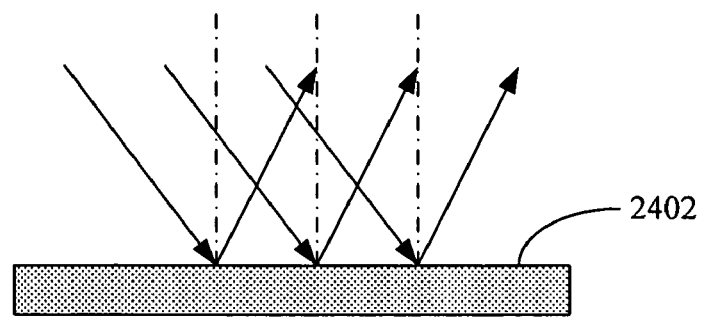
FIG. 24A illustrates light reflection on a specular surface.
Figure 24B:
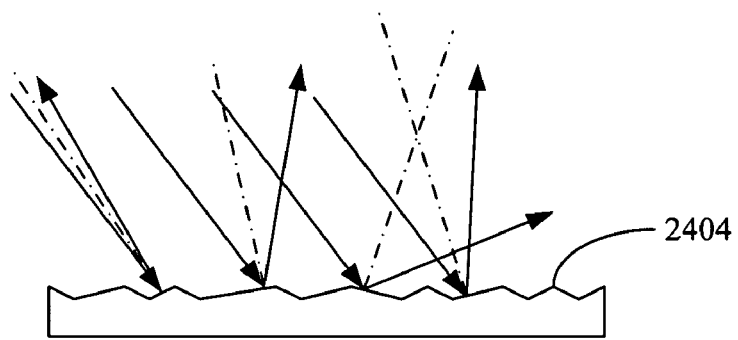
FIG. 24B illustrates light reflection on a diffuse surface.

In some embodiments in accordance with the present invention, the side surface 1910 of reflector 1404 is a diffuse reflecting surface (e.g. 1910 in FIG. 19). The concept of diffuse reflection can be better appreciated with a first understanding of the concept of specular reflection. Specular reflection is defined as the reflection off smooth surfaces such as mirrors or a calm body of water (e.g. 2402 in FIG. 24A). On a specular surface, light is reflected off mainly in the direction of the reflected ray and is attenuated by an amount dependent upon the physical properties of the surface. Since the light reflected from the surface is mainly in the direction of the reflected ray, the position of the observer (e.g. the position of the elongated solar cells 402) determines the perceived illumination of the surface. Specular reflection models the light reflecting properties of shiny or mirror-like surfaces. In contrast to specular reflection, reflection off rough surfaces such as clothing, paper, and the asphalt roadway leads to a different type of reflection known as diffuse reflection (FIG. 24B). Light incident on a diffuse reflection surface is reflected equally in all directions and is attenuated by an amount dependent upon the physical properties of the surface. Since light is reflected equally in all directions the perceived illumination of the surface is not dependent on the position of the observer or receiver of the reflected light (e.g. the position of the elongated solar cell 402). Diffuse reflection models the light reflecting properties of matt surfaces.

Diffuse reflection surfaces reflect off light with no directional dependence for the viewer. Whether the surface is microscopically rough or smooth has a tremendous impact upon the subsequent reflection of a beam of light. Input light from a single directional source is reflected off in all directions on a diffuse reflecting surface (e.g. 2404 in FIG. 24B). Diffuse reflection originates from a combination of internal scattering of light, e.g. the light is absorbed and then re-emitted, and external scattering from the rough surface of the object.

Lambertian Reflection.

Figure 24C:
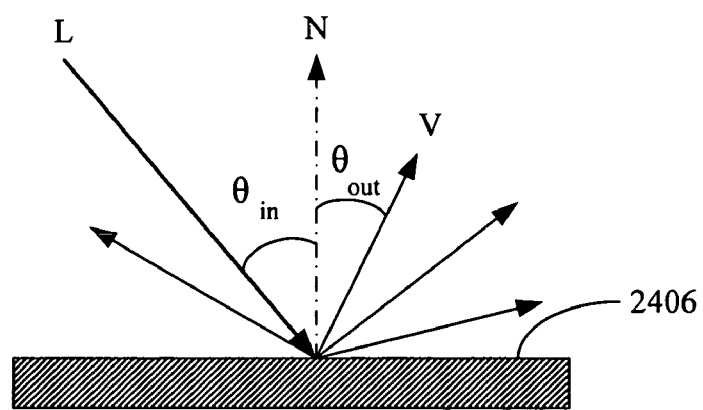
FIG. 24C illustrates light reflection on a Lambertian surface.

In some embodiments in accordance with the present invention, surface 1910 of reflector 1404 is a Lambertian reflecting surface (e.g. 2406 in FIG. 24C). A Lambertian source is defined as an optical source that obeys Lambert's cosine law, i.e., that has an intensity directly proportional to the cosine of the angle from which it is viewed (FIG. 24C). Accordingly, a Lambertian surface is defined as a surface that provides uniform diffusion of incident radiation such that its radiance (or luminance) is the same in all directions from which it can be measured (e.g., radiance is independent of viewing angle) with the caveat that the total area of the radiating surface is larger than the area being measured.

On a perfectly diffusing surface, the intensity of the light emanating in a given direction from any small surface component is proportional to the cosine of the angle of the normal to the surface. The brightness (luminance, radiance) of a Lambertian surface is constant regardless of the angle from which it is viewed.

The incident light $\vec{l}$ strikes a Lamertian surface (FIG. 24C) and reflects in different directions. When the intensity of $\vec{l}$ is defined as $I_{in}$, the intensity (e.g. $I_{out}$) of a reflected light $\vec{v}$ can be defined as following in accordance to Lambert's cosine law:

$$I_{out}(\vec{v}) = I_{in}(\vec{l})\varphi(\vec{v},\vec{l})\frac{\cos\theta_{in}}{\cos\theta_{out}}$$

where $\Phi(\vec{v},\vec{l})=k_d \cos\theta_{out}$ and $k_d$ is related to the surface property. The incident angle is defined as $\theta_{in}$, and the reflected angle is defined as $\theta_{out}$. Using the vector dot product formula, the intensity of the reflected light can also be written as:

$$I_{out}(\vec{v})=k_d I_{in}(\vec{l})\vec{l}\cdot\vec{n},$$

where $\vec{n}$ denotes a vector that is normal to the Lambertian surface.

Such a Lambertian surface does not lose any incident light radiation, but re-emits it in all the available solid angles with a $2\pi$ radians, on the illuminated side of the surface. Moreover, a Lambertian surface emits light so that the surface appears equally bright from any direction. That is, equal projected areas radiate equal amounts of luminous flux. Though this is an ideal, many real surfaces approach it. For example, a Lambertian surface can be created with a layer of diffuse white paint. The reflectance of such a typical Lambertian surface may be 93%. In some embodiments, the reflectance of a Lambertian surface may be higher than 93%. In some embodiments, the reflectance of a Lambertian surface may be lower than 93%. Lambertian surfaces have been widely used in LED design to provide optimized illumination, for example in U.S. Pat. No. 6,257,737 to Marshall, et al.; U.S. Pat. No. 6,661,521 to Stem; and U.S. Pat. No. 6,603,243 to Parkyn, et al., which are hereby incorporated by reference in their entireties.

Advantageously, Lambertian surfaces 1910 on reflector 1404 effectively reflect light in all directions. The reflected light is then directed towards the elongated solar cell 402 to enhance solar cell performance.

Reflection on Involute Surfaces.

Figure 25A:
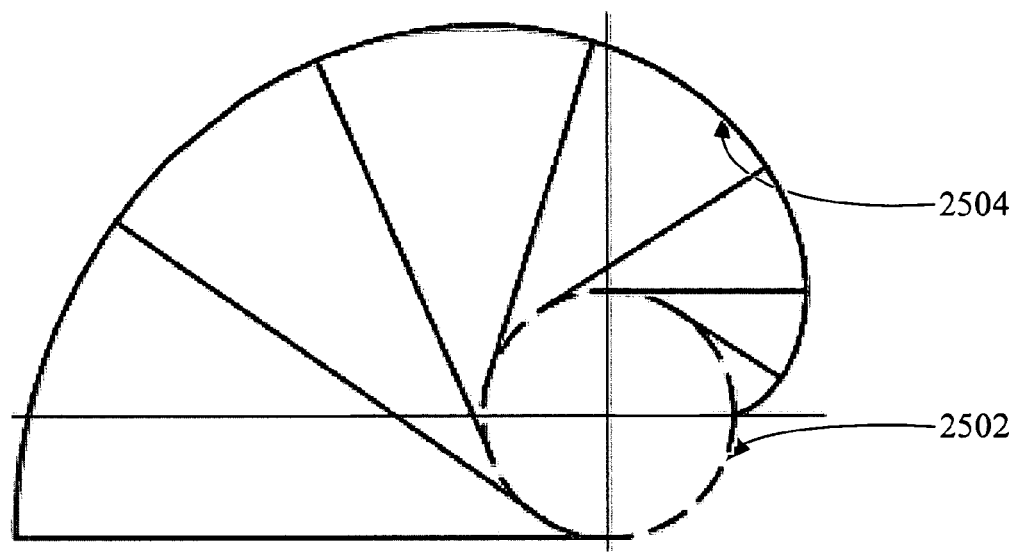
FIG. 25A illustrates a circle and an involute of the circle.

In some embodiments in accordance with the present invention, surface 1910 of the reflector 1404 is an involute surface of the elongated solar cell tube 402 (e.g. 2504 in FIG. 25A). In some embodiments, the elongated solar cell tube 402 is circular or near circular. The reflector surface 1910 is preferably the involute of a circle (e.g. 2504 in FIG. 25A). The involute of circle 2502 is defined as the path traced out by a point on a straight line that rolls around a circle. For example, the involute of a circle can be drawn in the following steps. First, attach a string to a point on a curve. Second, extend the string so that it is tangent to the curve at the point of attachment. Third, wind the string up, keeping it always taut. The locus of points traced out by the end of the string (e.g. 2504 in FIG. 25) is called the involute of the original circle 2502. The original circle 2502 is called the evolute of its involute curve 2504.

Although in general a curve has a unique evolute, it has infinitely many involutes corresponding to different choices of initial point. An involute can also be thought of as any curve orthogonal to all the tangents to a given curve. For a circle of radius r, at any time t, its equation can be written as:

$x = r \cos t$ $y = r \sin t$

Correspondingly, the parametric equation of the involute of the circle is:

$x_i = r(\cos t + t \sin t)$ $y_i = r(\sin t - t \cos t)$

Evolute and involute are reciprocal functions. The evolute of an involute of a circle is a circle.

Involute surfaces have been implemented in numerous patent designs to optimize light reflections. For example, a flash lamp reflector (U.S. Pat. No. 4,641,315 to Draggoo, hereby incorporated by reference in its entirety) and concave light reflector devices (U.S. Pat. No. 4,641,315 to Rose, hereby incorporated by reference in its entirety), which are hereby incorporated by reference in their entireties, both utilize involute surfaces to enhance light reflection efficiency.

Figure 25B:
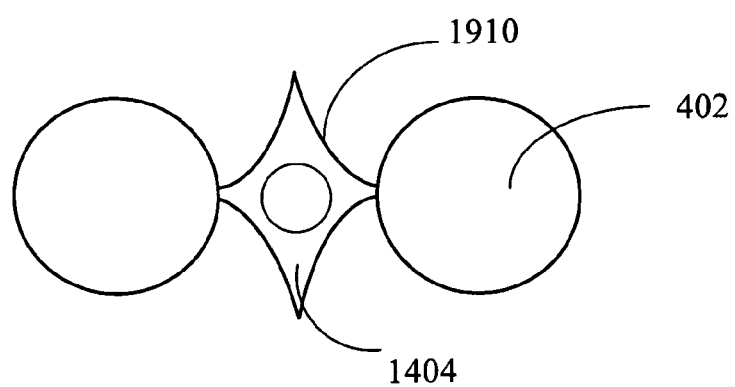
FIG. 25B illustrates a cross sectional view of a solar cell architecture in accordance with an embodiment of the present invention.

In FIG. 25B, an internal reflector 1404 is connected to two elongated solar cells 402. Details of both reflector 1404 and solar cell 402 are omitted to highlight the intrinsic relationship between the shapes of the elongated solar cell 402 and the shape of the side surface 1910 of the internal reflector 1404. Side surfaces 1910 are constructed such that they are the involute of the circular elongated solar cell 402.

Advantageously, the involute-evolute design imposes optimal interactions between the side surfaces 1910 of reflectors 1404 and the adjacent elongated solar cell 402. When the side surface 1910 of the reflector 1404 is an involute surface corresponding to the elongated solar cell 402 that is adjacent or attached to the reflector 1404, light reflects effectively off the involute surface in a direction that is optimized towards the elongated solar cell 402.

Conductive Paint.

In some embodiments in accordance with the present invention, a layer of conductive paint is deposited on surfaces 1910 of reflectors 1404. In other embodiments, a layer of some other form of conductive reflective material such as aluminum or silver is deposited on surfaces 1910 of reflectors 1404. The conductive material on surface 1910 helps to conduct electric current along elongated solar cell 402. By way of illustration, the methods and designs of only one side-surface 1910 will be described in detail in the following description. The methods and designs, however, apply to all such surfaces.

In embodiments where surfaces 1910 are coated with conductive material, the part of counter-electrodes 420 that run along grooves 677 may be minimized or even omitted. The protruding parts of counter-electrodes 420, however, remain in the design even when counter-electrodes 420 are omitted. In embodiments where counter-electrodes 420 do run the entire length of elongated solar cells 402, the free electrons are conducted by the conductive surfaces 1910. Furthermore, in embodiments where counter-electrodes 420 do not run the entire length of elongated solar cells 402, grooves 677 can be omitted.

As depicted in FIGS. 19 through 23, reflectors 1404 have a cross-sectional shape that is astroid shape with four equal reflecting sides. However, it will be appreciated that, although the illustrated symmetrical astroid design is advantageous, the present invention is not restricted or limited to such cross-sectional shapes.

In embodiments not illustrated in FIGS. 19 through 23, elongated solar cells 402 are swaged at their ends such that the diameter at the ends is less than the diameter towards the center of such cells. Electrodes 440 are placed on these swaged ends.

Solar Cell Assembly.

As illustrated in FIG. 19, solar cells in the plurality of elongated solar cells 402 are geometrically arranged in a parallel or near parallel manner. In some embodiments, each internal reflector 1404 connects to two elongated solar cells 402, for example, in the manner illustrated in FIGS. 19 through 23. Because of this, elongated solar cells 402 are effectively joined into a single composite device. The way in which internal reflectors 1404 interface with elongated solar cells 402, in accordance with some embodiments of the present invention, is seen more clearly in FIG. 17, which illustrates a cross-sectional view of a solar cell assembly 1400 drawn with respect to line 17-17' of FIG. 14. Although the solar cell assembly 1900 (FIG. 19) differs from the solar cell assembly 1400 (FIG. 14), a cross-sectional view of some embodiments of solar cell assembly 1900 will be highly similar, if not identical, to that shown in FIG. 17.

Figure 20:
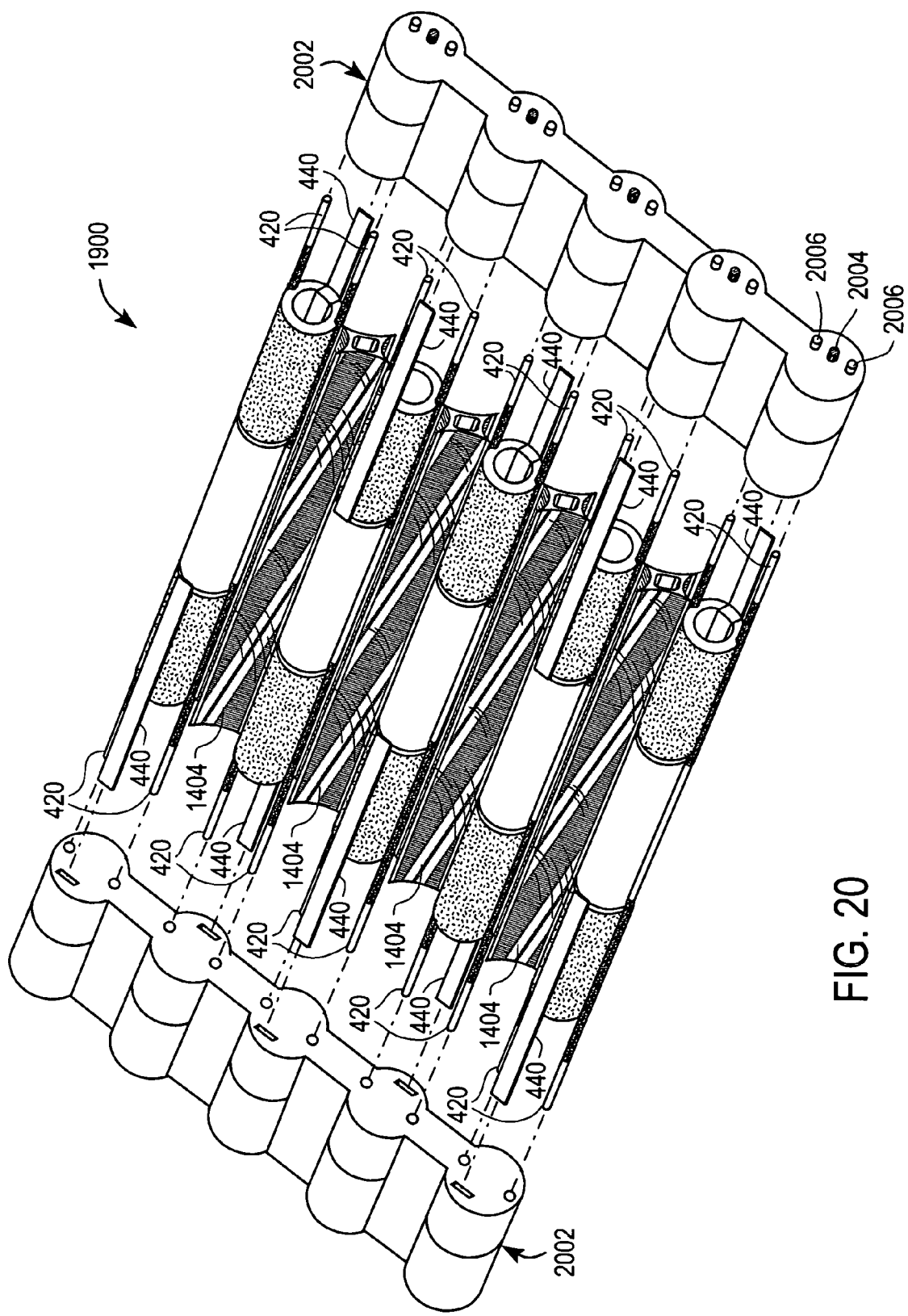
FIG. 20 illustrates a perspective view of a solar cell architecture and two circuit board capping modules, in accordance with an embodiment of the present invention.

In FIG. 19, electrodes 440 extend the connection from the conductive core 404/1304. In FIG. 20, electrodes 440 and counter-electrodes 420 are connected to end capping modules 2002. End capping modules 2002 are circuit board based devices that provide a platform for serial electrical connection between electrodes 440 and counter-electrodes 420. End capping modules 2002 contain slots for electrodes 440 and counter-electrodes 420 and provide connection between electrodes 440 and counter-electrodes 420 (e.g. as shown in FIG. 20). In FIG. 20, end capping modules 2002 contact electrodes 440 and counter-electrodes 420 of the elongated solar cell 402 simultaneously.

In some embodiments, elongated conductive core 404 is any of the dual layer cores described in Section 5.4. In such embodiments, the terminal ends of elongated solar cells 402 can be stripped down to either the inner core or the outer core. For example, consider the case in which elongated solar cell 402 is constructed out of an inner core made of aluminum and an outer core made of molybdenum. In such a case, the end of elongated solar cell 402 can be stripped down to the molybdenum outer core and the electrode 440 electrically connected with this outer core. Alternatively, the end of elongated solar cell 402 can be stripped down to the aluminum inner core and the electrodes 440 electrically connected with this inner core.

Referring back to FIG. 20, in some embodiments, the end capping module 2002 is a circuit board based module that provides electrical communication between the electrodes 440 and counter-electrodes 420 at both ends of the elongated solar cells 402. End capping modules 2002 contain slots into which electrodes 420 and 440 fit. Two end capping modules are associated with each solar cell assembly. On the end capping modules 2002, connection points 2006 correspond to counter-electrodes 420, and connection points 2004 correspond to electrodes 440. Electrical communication can be established by linking 2004 and 2006 in a serial connection. Electrical leads within capping module 2002 (not shown) make such connections.

Figure 21:
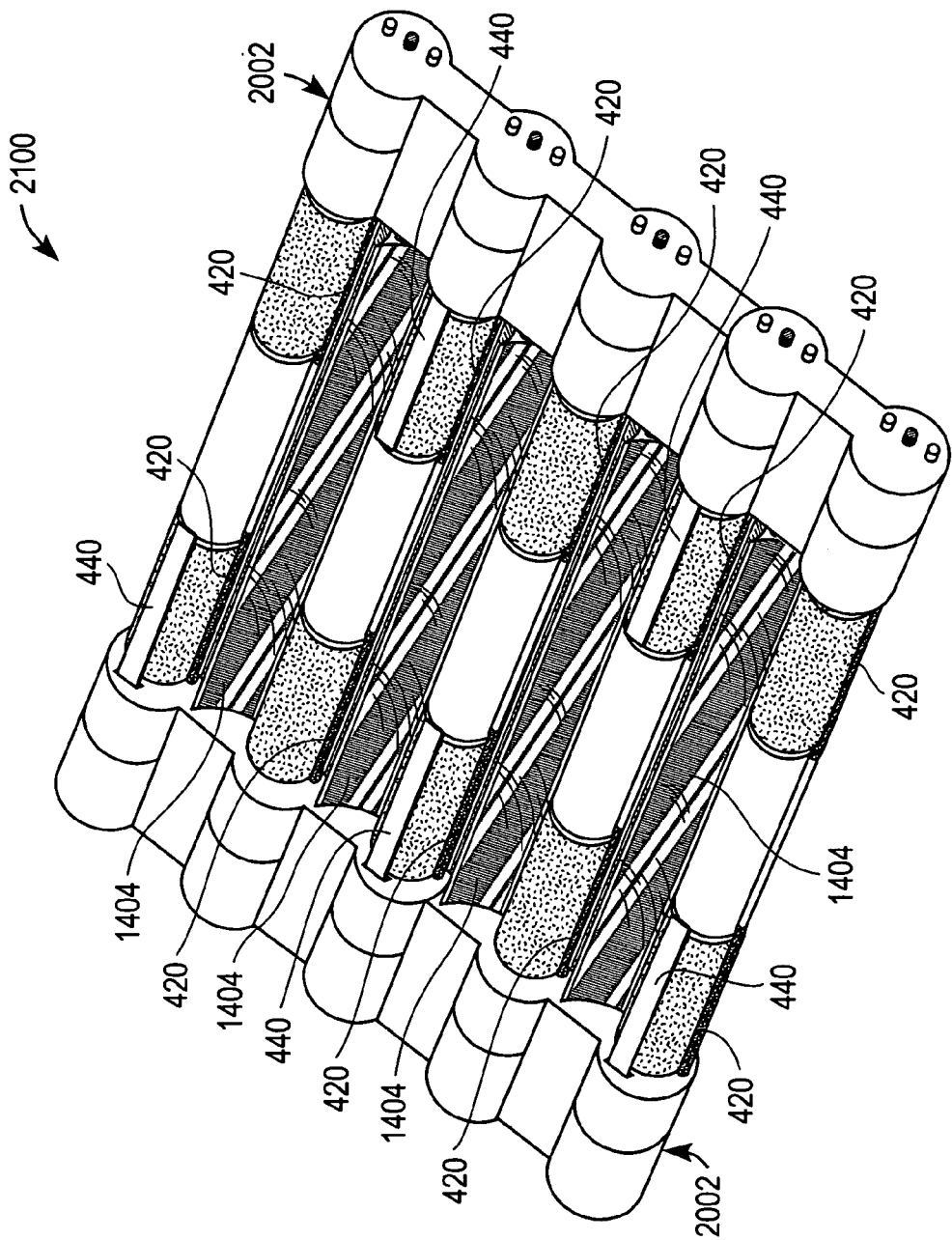
FIG. 21 illustrates a perspective view of a solar cell architecture whose electrodes connect adjacent solar cells in series through circuit board capping modules, in accordance with an embodiment of the present invention.
Figure 22:
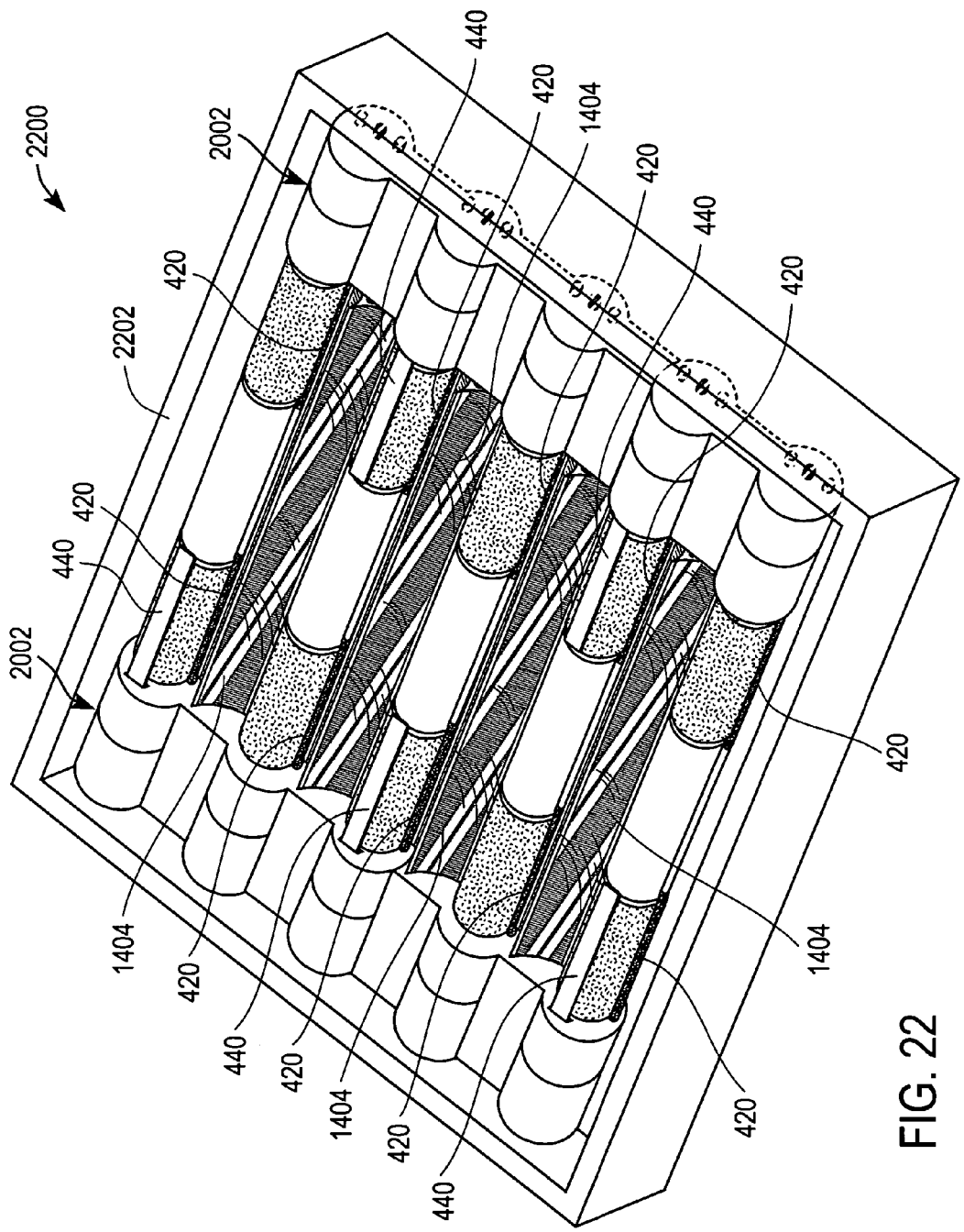
FIG. 22 illustrates a perspective view of a capped solar cell architecture contained in a support frame, in accordance with an embodiment of the present invention.
Figure 23:
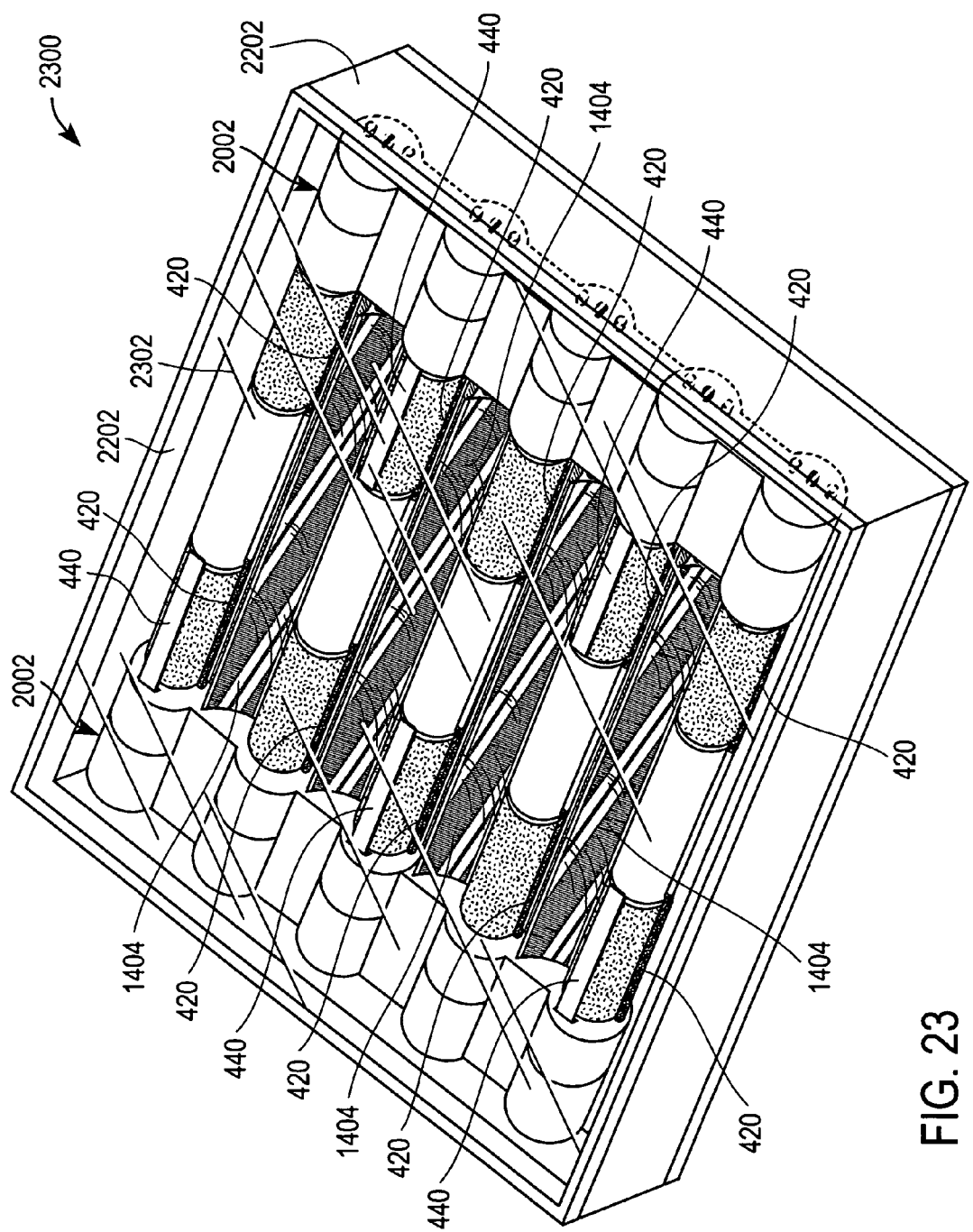
FIG. 23 illustrates a perspective view of a capped and sealed solar cell architecture contained in a support frame, in accordance with an embodiment of the present invention.

Referring to FIG. 21, the end capping modules 2002 are attached to both ends of the solar cell-reflector assembly 1900 to form a completely capped solar cell assembly 2100. Referring to FIG. 22, the capped solar cell assembly 2100 is placed into an assembly frame 2202. Assembly frame 2202 provides a structure for the solar cell assembly 1900. Assembly frame 2202 can be made of any transparent material, such as plastic or glass. Referring to FIG. 23, the entire assembly is sealed between sheets of EVA. Then, not shown, the assembly is sandwiched between plates of a rigid substrate, such as glass or polyvinyl fluoride products (e.g., Tedlar or Tefzel).

7. REFERENCES CITED

All references cited herein are incorporated herein by reference in their entirety and for all purposes to the same extent as if each individual publication or patent or patent application was specifically and individually indicated to be incorporated by reference in its entirety for all purposes.

Many modifications and variations of this invention can be made without departing from its spirit and scope, as will be apparent to those skilled in the art. For example, in some embodiments the TCO 412 is circumferentially coated with an antireflective coating. In some embodiments, this antireflective coating is made of $MgF_2$. Counter-electrodes 420 formed in divots in elongated solar cells 402 have been described. However, the invention is not limited to such solar cell 402/counter-electrode 420 arrangements. Rather, in some embodiments, counter-electrodes 420 are formed on the sides of elongated solar cells 402 using evaporated metal. The specific embodiments described herein are offered by way of example only, and the invention is to be limited only by the terms of the appended claims, along with the full scope of equivalents to which such claims are entitled.

What is claimed:

1. A solar cell assembly comprising:
   (A) a plurality of elongated solar cells, wherein elongated solar cells in said plurality of elongated solar cells are arranged in a parallel or a near parallel manner thereby forming a planar array having a first face and a second face; and
   (B) a plurality of internal reflectors, wherein each respective internal reflector in the plurality of internal reflectors is configured between an adjacent first and second elongated solar cell in said plurality of elongated solar cells such that a portion of the solar light reflected from the respective internal reflector is reflected onto the adjacent first and second elongated solar cell, wherein a portion of the solar light reflected from the respective internal reflector onto the first elongated solar cell is received from both a side of said solar cell assembly that includes said first face of said planar array and a side of said solar cell assembly that includes said second face of said planar array.

2. The solar cell assembly of claim 1, wherein each elongated solar cell in said plurality of elongated solar cells comprises:
   an elongated conductive core configured as a first electrode;
   a semiconductor junction circumferentially disposed on said elongated conductive core; and
   a transparent conductive oxide layer disposed on said semiconductor junction.

3. The solar cell assembly of claim 1, the solar cell assembly further comprising:
   (C) a plurality of metal counter-electrodes, wherein each respective elongated solar cell in said plurality of elongated solar cells is bound to a first corresponding metal counter-electrode in said plurality of metal counter-electrodes such that the first metal counter-electrode lies in a first groove that runs lengthwise on the respective elongated solar cell.

4. The solar cell assembly of claim 1, wherein an internal reflector in said plurality of internal reflectors has a hollow core.

5. The solar cell assembly of claim 1, wherein an internal reflector in said plurality of internal reflectors comprises a plastic casing with a layer of reflective material deposited on said plastic casing.

6. The solar cell assembly of claim 5, wherein the layer of reflective material is polished aluminum, aluminum alloy, silver, nickel or steel.

7. The solar cell assembly of claim 1, wherein an internal reflector in said plurality of internal reflectors is a single piece made out of a reflective material.

8. The solar cell assembly of claim 7, wherein the reflective material is polished aluminum, aluminum alloy, silver, nickel or steel.

9. The solar cell assembly of claim 1, wherein an internal reflector in said plurality of internal reflectors comprises a plastic casing onto which is layered a metal foil tape.

10. The solar cell assembly of claim 9, wherein the metal foil tape is aluminum foil tape.

11. The solar cell assembly of claim 1, wherein a cross-sectional shape of an internal reflector in said plurality of internal reflectors is astroid.

12. The solar cell assembly of claim 1, wherein
    a cross-sectional shape of an internal reflector in said plurality of internal reflectors is four-sided; and
    a side of said four-sided cross-sectional shape is linear.

13. The solar cell assembly of claim 1, wherein
    a cross-sectional shape of an internal reflector in said plurality of internal reflectors is four-sided; and
    a side of said four-sided cross-sectional shape is parabolic.

14. The solar cell assembly of claim 1, wherein
    a cross-sectional shape of an internal reflector in said plurality of internal reflectors is four-sided; and
    a side of said four-sided cross-sectional shape is concave.

15. The solar cell assembly of claim 1, wherein
    a cross-sectional shape of an internal reflector in said plurality of internal reflectors is four-sided; and
    a side of said four-sided cross-sectional shape is circular or elliptical.

16. The solar cell assembly of claim 1, wherein
    a cross-sectional shape of an internal reflector in said plurality of internal reflectors is four-sided; and
    a side of said four-sided cross-sectional shape defines a diffuse surface on said internal reflector.

17. The solar cell assembly of claim 1, wherein
    a cross-sectional shape of an internal reflector in said plurality of internal reflectors is four-sided; and
    a side of said four-sided cross-sectional shape is faceted.

18. The solar cell assembly of claim 3, wherein
    each respective elongated solar cell in said plurality of elongated solar cells is bound to a second corresponding metal counter-electrode in said plurality of metal counter-electrodes such that the second metal counter-electrode lies in a second groove that runs lengthwise on the respective elongated solar cell.

19. The solar cell assembly of claim 18, wherein
a first portion of an internal reflector in the plurality of internal reflectors is in electrical communication with the first counter-electrode in the first groove of the first elongated solar cell in said plurality of elongated solar cells that corresponds to said internal reflector;
a second portion of the internal reflector is in electrical communication with the second counter-electrode in the second groove of the second elongated solar cell in said plurality of elongated solar cells that corresponds to said internal reflector; and
the first portion of the internal reflector and the second portion of the internal reflector are electrically isolated from each other.

20. The solar cell assembly of claim 19, wherein said internal reflector is sealed to said first counter-electrode and said second counter-electrode by an electrically conductive glue or ink.

21. The solar cell assembly of claim 19, wherein the internal reflector comprises an insulative core with a layer of reflective material deposited on said insulative core, and wherein
the first portion of the internal reflector is a first portion of the layer of reflective material;
the second portion of the internal reflector is a second portion of the layer of reflective material; and
the first portion and the second portion of the internal reflector are electrically isolated from each other by a first and second break in the layer of reflective material.

22. The solar cell assembly of claim 1, wherein
a first portion of an internal reflector in the plurality of internal reflectors is in electrical communication with the first elongated solar cell in said plurality of elongated solar cells that corresponds to said internal reflector;
a second portion of the internal reflector is in electrical communication with the second elongated solar cell in said plurality of elongated solar cells that corresponds to said internal reflector; and
the first portion of the internal reflector and the second portion of the internal reflector are electrically isolated from each other.

23. The solar cell assembly of claim 22, wherein said internal reflector is sealed to said first elongated solar cell and said second elongated solar cell by an electrically conductive glue or ink.

24. The solar cell assembly of claim 22, wherein the internal reflector comprises an insulative core with a layer of reflective material deposited on said insulative core, and wherein
the first portion of the internal reflector is a first portion of the layer of reflective material;
the second portion of the internal reflector is a second portion of the layer of reflective material; and
the first portion and the second portion of the internal reflector are electrically isolated from each other by a first and second break in the layer of reflective material.

25. The solar cell assembly of claim 18, wherein an internal reflector in the plurality of internal reflectors has a first edge and a second edge, wherein said first edge and said second edge run lengthwise along said internal reflector; and wherein
(i) the first edge of the internal reflector contacts the first counter-electrode in the first groove of the first elongated solar cell in said plurality of elongated solar cells that corresponds to said internal reflector; and
(ii) the second edge of the internal reflector contacts the second counter-electrode in the second groove of the second elongated solar cell in said plurality of elongated solar cells that corresponds to said internal reflector.

26. The solar cell assembly of claim 25, wherein said first edge is sealed to said first counter-electrode and said second edge is sealed to said second counter-electrode by an electrically conductive glue or ink.

27. The solar cell assembly of 25, wherein said first edge is sealed to said first counter-electrode and said second edge is sealed to said second counter-electrode by a transparent insulator.

28. The solar cell assembly of claim 27, wherein said transparent insulator is ethylene vinyl acetate or spray Teflon.

29. The solar cell assembly of claim 1, wherein an internal reflector in the plurality of internal reflectors has a first edge and a second edge, wherein said first edge and said second edge run lengthwise along said internal reflector; and wherein
(i) the first edge of the internal reflector contacts the first elongated solar cell in said plurality of elongated solar cells that corresponds to said internal reflector; and
(ii) the second edge of the internal reflector contacts the second elongated solar cell in said plurality of elongated solar cells that corresponds to said internal reflector.

30. The solar cell assembly of claim 29, wherein said first edge is sealed to said first elongated solar cell and said second edge is sealed to said second elongated solar cell by an electrically conductive glue or ink.

31. The solar cell assembly of claim 29, wherein said first edge is sealed to said first elongated solar cell and said second edge is sealed to said second elongated solar cell by a transparent insulator.

32. The solar cell assembly of claim 31, wherein said transparent insulator is ethylene vinyl acetate or spray Teflon.

33. The solar cell assembly of claim 1, wherein a cross-sectional shape of all or a portion of the elongated solar cells in said plurality of elongated solar cells is oval.

34. The solar cell assembly of claim 1, wherein a length of an elongated solar cell in said plurality of elongated solar cells is between 0.5 meters and 2 meters.

35. The solar cell assembly of claim 3, wherein a cross-sectional area of a metal counter-electrode in said plurality of metal counter-electrodes is between 0.5 square millimeters and 1.5 square millimeters.

36. The solar cell assembly of claim 1, wherein a first elongated solar cell and a second elongated solar cell in the plurality of elongated solar cells are electrically connected in series.

37. The solar cell assembly of claim 1, wherein
said plurality of elongated solar cells is configured to receive direct light from said first face and said second face of said planar array.

38. The solar cell assembly of claim 2, wherein the semiconductor junction of an elongated solar cell in said plurality of elongated solar cells is a homojunction, a heterojunction, a heteroface junction, a buried homojunction, or a p-i-n junction.

39. The solar cell assembly of claim 2, wherein there is an intrinsic layer disposed between the semiconductor junction and the transparent conductive oxide in an elongated solar cell in said plurality of elongated solar cells.

40. The solar cell assembly of claim 39, wherein the intrinsic layer is formed by an undoped transparent oxide.

41. The solar cell assembly of claim 39, wherein the intrinsic layer is made of metal oxide.

42. The solar cell assembly of claim 2, wherein the semiconductor junction of an elongated solar cell in the plurality of elongated solar cells comprises:

an inner coaxial layer; and an outer coaxial layer, wherein said outer coaxial layer comprises a first conductivity type and said inner coaxial layer comprises a second, opposite, conductivity type.

43. The solar cell assembly of claim 42, wherein said inner coaxial layer comprises copper-indium-gallium-diselenide (CIGS).

44. The solar cell assembly of claim 42, wherein said outer coaxial layer comprises CdS, $SnO_2$, ZnO, $ZrO_2$, or doped ZnO.

45. The solar cell assembly of claim 2, wherein said elongated conductive core is made of aluminum, molybdenum, steel, nickel, silver, gold, an alloy thereof, or any combination thereof.

46. The solar cell assembly of claim 2, wherein the transparent conductive oxide layer of an elongated solar cell in said plurality of elongated solar cells is made of tin oxide $SnO_x$, with or without fluorine doping, indiumtin oxide (ITO), indium-zinc oxide, doped zinc oxide (ZnO) or a combination thereof.

47. The solar cell assembly of claim 2, wherein the elongated conductive core of all or a portion of the elongated solar cells in the plurality of elongated solar cells is hollowed.

48. The solar cell assembly of claim 47, where air, nitrogen, or helium is blown through all or a portion of the elongated solar cells in the plurality of elongated solar cells.

49. The solar cell assembly of claim 1, wherein an elongated solar cell in said plurality of elongated solar cells is rod-shaped.

50. The solar cell assembly of claim 2, wherein an elongated solar cell in said plurality of elongated solar cells further comprises an antireflective coating that is circumferentially disposed on the transparent conductive oxide layer of the elongated solar cell.

51. The solar cell assembly of claim 50, wherein said antireflective coating is made of $MgF_2$.

52. The solar cell assembly of claim 2, wherein the elongated conductive core of an elongated solar cell in said plurality of elongated solar cells comprises:

an inner core made of a nonmetallic material; and a conductive outer core circumferentially disposed on said inner core.

53. The solar cell assembly of claim 52, wherein said inner core is tubing.

54. The solar cell assembly of claim 52, wherein said inner core is made of polybenzamidazole, polymide, polytetrafluoroethylene, polyetheretherketone, polyamide-imide, glass-based phenolic, polystyrene, cross-linked polystyrene, polyester, polycarbonate, polyethylene, polyethylene, acrylonitrile-butadiene-styrene, polytetrafluoro-ethylene, polymethacrylate, nylon 6,6, cellulose acetate butyrate, cellulose acetate, rigid vinyl, plasticized vinyl, or polypropylene.

55. The solar cell assembly of claim 52, wherein said inner core is glass tubing.

56. A plurality of solar cell assemblies, each solar cell assembly in the plurality of solar cells assemblies having the structure of the solar cell assembly of claim 1, wherein solar cell assemblies in said plurality of solar assemblies are arranged in rows on a surface having an albedo that exceeds 80%.

57. A plurality of solar cell assemblies, each solar cell assembly in the plurality of solar cells assemblies having the structure of the solar cell assembly of claim 1, wherein solar cell assemblies in said plurality of solar assemblies are arranged on a surface having an albedo that exceeds 95%.

58. A plurality of solar cell assemblies, each solar cell assembly in the plurality of solar cells assemblies having the structure of the solar cell assembly of claim 1, wherein solar cell assemblies in said plurality of solar assemblies are arranged on a Lambertian, diffuse or involute reflector surface.

59. The plurality of solar cell assemblies of claim 58 wherein the Lambertian, diffuse or involute reflector surface is painted white.

60. The solar cell assembly of claim 2, wherein an elongated conductive core of an elongated solar cell in said plurality of elongated solar cells is metal tubing.

61. The solar cell assembly of claim 1, wherein each elongated solar cell in said plurality of elongated solar cells comprises:

an elongated conductive core configured as a first electrode, wherein a terminal lead is attached to said first electrode; and a semiconductor junction circumferentially disposed on said elongated conductive core.

62. The solar cell assembly of claim 61, wherein a transparent conductive oxide layer is disposed on each said semiconductor junction.

63. The solar cell assembly of claim 61, wherein the solar cell assembly further comprises:

(C) a plurality of metal counter-electrodes, wherein each respective elongated solar cell in said plurality of elongated solar cells is bound to a first corresponding metal counter-electrode and a second corresponding metal counter-electrode in said plurality of metal counter-electrodes such that:

the first corresponding metal counter-electrode lies in a first groove that runs lengthwise on the respective elongated solar cell; and the second corresponding metal counter-electrode lies in a second groove that runs lengthwise on the respective elongated solar cell; and (D) a plurality of electrical contacts, each electrical contact in said plurality of electrical contacts electrically contacting the metal counter-electrodes of a first elongated solar cell in said plurality of elongated solar cells with the terminal lead that is attached to the first electrode of a second elongated solar cell in said plurality of elongated solar cells.

64. The solar cell assembly of claim 63, wherein the plurality of electrical contacts are embedded in a circuit board that attaches to an end of the solar cell assembly.

65. The solar cell assembly of claim 63, wherein first portion of the plurality of the plurality of electrical contacts are embedded in a first circuit board that attaches to a first end of the solar cell assembly; and a second portion of the plurality of electrical contacts are embedded in a second circuit board that attaches to a second end of the solar cell assembly.

66. The solar cell assembly of claim 61, wherein a first portion of each respective internal reflector in the plurality of internal reflectors is in electrical communication with the first elongated solar cell in said plurality of elongated solar cells that corresponds to said respective internal reflector, wherein the first portion of each respective internal reflector in the plurality of internal reflectors serves as a first counter-electrode to the first elongated solar cell in said plurality of elongated solar cells that corresponds to said respective internal reflector;

a second portion of each respective internal reflector in the plurality of internal reflectors is in electrical communication with the second elongated solar cell in said plurality of elongated solar cells that corresponds to said internal reflector; wherein the second portion of each respective internal reflector in the plurality of internal reflectors serves as a second counter-electrode to the second elongated solar cell in said plurality of elongated solar cells that corresponds to said respective internal reflector; and wherein the first portion and the second portion of each respective internal reflector in said plurality of internal reflectors are electrically isolated from each other.

67. The solar cell assembly of claim 66, wherein the solar cell assembly further comprises:
(C) a plurality of electrical contacts, each electrical contact in said plurality of electrical contacts electrically contacting the first and second counter-electrodes of a first elongated solar cell in said plurality of elongated solar cells with the terminal lead that is attached to the first electrode of a second elongated solar cell in said plurality of elongated solar cells.

68. The solar cell assembly of claim 67, wherein the plurality of electrical contacts are embedded in a circuit board that attaches to a first end of the solar cell assembly.

69. The solar cell assembly of claim 67, wherein
a first portion of the plurality of electrical contacts are embedded in a first circuit board that attaches to a first end of the solar cell assembly; and
a second portion of the plurality of electrical contacts are embedded in a second circuit board that attaches to a second end of the solar cell assembly.

70. The solar cell assembly of claim 1, wherein a cross-sectional shape of an internal reflector in said plurality of internal reflectors is four-sided and wherein a side of said four-sided cross-sectional shape is the involute of a cross-sectional shape of an elongated solar cell in said plurality of elongated solar cells.

71. A solar cell assembly comprising:
(A) a plurality of elongated solar cells, each elongated solar cell in said plurality of elongated solar cells comprising:
an elongated conductive core configured as a first electrode;
a semiconductor junction circumferentially disposed on said elongated conductive core; and
a transparent conductive oxide layer disposed on said semiconductor junction;
wherein elongated solar cells in said plurality of elongated solar cells are arranged in a parallel or a near parallel manner thereby forming a planar array having a first face and a second face;
(B) a plurality of metal counter-electrodes, wherein each respective elongated solar cell in said plurality of elongated solar cells is bound to a first corresponding metal counter-electrode and a second corresponding metal counter-electrode in said plurality of metal counter-electrodes such that
the first corresponding metal counter-electrode lies in a first groove that runs lengthwise on the respective elongated solar cell; and
the second corresponding metal counter-electrode lies in a second groove that runs lengthwise on the respective elongated solar cell; and
(C) a plurality of internal reflectors, wherein each respective internal reflector in the plurality of internal reflectors is configured between a corresponding first and second elongated solar cell in said plurality of elongated solar cells such that a portion of the solar light reflected from the respective internal reflector is reflected onto the corresponding first and second elongated solar cell.

72. A solar cell assembly comprising:
(A) a plurality of elongated solar cells, each elongated solar cell in said plurality of elongated solar cells comprising:
an elongated conductive core configured as a first electrode;
a semiconductor junction circumferentially disposed on said elongated conductive core;
an intrinsic layer circumferentially disposed on said semiconductor junction; and
a transparent conductive oxide layer disposed on said intrinsic layer;
wherein elongated solar cells in said plurality of elongated solar cells are arranged in a parallel or a near parallel manner thereby forming a planar array having a first face and a second face;
(B) a plurality of metal counter-electrodes, wherein each respective elongated solar cell in said plurality of elongated solar cells is bound to a first corresponding metal counter-electrode and a second corresponding metal counter-electrode in said plurality of metal counter-electrodes such that
the first corresponding metal counter-electrode lies in a first groove that runs lengthwise on the respective elongated solar cell; and
the second corresponding metal counter-electrode lies in a second groove that runs lengthwise on the respective elongated solar cell;
(C) a plurality of internal reflectors, wherein each respective internal reflector in the plurality of internal reflectors is configured between a corresponding first and second elongated solar cell in said plurality of elongated solar cells such that a portion of the solar light reflected from the respective internal reflector is reflected onto the corresponding first and second elongated solar cell;
(D) a transparent electrically insulating substrate that covers all or a portion of said first face of said planar array; and
(E) a transparent insulating covering disposed on said second face of said planar array, thereby encasing said plurality of elongated solar cells between said transparent insulating covering and said transparent electrically insulating substrate.

73. A solar cell assembly comprising:
(A) a plurality of elongated solar cells, each elongated solar cell in said plurality of elongated solar cells comprising:
an elongated conductive core configured as a first electrode;
a semiconductor junction circumferentially disposed on said elongated conductive core; and
a transparent conductive oxide layer disposed on said semiconductor junction;
wherein elongated solar cells in said plurality of elongated solar cells are arranged in a parallel or a near parallel manner thereby forming a planar array having a first face and a second face;
(B) a plurality of metal counter-electrodes, wherein each respective elongated solar cell in said plurality of elongated solar cells is bound to a first corresponding metal counter-electrode and a second corresponding metal counter-electrode in said plurality of metal counter-electrodes such that
the first corresponding metal counter-electrode is bonded to the elongated solar cell by a first bead of deposited metal that runs lengthwise on the respective elongated solar cell; and the second corresponding metal counter-electrode is bonded to the elongated solar cell by a second bead of deposited metal that runs lengthwise on the respective elongated solar cell;

(C) a plurality of internal reflectors, wherein each respective internal reflector in the plurality of internal reflectors is configured between a corresponding first and second elongated solar cell in said plurality of elongated solar cells such that a portion of the solar light reflected from the respective internal reflector is reflected onto the corresponding first and second elongated solar cell;

(D) a transparent electrically insulating substrate that covers all or a portion of said first face of said planar array; and (E) a transparent insulating covering disposed on said second face of said planar array, thereby encasing said plurality of elongated solar cells between said transparent insulating covering and said transparent electrically insulating substrate.

74. The solar cell assembly of claim 73, wherein an internal reflector in the plurality of internal reflectors is in electrical communication with:

(i) a first counter-electrode of a first elongated solar cell in said plurality of elongated solar cells that corresponds to said internal reflector; and (ii) a second counter-electrode of a second elongated solar cell in said plurality of elongated solar cells that corresponds to said internal reflector.

75. The solar cell assembly of claim 74, wherein said internal reflector is sealed to said first counter-electrode and said second counter-electrode by an electrically conductive glue or ink.

76. The solar cell assembly of claim 74, wherein said internal reflector has a first portion and a second portion, wherein the first portion of the internal reflector is in electrical communication with the first counter-electrode;

the second portion of the internal reflector is in electrical communication with the second counter-electrode; and the first portion and the second portion of the internal reflector are electrically isolated from each other.

77. The solar cell assembly of claim 76, wherein the first portion and the second portion of the internal reflector are electrically isolated from each other by an electrically insulative portion.

78. The solar cell assembly of claim 76, wherein the internal reflector comprises an insulative core with a layer of reflective material deposited on said insulative core, and wherein the first portion of the internal reflector is a first portion of the layer of reflective material;

the second portion of the internal reflector is a second portion of the layer of reflective material; and the first portion and the second portion of the internal reflector are electrically isolated from each other by a first and second break in the layer of reflective material.

79. The solar cell assembly of claim 74, wherein an internal reflector in the plurality of internal reflectors has a first edge and a second edge, wherein said first edge and said second edge run lengthwise along said internal reflector; and wherein (i) the first edge of the internal reflector contacts a first metal counter-electrode of a first elongated solar cell in said plurality of elongated solar cells that corresponds to said internal reflector; and (i) the second edge of the internal reflector contacts a second metal counter-electrode of a second elongated solar cell in said plurality of elongated solar cells that corresponds to said internal reflector.

80. The solar cell assembly of claim 79, wherein said first edge is sealed to said first counter-electrode and said second edge is sealed to said second counter-electrode by an electrically conductive glue or ink.

* * * * *